US006577382B2

(12) United States Patent  
Kida et al.

(10) Patent No.: US 6,577,382 B2  
(45) Date of Patent: Jun. 10, 2003

(54) SUBSTRATE TRANSPORT APPARATUS AND METHOD

(75) Inventors: Yoshiki Kida, Kawasaki (JP); Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/060,322

(22) Filed: Feb. 1, 2002

(65) Prior Publication Data

US 2002/0089655 A1 Jul. 11, 2002

Related U.S. Application Data

(63) Continuation of application No. 09/580,596, filed on May 30, 2000, now abandoned, which is a continuation of application No. PCT/JP98/05453, filed on Dec. 3, 1998.

(30) Foreign Application Priority Data

| Dec. 3, 1997 | (JP) | 9-347360 |
| Jan. 30, 1998 | (JP) | 10-018919 |
| Jan. 30, 1998 | (JP) | 10-033594 |
| Nov. 27, 1998 | (JP) | 10-337069 |

(51) Int. Cl.⁷ .................. G03B 27/42; G03B 27/32; B65G 49/07
(52) U.S. Cl. ................ 355/77; 355/53; 414/935; 414/941
(58) Field of Search ............... 355/53, 72, 75, 355/77; 414/935, 937, 940, 941

(56) References Cited

U.S. PATENT DOCUMENTS

| 4,717,190 A | 1/1988 | Witherspoon | 294/99.2 |
| 4,775,877 A | 10/1988 | Kosugi et al. | |
| 4,923,054 A | 5/1990 | Ohtani et al. | 187/267 |
| 5,008,703 A | * 4/1991 | Kawakami et al. | 355/53 |
| 5,160,961 A | 11/1992 | Marumo et al. | 355/53 |
| 5,518,542 A | 5/1996 | Matsukawa et al. | 118/52 |
| 5,700,046 A | 12/1997 | Van Doren et al. | 294/119.1 |
| 5,810,935 A | 9/1998 | Lee et al. | 118/728 |
| 5,825,470 A | 10/1998 | Miyai et al. | 355/72 |
| 6,167,322 A | * 12/2000 | Holbrooks | 294/103.1 |
| 6,167,893 B1 | 1/2001 | Taatjes et al. | 134/147 |
| 6,190,103 B1 | 2/2001 | Erez et al. | 414/217 |
| 6,244,931 B1 | 6/2001 | Pinson et al. | 451/8 |
| 6,275,748 B1 | * 8/2001 | Bacchi et al. | 414/941 |

FOREIGN PATENT DOCUMENTS

| JP | A-62-16540 | 1/1987 |
| JP | A-63-124544 | 5/1988 |
| JP | U-63-133953 | 9/1988 |
| JP | A-1-315154 | 12/1989 |
| JP | U-3-49240 | 5/1991 |
| JP | A-5-291381 | 11/1993 |
| JP | Y2-6-17787 | 5/1994 |
| JP | A-7-288276 | 10/1995 |
| JP | A-9-36202 | 2/1997 |
| JP | A-9-246352 | 9/1997 |
| JP | A-9-283604 | 10/1997 |

* cited by examiner

Primary Examiner—Rodney Fuller  
(74) Attorney, Agent, or Firm—Oliff & Berridge, PLC

(57) ABSTRACT

An object of the invention is to provide a substrate transport apparatus which enables prompt transfer of a substrate, and a substrate processing apparatus incorporating this. A substrate transport apparatus of the invention comprises a transport arm (45, 46, 145, 146) for supporting a peripheral portion of a substrate (W) at at least two places on the peripheral portion, and transporting the substrate to a stage (7). The transport arm comprises: a first arm (45) having a first support portion (45e) for supporting a rear face of one side of the peripheral portions of the substrate in a transport direction (C-D) of the substrate, and a first facing portion (45f) provided on the first support portion and facing a side face of the one peripheral portion of the substrate; a second arm (46) having a second support portion (46e) for supporting a rear face of the other side of the peripheral portions of the substrate in the transport direction of the substrate, and a second facing portion (46f) provided on the second support portion, and facing a side face of the other peripheral portion of the substrate; and a drive mechanism (43, 43a, 45a, 46a) for driving each of the first arm and the second arm so as to approach and separate from each other.

4 Claims, 42 Drawing Sheets

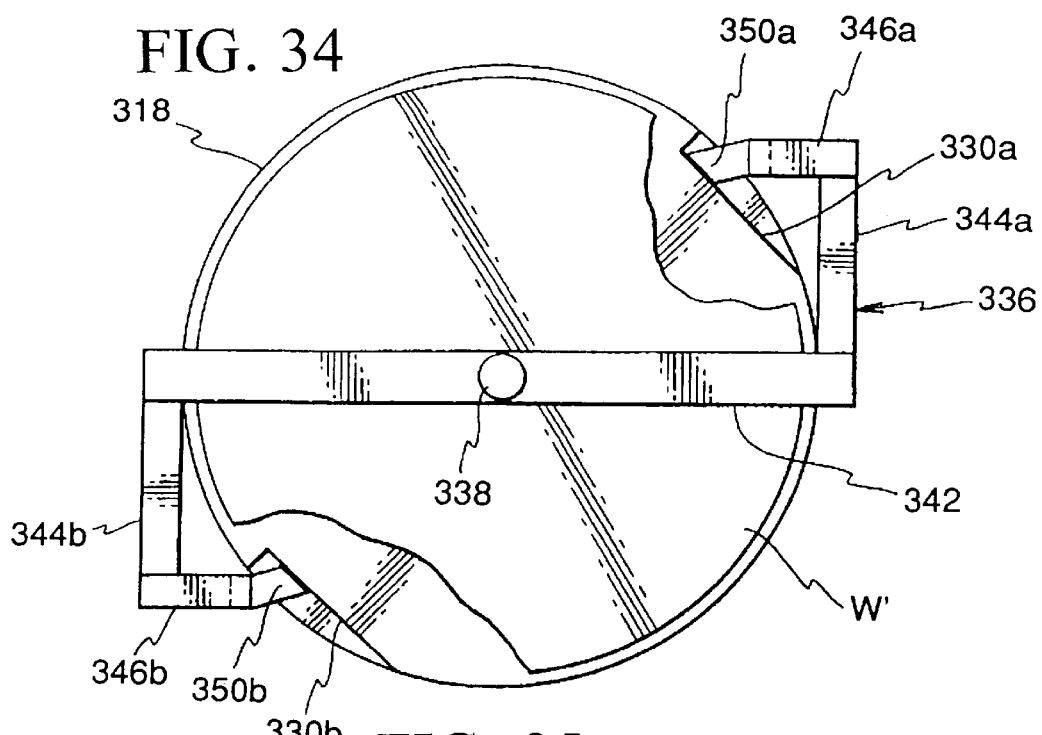
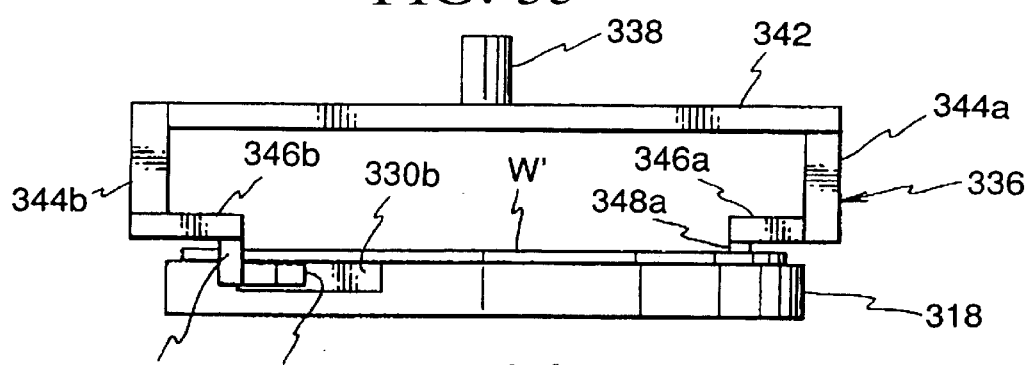
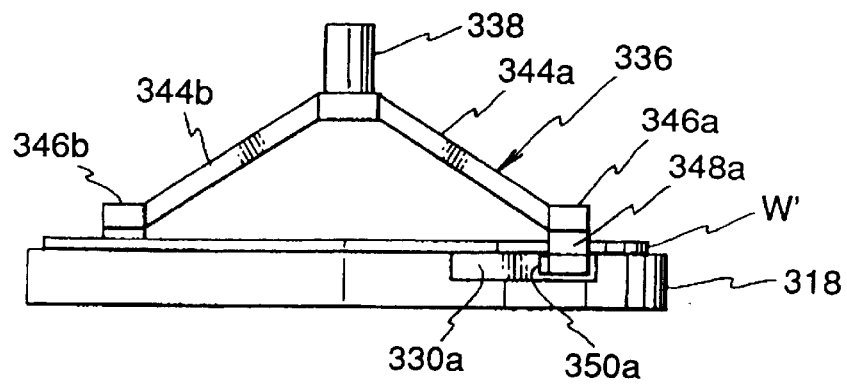

ARM MOVEMENT DIRECTION

--Prior Art--

--Prior Art--

--Prior Art--

SUBSTRATE TRANSPORT APPARATUS AND METHOD

This is a Continuation of application Ser. No. 09/580,596 filed May 30, 2000 now abandoned, which in turn is a continuation of Application No. PCT/JP98/05453 filed Dec. 3, 1998. The entire disclosure of the prior application(s) is hereby incorporated by reference herein in its entirety.

TECHNICAL FIELD

The present invention relates to a substrate transport method, a substrate transport apparatus, an exposure apparatus, and a device manufacturing method. More particularly, the present invention relates to a substrate transport method and substrate transport apparatus suitable for loading a wafer serving as a substrate onto a wafer stage of an exposure apparatus, or unloading a wafer from a wafer stage, and to an exposure apparatus using this, and to a device manufacturing method using the exposure apparatus. This application is a continuation application based on PCT/JP98/05453.

BACKGROUND ART

FIG. 62 and FIG. 63 are diagrams for explaining the construction of a conventional substrate transport apparatus. FIG. 62 is a plan view, and FIG. 63 is an elevation view of an arm section. The substrate transport apparatus comprises a load arm 412 and an unload arm 413, and they are able to move back and forth along a longitudinal direction of an arm guide 414 while being guided thereby so as not to interfere with each other. Furthermore, each arm 412 and 413 respectively incorporates a pair of substrate support portions 412a and 413a. On the tip ends of these are formed wafer attraction portions 412b and 413b.

An unprocessed wafer W which has been transported to the position shown in the figure by the load arm 412, is transferred to pins of an XY stage side (not shown in the figure), on release of attraction by the wafer attraction portions 412b. The load arm 412 which has completed transfer is then retracted and moved to bring in another wafer W. The wafer W which has been transferred to the pins is attracted and held on a mounting table of the XY stage with the lowering of the pins, and is moved to another location together with the XY stage, to be subjected to predetermined processing such as exposure.

The unload arm 413 is moved to the standby position shown in the figure, either during processing of the wafer W or immediately after processing. When the wafer W for which processing has been completed comes to the position shown in the figure together with the XY stage, the pins and the wafer W are raised. Then, at the stage where the wafer W has been raised to a higher position than the substrate support portion 413a, the unload arm 413 is moved to the transfer position shown by the load arm 412 in the figure, and the wafer W is received.

However, in the substrate transport apparatus as described above, the standby position of the unload arm 413 must be such that the arm is separated more than a distance "d" from the wafer W so that the wafer attraction portions 413b and the wafer W do not interfere. Moreover, for example when the wafer W is received by the unload arm 413, it is necessary to move the unload arm 413 from a standby position A as far as a transfer position B. Therefore there is a problem of a drop in throughput of wafer W transport or processing, attributable to the time requirement for movement during this interval.

[Second Background Art]

Furthermore, at the time of manufacturing semiconductor devices or the like, for the exposure apparatus for transferring a pattern of a reticle serving as a mask onto each shot region of a wafer (or glass plate etc.) to which photoresist has been applied, conventionally a projection exposure apparatus of the step-and-scan type (block exposure type, or stepper type) is widely used. On the other hand, recently, in order to respond to the demand for precise transfer of large area circuit patterns, without making the burden on the projection optical system too heavy, attention is also being given to projection exposure apparatus of the scanning exposure type such as the so called step-and-scan type. According to such apparatus, step movement is carried out between shots, and at the time of performing exposure to each shot region, the reticle and the wafer are moved simultaneously with respect to the projection optical system.

With these projection exposure apparatus, in order to increase throughput, a wafer loading operation for unloading a wafer which has already been exposed on a wafer stage used for positioning and moving the wafer, and also loading an unexposed wafer onto the wafer stage, must be carried out at high speed.

A conventional wafer loader system comprises; wafer lift pins projectably provided in a wafer holder of the wafer stage, a wafer load arm for mounting the wafer on the wafer lift pins, and a wafer unload arm for removing the wafer from the wafer lift pins. Furthermore, as disclosed for example in Japanese Patent Application, First Publication, No. 9-36202, when the wafer is mounted on the wafer stage, rough alignment (prealignment) based on the external shape of the wafer is performed beforehand at the stage where the wafer is transferred from the wafer transport line to the wafer load arm.

Moreover, in order to perform wafer exchange, the wafer stage is moved to a loading position, and attraction of the exposed wafer on the wafer holder is switched off. After this, the wafer is raised together with the wafer lift pins, and then the wafer unload arm is inserted between the wafer and the wafer holder, and the wafer lift pins lowered so that the wafer is transferred to the wafer unload arm.

After this, the wafer unload arm is taken out from the loading position to the wafer transport line side, and at the same time, a wafer load arm holding an unexposed wafer is inserted into the loading position, and the wafer lift pins are raised so that the wafer is transferred onto the wafer lift pins. Then, after the wafer load arm is withdrawn, the wafer lift pins are lowered so that the wafer is mounted on the wafer holder. After this, attraction by the wafer holder is switched on. The wafer stage is then sequentially moved to positions where search alignment marks on the wafer are within detection regions of an alignment sensor, and search alignment is performed.

Moreover, in the search alignment process, for example, by detecting the position of three one dimensional search alignment marks on the wafer, the positional displacement amount and the rotation angle deviation amount of the origin of the shot array on the wafer is detected, and based on these results, the actual rough array coordinates for each shot region on the wafer are obtained. After this, the final alignment (fine alignment) is executed for example by an EGA (Enhanced Global Alignment) method. This involves detecting based on the rough array coordinates, the position of fine alignment marks (wafer marks) attached to a predetermined number of shot regions (sample shots) determined beforehand on the wafer by an alignment sensor. Then based on this result, the pattern images of the reticle in each shot region of the wafer are precisely overlapped and exposed, after which the abovementioned wafer exchange is again performed.

In the conventional technology as described above, the wafer lift pins are protrudably mounted in the wafer holder on the wafer stage, and by raising these wafer lift pins, transfer of the wafer is performed between the wafer holder and the wafer load arm or the wafer unload arm.

However, in the construction where the wafer lift pins are provided inside the wafer holder, the mechanism for the wafer stage for supporting the wafer holder becomes complicated, and there is the disadvantage of the increase in size. In particular, in order to increase throughput, it is necessary to increase stepping speed in a one-shot exposure type, or stepping traversing speed and scanning speed in a scanning exposure type. However, in the case of enlargement of the drive motor, there is the possibility of an increase in vibration and generated heat. Therefore, in situations where the wafer stage cannot be made small, it is difficult to raise the traversing speed while suppressing heat output and the like.

Furthermore, the conventional processing time for one wafer is determined from the sum of; the wafer exchange time, the search alignment time, the fine alignment time, and the time for actually transferring the pattern image of the reticle to each shot region (strict exposure time). Therefore, even if the wafer exchange time or the wafer alignment time are shortened, the throughput for the exposure step can be increased. Therefore, it is desirable to shorten as much as possible the wafer exchange time or the wafer alignment time.

Furthermore, heretofore after performing prealignment of the wafer at a position away from the projection exposure apparatus, the wafer is transferred onto the wafer stage by the wafer load arm. Therefore, due for example to the positioning accuracy of the wafer load arm, there is the possibility of a drop in the prealignment accuracy. Therefore, heretofore after attracting and holding the wafer on the wafer holder, and before executing fine alignment, it is necessary to execute a search alignment to roughly measure the shot array on the wafer. Thus the time required for alignment is increased. In order to eliminate such search alignment, it is necessary to increase the positioning accuracy of the wafer at the stage where the wafer is mounted on the wafer holder.

Furthermore, in the case where for example during the time until the wafer is mounted on the wafer holder, the position of the external shape of the wafer is detected, when the reflected light from the wafer is received by an epiflourescent illumination method, then due for example to the condition of the material of the coating on the wafer surface, or the inclination (differences in level) of the surface, the condition of the reflected light can change relatively largely. Therefore, there is the possibility of a drop in position detection accuracy.

[Third Background Art]

FIG. 64 shows an example of a wafer transport system for this type of apparatus. Using FIG. 64 to briefly describe the processing flow of the wafer transport, a wafer W which has been fed from another semiconductor manufacturing apparatus on the line such as a coater-developer (an apparatus for applying photoresist to the wafer, and then developing the wafer after exposure), is transferred to a robot arm 464, and is attracted by an attraction portion 468 on the robot arm 464 and held. After this, the robot arm 464 is driven along a guide 467 in the direction of arrow A by an arm drive unit 466, and the wafer W is carried by the robot arm 464 to infront of a prealignment apparatus 470. At this position, the robot arm 464 is extended so that the wafer W is transferred onto a rotation shaft 472 on the prealignment apparatus 470.

A control unit 474 rotationally drives the rotation shaft 472 via a drive mechanism (not shown in the figure) constituting the prealignment apparatus 470. As a result, the wafer W starts to rotate. During this rotation of the wafer W, the control unit 474 monitors the output from a notch detector (not shown in the figure) and waits until a notch (V shape notch) provided on a peripheral portion of the wafer W is detected. When the notch is detected by the notch detection sensor, the control unit 474 stops the rotation of the rotation shaft 472 via the drive mechanism. Then, the control unit 474 simultaneously drives positioning pins 476, 478, 480 via a pin drive mechanism (not shown in the figure) towards the rotation shaft 472. As a result, rough positioning (prealignment) of the wafer W in the rotation direction and the XY two dimension direction is completed. After completion of this prealignment, the control unit 474 return the positioning pins 476, 478, 480 to their original positions.

Next the control unit 474 drives an arm drive mechanism 484 constituting a rotary transport arm drive apparatus 482, so that a wafer loader rotary transport arm 486 is turned to a position where a clasp portion on the tip end of the rotary transport arm 486 is engaged with the rotation shaft 472 on the prealignment apparatus 470, and stops there. After this, the vacuum is switched on for the attraction portion 488 provided on the rotary transport arm 486. As a result, the wafer W is attracted and held on the rotary transport arm 486. In this condition the rotary transport arm 486 stands by. During this standby, exposure of a wafer W mounted on an XY stage 490 is completed, and exchange of the wafer W is performed according to the following (1) through (10) procedures in approximately 5 to 10 seconds.

(1) The XY stage 490 is moved by a main control unit (not shown in the figure) via a drive system to the loading position.

(2) Next, the vacuum of a wafer holder 492 is switched off by the main control unit.

(3) Then, three lift pins (center-up) 494, 496, 498 provided on the XY stage 490 are raised by the main control unit so that the wafer W is lifted up by the center-up pins 494, 496, 498 and separated from the wafer holder 492.

(4) Next, the arm drive mechanism 484 is controlled by the control unit 474 in accordance with instructions from the main control unit, so that a wafer unload rotary transport arm 500 is inserted beneath the wafer which is being held by the center-up pins 494, 496, 498.

(5) Then, the center-up pins 494, 496, 498 are lowered by the main control unit so that the wafer W is transferred to the rotary transport arm 500. At this time, the vacuum for the wafer W by means of the attraction portion 502 of the rotary transport arm 500 is started by the control unit 474.

(6) Next the rotary transport arm 500 is turned by the control unit 474 so that the wafer W is withdrawn from the loading station, and at the same time the rotary transport arm 486 which is standing by while holding the wafer W is turned so that the wafer W is transported to above the wafer holder 492.

(7) Then, the center-up pins 494, 496, 498 are raised by the main control unit so that the wafer W is transferred from the rotary transport arm 486 to the center-up pins 494, 496, 498.

(8) Next, the rotary transport arm 486 is withdrawn from beneath the wafer W by the control unit 474.

(9) Then, the center-up pins 494, 496, 498 are lowered by the main control unit so that the wafer W is mounted on the wafer holder 492.

(10) After this, the vacuum of the wafer holder 492 is switched on by the main control unit.

With the recent progress of high integration of devices, a limit is starting to be seen in the use of light in exposure methods. For example, in the case where exposure is performed with a device rule (minimum line width) of less than 0.18 μm line and space (L/S), it has become necessary to use a projection optical system having a high N.A. (0.6~0.75) using a short exposure wavelength of for example, an excimer laser (KrF: wave length 248 nm, ArF: wavelength 193 nm) or an $F_2$ laser (wavelength 157 nm). The reticle size also has shifted from 6 inches to 9 inches. Under such circumstances, there has also been an increase in demand for exposure apparatus which can obtain a high throughput, and for example, in the case of a scanning type exposure apparatus of the scanning stepper type, in order to shorten the exposure time, it has become desirable to have a higher acceleration and speed for the reticle stage on which the reticle is mounted, and the wafer stage (XY stage) on which the wafer is mounted.

However, if the reticle stage and the wafer stage are further accelerated, the synchronization adjustment of the two stages becomes difficult, so that the adjustment time is increased. Therefore, instead this results in an increase in exposure time, or there is the possibility of an increase in synchronization control error for the two stages. In the scanning stepper, since the synchronization control for the reticle and the wafer is important, then in reality, it cannot be considered to realize a shortening of exposure time by only increasing the speed and acceleration for the stage.

Incidentally, the flow of wafer processing for these types of apparatus is normally as follows.

At first, a rough alignment step is performed where prealignment (rough alignment) is carried out based on the beforementioned wafer external shape detection. Then, in the condition with the wafer stage moved to the loading position, the beforementioned transfer of the wafer (wafer loading step) to the wafer stage by the robot transport arm (loading arm) is performed. After this, a search alignment step is performed involving searching for the alignment marks on the wafer on the wafer stage, and correcting any position error of the wafer stage in the X, Y, θ direction based on the results. After this, a fine alignment step is carried out involving precisely detecting the position of the alignment marks on the wafer to obtain the shot array on the wafer. After completion of this alignment, an exposure step is performed to transfer the pattern of the reticle onto the wafer. On completion of exposure, the wafer stage is again returned to the loading position and the beforementioned transport of the wafer using the unloading arm (unload arm) is performed (wafer unloading step: this wafer unloading step and the beforementioned wafer loading step constitute a wafer exchange step).

Consequently, the time required for processing one wafer is determined by; the wafer exchange time+the wafer rough search alignment time+the wafer fine alignment time+the exposure time. Therefore, also if the wafer exchange time apart from the exposure time is shortened, it is possible to realize a high throughput, as with increasing the stage speed.

However, with the above conventional example, it is necessary to go through procedures such as the above mentioned (1)~(10) procedures. Therefore there is the disadvantage that a long time is required for the exchange operation. Moreover, in this case after prealignment of the wafer, wafer transfer is carried out repeatedly. Consequently there is the disadvantage of a drop in prealignment accuracy. Moreover, since it is necessary to install an elevating drive mechanism such as the center-up pins on the wafer stage (XY stage), there is the disadvantage this additional weight, an increase in setting time for the stage, and a deterioration in controllability.

DISCLOSURE OF THE INVENTION

A first object of the present invention is to provide a substrate transport apparatus which enables prompt transfer of a substrate, and a substrate processing apparatus incorporating this. Here in the following description, in order to clarify the relationship between the various elements and the configurations disclosed in the figures, the reference numerals given in the figures are included for convenience. However, of course the various elements are not limited to the configurations disclosed in the figures.

In order to achieve the above objects, one configuration of the present invention is a substrate transport apparatus for transporting a substrate (W), and the apparatus comprises transport arms (45, 46, 145, 146) that support a peripheral portion of the substrate at at least two places on the peripheral portion and transports the substrate to a stage (7).

According to the substrate transport apparatus of the above aspect of the present invention, the transport arms support the peripheral portion of the substrate at at least two places on the peripheral portion, and transport the substrate to the stage. Therefore, before receiving the substrate, the transport arms can be moved to a transfer position where transfer of the substrate is possible, by horizontally moving the transport arms slightly from a standby position where relative vertical movement between the transport arms and the substrate is allowed. Furthermore, after transfer of the substrate, by horizontally moving the transport arms slightly from the substrate transfer position, the transport arms can be moved to the standby position for allowing relative vertical movement between the transport arms and the substrate. Consequently, the operation of substrate transfer becomes prompt.

Furthermore, in another preferred aspect, the transport arms comprise:

a first arm (45) having a first support portion (45e) for supporting a rear face of one side of the peripheral portions of the substrate in a transport direction (C-D) of the substrate, and a first facing portion (45f) provided on the first support portion so as to face a side face of the one side of the peripheral portion of the substrate;

a second arm (46) having a second support portion (46e) for supporting a rear face of the other side of the peripheral portions of the substrate in the transport direction of the substrate, and a second facing portion (46f) provided on the second support portion so as to face a side face of the other side of the peripheral portion of the substrate; and a drive mechanism (43, 43a, 45a, 46a) for driving each of the first arm and the second arm so as to approach and separate from each other.

According to this aspect, with a simple construction and operation, a substrate can be quickly transferred, and a substrate can be reliably held and transported.

Furthermore, in another preferred aspect, the transport arm (145, 146) comprises a support portion (145c, 146c) which can be inserted into a cutout (71a) provided in a peripheral portion at a substrate support position (71) of the stage (7) on which the substrate is mounted so as to support a rear face of the substrate (W).

According to this aspect, prompt substrate transfer is possible with only operation of the transport arm.

Moreover, a substrate processing apparatus of the present invention comprises a table (71) for supporting a substrate, arms (145, 146) for transporting the substrate to the table (71), cutouts (71a) provided in the table periphery, and a support portion (145c, 146c) provided on the arm for inserting into the cutouts (71a) and supporting a rear face of the substrate (W).

According to such a substrate processing apparatus, prompt substrate transfer is possible with only operation of the transport arm.

Moreover, in another preferred aspect of the present invention, the support portions (145c, 146c) support a rear face of the substrate at at least two places on the peripheral portion.

According to this aspect, since the support portion supports the rear face of the substrate at at least two places on the peripheral portion, support of the substrate is stable.

Furthermore, in another preferred aspect, the transport arm (145, 146) comprises:
- a first arm (145) having a first support portion (145c) serving as the support portion for supporting a rear face of one side of the peripheral portions of the substrate in a transport direction (C-D) of the substrate, and a first facing portion (145f) provided on the first support portion so as to face a side face of the one side of the peripheral portion of the substrate;
- a second arm (146) having a second support portion (146c) serving as the support portion for supporting a rear face of the other side of the peripheral portions of the substrate in a transport direction of the substrate, and a second facing portion (146f) provided on the second support portion so as to face a side face of the other side of the peripheral portion of the substrate; and
- a drive mechanism (143, 148, 149) for driving each of the first arm (145) and the second arm (146) so as to approach and separate from each other, and the first and second support portions (145c, 146c) respectively provided on the first and second arms, are able to be inserted in the cutouts (71a).

According to this aspect, with a simple construction and operation, a substrate can be reliably held and transported.

Moreover, in another preferred aspect, the substrate processing apparatus is an exposure apparatus for transferring a mask pattern to a photosensitive substrate.

Furthermore, a substrate transport apparatus of another aspect is a substrate transport apparatus for transferring a substrate to and from a substrate stage (7), and the apparatus comprises:
- a first arm (45) having a first support portion (45e) for supporting from beneath one of a pair of opposite portions of the peripheral portions of the substrate which are approximately opposite in a transport direction (CD) of the substrate, and a first upright portion (45f) standing upright on the first support portion;
- a second arm (46) having a second support portion (46e) for supporting from beneath the other of the pair of opposite portions, and a second upright portion (46f) standing upright on the second support portion for cooperating with the first upright portion to prevent movement of the substrate in a horizontal direction; and
- an arm drive apparatus (43, 43a, 45a, 46a) for moving the first and second arms at the time of the substrate transport while maintaining a spacing of the first and second arms, and changing the spacing of the first and second arms at the time of transfer of the substrate.

According to a substrate transport apparatus of this aspect, prior to receiving the substrate, by merely bringing together the first and second arm slightly from the standby position where the first and second arms are spaced apart, the first and second arms can be moved to the transfer position. Moreover, after the substrate has been transferred, the first and second arms can be moved to the standby position by merely separating the first and second arms slightly from the transfer position. As a result, a substrate can be promptly transferred and the substrate can be reliably held and transported with a simple construction and operation.

Furthermore, in another preferred aspect, the first and second support portions (45e, 46e) are members having the same shape as the peripheral portion of the substrate.

According to this aspect, since the first and second support portions are each members having the same shape as the peripheral portion of the substrate, support of the substrate is more stable.

Furthermore, in another preferred aspect, at least one of the first and second arms further comprises a substrate sensor (45d, 46d) for detecting if the substrate is being supported on the arm.

According to this aspect, since at least one of the first and second arms further comprises a substrate sensor for detecting if the substrate is being supported on the arm, holding of the substrate is ensured.

Furthermore, in another preferred aspect, there is further provided a position sensor (47) for detected the spacing and position of the first and second arms.

According to this aspect, since there is further provided a position sensor for detected the spacing and position of the first and second arms, holding of the substrate is ensured.

Another object of the present invention is to provide a method of transferring a substrate which enables miniaturization of a stage for a substrate such as a wafer, of an exposure apparatus, and which can improve positioning accuracy at the time of mounting a substrate on the stage.

Furthermore, another object of the present invention is to provide a method of transferring a substrate, which can shorten the time for exchanging substrates on a substrate stage of an exposure apparatus, and which can improve positioning accuracy at the time of mounting a substrate on the stage.

Moreover, it is also an object of the present invention to provide an exposure apparatus which can employ such a substrate transfer method.

The method for transferring a substrate according to the present invention is a method which performs transfer of a substrate to and from a substrate stage (222) of an exposure apparatus for transferring a pattern of a mask (R1) onto a substrate (W) which is positioned or being moved by the substrate stage (222). This method comprises the steps of: providing a load arm (225, 228) for holding the substrate (W) and raising and lowering the substrate; detecting a position of the substrate by an external shape reference or by a predetermined alignment mark serving as a reference in a condition where the substrate is held by the load arm; moving the substrate stage based on the detection result to a position for receiving the substrate; lowering the load arm and mounting the substrate on the substrate stage; and then moving the load arm away from the substrate.

According to this method of transferring a substrate, when the substrate stage is moved to the loading position, that is to say, to beneath the load arm, then by lowering the load arm, the substrate is transferred from the load arm to the substrate stage. After this, by moving for example the substrate stage in the direction of the original position, the load arm can be withdrawn. As a result, there is no longer a need to provide a member in the substrate stage side for raising the substrate, and therefore, the construction of the substrate stage can be simplified, and the size reduced.

Furthermore, after measuring the position of the substrate (for example positional displacement amount from a predetermined reference position, and rotation error with respect to a reference direction) in the condition with the substrate being held by the load arm, the position of the substrate at the time of lowering the load arm onto the substrate stage hardly changes. Therefore, the positioning accuracy at the time of mounting the substrate on the substrate stage can be improved. Consequently, the search alignment can be practically omitted. Moreover, the position measurement (prealignment) of the substrate held by the load arm can be executed concurrently with a final alignment (fine alignment) and exposure for another substrate on the substrate stage. Therefore, the overall processing time can be further shortened, thus improving throughput.

In this case, when detecting the position of the substrate (W) held by the load arm (225, 228), the method preferably comprises the steps of detecting the positions of at least three places which include a cutout portion (N1, N2) formed on the peripheral portion of the substrate, computing a rotation angle of the substrate based on the detected positions, and rotating the load arm based on the computed results so as to correct the rotation angle of the substrate. In this case, because the rotational position error of the substrate is corrected before the substrate is loaded on the substrate stage, it is possible to omit an operation for correcting the rotational position error of the substrate on the substrate stage, the total processing time can thereby be shortened.

In the method of transferring a substrate according to the present invention, it is not necessary to provide the member for raising the substrate on the substrate stage side. Therefore, the substrate stage can be miniaturized, and the traversing speed and positioning accuracy (controllability) of the substrate stage can be improved. Moreover, since after measuring the position of the substrate on the load arm, the substrate is transferred as is onto the substrate stage, there is the advantage that the positioning accuracy at the time of mounting the substrate on the substrate stage can be improved.

Furthermore, in the case where positional displacement amount ($\Delta WX$, $\Delta WY$) of the center of the substrate from a predetermined detection center is obtained, this positional displacement amount ($\Delta WX$, $\Delta WY$) can be used for example as an offset amount at the time of performing final fine alignment of the substrate. Additionally, the loading position of the substrate stage may be corrected corresponding to this positional displacement amount ($\Delta WX$, $\Delta WY$).

Another aspect of the present invention is a method of transferring a substrate which performs transfer of a substrate to and from a substrate stage (222) of an exposure apparatus for transferring a pattern of a mask (R1) onto a substrate (W) which is positioned or being moved by the substrate stage (222).

This method uses a load arm (225, 228) for holding the substrate and lowering the substrate, and an unload arm (238) for holding the substrate and raising the substrate, and comprises:

- a first step (S103, S104) for detecting a position of the substrate in a condition with the substrate being held by the load arm (225, 228);
- a second step (S111, S113~S116) for moving the substrate stage (222) based on the detection results to a position for receiving the substrate, lowering the load arm and mounting the substrate on the substrate stage, and then moving the load arm away from the substrate stage;
- a third step (S117, FIG. 27) for detecting the position of predetermined alignment marks (WM1~WM3) on the substrate, and, based on the detection results, obtaining a positional relationship between a plurality of regions to be exposed on the substrate and a pattern of the mask;
- a fourth step (S117, FIG. 29) for successively transferring the pattern of the mask to the plurality of regions to be exposed on the substrate while performing alignment based on the obtained positional relationship; and
- a fifth step (S111, S112) for moving the substrate stage to a position for unloading the substrate, raising the substrate with the unload arm and unloading from the exposure apparatus.

According to this aspect for the present invention, loading of the substrate is performed by a combination of an operation of moving the substrate stage to a position for performing loading of the substrate, and an operation for lowering the load arm (225, 228). Moreover, unloading of the substrate is performed by a combination of an operation for moving the substrate stage to a position for performing unloading of the substrate (preferably this is the same as the position for loading the substrate), and an operation for raising the unload arm (238). Therefore, exchange of the substrate can be performed at high speed. Furthermore, since the position of the substrate held on the load arm is detected in the first step, the accuracy of positioning the substrate on the substrate stage is improved. Moreover, since the positioning accuracy with respect to the substrate stage is improved, then, in the third step, substantially direct alignment rather than search alignment can be performed so that throughput is improved.

According to the above mentioned method of transferring a substrate, transfer of the substrate can be performed by a combination of an operation for moving the substrate stage in the horizontal direction, and vertically moving the load arm and the unload arm. Therefore, the time for exchanging substrates on the substrate stage can be shortened. Furthermore, since after measuring the position of the substrate on the load arm, the substrate is transferred to the substrate stage, the positioning accuracy at the time of mounting the substrate on the substrate stage can be improved. Therefore in the third step, search alignment can be practically omitted, and the throughput of the exposure process can be improved.

Another aspect of the present invention is an exposure apparatus comprising a substrate stage (222) for performing positioning or moving of a substrate (W1), an exposure section (210, 213, 217) for transferring a pattern of a mask (R1) to a substrate on the substrate stage, a load arm (225, 228) for holding the substrate and raising and lowering the substrate, an image processing system (226, 245) for detecting a position of the substrate held on the load arm, and a control system (215, 205) for controlling operation of the substrate stage and the load arm based on detection results from the image processing system. The control system moves the substrate to a position for receiving the substrate based on the position of the substrate detected by the image processing system, and lowers the load arm so as to mount the substrate on the substrate stage. This exposure apparatus employs the first method of transferring a substrate of the present invention.

In this case, preferably the image processing system comprises a moveable illumination apparatus (245) which can be brought into and taken out from beneath the load arm (225, 228) for illuminating the substrate from the bottom face side, and an imaging apparatus (226) for imaging an image of an external shape of the substrate illuminated by the moveable illumination apparatus. By imaging the image of the substrate in this way with a transmission light, the position of the substrate can be measured to a high accuracy without influence of for example non uniformity in the reflectivity of the surface of the edge portion of the substrate. Furthermore, at the time of lowering the load arm onto the substrate stage, the moveable illumination apparatus (245) can be withdrawn so that the moveable illumination apparatus (245) does not interfere.

In the case where the substrate is a large size (for example a wafer of 12 inches diameter (approximately 300 mm)), the moveable illumination apparatus (245) may be moved to follow detection points (226L, 226N1, 226R and 226U, 226N2, 226R) on the substrate at the time of position detection of the substrate. In this way, the moveable projection apparatus can be made small and hence withdrawal is facilitated. Moreover, the zero degree notch and the 90° degree notch of for example a 12 inch diameter wafer can be successively detected by rotating the same moveable illumination apparatus. Furthermore, the moveable illumination apparatus may comprise a surface light source (fluorescent lamp, fluorescent plate etc.) having a wide illumination field so that both wafer notch detection and detection of a separate wafer orientation flat portion can be performed.

Furthermore, the load arm (225, 228) may incorporate a holding member (228) for holding the substrate by holding from above, and grooves (237A, 237B) for accommodating tip end portions (250A, 250B) of the holding member (228) may be formed in the substrate mounting surface (221) of the substrate stage (222). In this case, when the load arm is lowered onto the substrate stage, the tip end portions (250A, 250B) of the holding members are accommodated in the grooves (237A, 237B) on the substrate stage. Therefore, the substrate can be easily transferred to the substrate stage. After this, by moving the substrate stage in a parallel direction to the grooves (237A, 237B), the load arm can be withdrawn from the substrate stage.

The width of the grooves (237A, 237B) may be made wide so that, after mounting the substrate on the substrate stage, the load arm can be spread and raised so as to be withdrawn from the substrate stage.

There may be further provided an unload arm which can be raised and lowered for unloading the substrate on the substrate stage (222), and the load arm may also incorporate a holding member (238) for holding the substrate by holding from above, and tip end portions (249A, 249B) of the holding member may also be freely accommodated in the grooves (237A, 237B) on the substrate stage. In this case, at the time of unloading the substrate, the substrate can be easily unloaded by moving the substrate stage so that the tip end portions of the unload arm are accommodated in the grooves, and then raising the unload arm.

Furthermore, preferably the load arm (225, 228) comprises a function for rotating and raising the substrate, and a transport arm (243) for transporting the substrate to be exposed from the substrate transport line to the load arm (225, 228) is separately provided. In this case, preferably the unload arm (238) is given a function enabling movement to the substrate transport line after receiving the substrate, and a base member (242) supporting the transport arm (243) and the unload arm (238), and a base member (248) supporting the load arm (225, 228) and the image processing system (226, 245) are made independent of each other. In the case where a projection optical system (217) is provided, it is preferable that the projection optical system (217) is also secured to the latter base member (248). In this case, the influence of vibration when transporting the substrate between the transport line and the substrate line is not exerted at the time of performing position detection of the substrate on the load arm, and at the time of passing the substrate onto the substrate stage. Therefore the accuracy of positioning the substrate with respect to the substrate stage is improved.

That is to say, with the first exposure apparatus of the present invention, the first substrate transfer method can be used. Moreover, when the unload arm is provided, the second substrate transfer method can be used.

Another object of the present invention is to provide a substrate transport method and substrate transport apparatus which can unload a substrate from a substrate holding member in a shorter time.

Furthermore, another object of the present invention is to provide a substrate transport method and substrate transport apparatus which can load a substrate onto a substrate holding member in a shorter time and at high accuracy.

Moreover, another object of the present invention is to provide a substrate transport method and substrate transport apparatus which can shorten the time for exchanging a substrate on the substrate holding member.

Furthermore, another object of the present invention is to provide an exposure apparatus which can enable an improvement in throughput by shortening the substrate exchange time.

Moreover, another object of the present invention is to provide a device manufacturing method which can enable an improvement in device productivity.

Another aspect of the present invention is a substrate transport method for unloading a substrate (W) from a substrate holding member (318) which is moveable in a two dimensional plane. This method comprises: a first step for standing by an unload arm (352) at a substrate transfer position; a second step for moving the substrate holding member holding the substrate to the substrate transfer position, and passing the substrate from the substrate holding member to the unload arm; and a third step for relatively moving the unload arm and the substrate holding member to withdraw the unload arm holding the substrate from the substrate holding member.

In this method, at first, the unload arm is stood by at the substrate transfer position. Then, the substrate holding member which is holding a substrate is moved to the substrate transfer position, and the substrate is passed from the substrate holding member to the unload arm. After this, the unload arm and the substrate holding member are moved relatively so that the unload arm which is holding the substrate is withdrawn from the substrate holding member. Therefore, concurrent with standing by the unload arm at the substrate transfer position, various processing can be performed on the substrate which is held on the substrate holding member. Furthermore, the transfer of the substrate from the substrate holding member to the unload arm is performed, not with the unload arm, but by moving the substrate holding member which moves at a higher speed, to the substrate transfer position. Moreover the withdrawal of the unload arm which is holding the substrate after completion of the transfer, from the substrate holding member is performed by relative movement between the unload arm and the substrate holding member. Therefore, compared to conventional unloading of the substrate by a common operation involving the unloading arm and the center-up, high speed unloading (unloading) of the substrate from the substrate holding member becomes possible, enabling an improvement in throughput.

In this case, when in the second step the substrate (W) is passed from the substrate holding member (318) to the unload arm (352), at least one of the substrate holding member and the unload arm may be moved in a direction orthogonal to the two dimensional plane. In this case, due to the relative movement between the substrate holding member and the unload arm in the direction orthogonal to the two dimensional plane, the substrate holding member and the unload arm which is holding the substrate can be separated. Therefore, the relative movement in the third step between the unload arm and the substrate holding member can be started earlier.

Another aspect of the present invention is a substrate transport method for loading a substrate (W') onto a substrate holding member (318) which is moveable in a two dimensional plane. This method comprises: a first step for standing by at a substrate transfer position a load arm (336) which is holding a substrate (W'); a second step for moving the substrate holding member to the substrate transfer position, and passing the substrate from the load arm to the substrate holding member and; and a third step for relatively moving the substrate holding member and the load arm to separate the substrate from the load arm.

In this method, at first, the load arm holding a substrate is stood by at the substrate transfer position. Then, the substrate holding member is moved to the substrate transfer position, and the substrate is passed from the load arm to the substrate holding member. After this, the substrate holding member and the load arm are moved relatively to separate the substrate from the load arm. That is to say, since the substrate is passed from the load arm to the substrate holding member, then rather than the load arm, the substrate holding member which moves faster, is moved to the substrate transfer position. Moreover, the separation after completion of the transfer, of the substrate (that is, the substrate holding member which is holding the substrate) from the load arm, is also performed by relative movement between the substrate holding member and the load arm. Therefore, compared to conventional loading of the substrate by a common operation involving the loading arm and the center-up, high speed loading of the substrate onto the substrate holding member becomes possible, enabling an improvement in throughput.

In this case, when in the second step the substrate (W') is passed from the load arm (336) to the substrate holding member (318), at least one of the substrate holding member and the load arm may be moved in a direction orthogonal to the two dimensional plane. In this case, due to the relative movement between the substrate holding member and the load arm in the direction orthogonal to the two dimensional plane, then simultaneously with the passing of the substrate from the load arm to the substrate holding member, the substrate can be separated from the load arm. Therefore, substrate loading can be completed even more quickly. That is to say, the substrate can be separated from the load arm before commencing the relative movement of the third step.

Another aspect of the present invention is a substrate transport method for unloading a substrate (W) from a substrate holding member (318) which is moveable in a two dimensional plane, and loading another substrate (W') onto the substrate holding member. This method comprises: a first step standing by at a substrate transfer position an unload arm (352) and a load arm (336) which is holding another substrate (W'); a second step for moving the substrate holding member which is holding the substrate to the substrate transfer position, and passing the substrate from the substrate holding member to the unload arm; a third step for withdrawing the unload arm which is holding the substrate from the substrate holding member; and a fourth step for after withdrawing the unload arm, passing the other substrate from the load arm to the substrate holding member.

In this method, at first, the unload arm and the load arm holding another substrate (for convenience referred to as "second substrate") are stood by at the substrate transfer position, and the substrate holding member which is holding a substrate (for convenience referred to as "first substrate") is moved to the substrate transfer position, and the first substrate is passed from the substrate holding member to the unload arm. Then, the unload arm which is holding the first substrate is withdrawn from the substrate holding member, and after withdrawal of the unload arm, the second substrate is passed from the load arm to the substrate holding member. Therefore, concurrent with the standing by at the substrate transfer position of the unload arm and the load arm which is holding the second substrate, various processing can be performed on the first substrate which is being held on the substrate holding member. Moreover, the transfer of the substrate from the substrate holding member to the unload arm is performed, not with the unload arm, but by moving the substrate holding member which moves at a higher speed, to the substrate transfer position. Then on completion of the transfer, the unload arm which is holding the first substrate is withdrawn from the substrate holding member, and after withdrawal of the unload arm, the second substrate is passed from the load arm to the substrate holding member. Therefore, compared to the conventional case where the exchange of the substrate on the substrate holding member is performed by a common operation of the unloading arm and the center-up, and a common operation of the loading arm and the center-up, high speed exchange of the substrate on the substrate holding member, that is, unloading and loading becomes possible, enabling a shortening of the substrate exchange time.

In this case, when in the second step the substrate (W) is passed from the substrate holding member (318) to the unload arm (352), at least one of the substrate holding member and the unload arm may be moved in a direction orthogonal to the two dimensional plane, and when in the fourth step, after the unload arm withdrawal, another substrate (W') is passed from the load arm (336) to the substrate holding member, at least one of the substrate holding member and the load arm may be moved in a direction orthogonal to the two dimensional plane. In this case, in the second step, due to the relative movement between the substrate holding member and the unload arm in the direction orthogonal to the two dimensional plane, the substrate holding member and the unload arm which is holding the first substrate can be separated. Furthermore, in the fourth step, due to the relative movement between the substrate holding member and the load arm in the direction orthogonal to the perpendicular plane, the second substrate can be passed from the load arm to the substrate holding member, and simultaneously the second substrate can be separated from the load arm.

Another aspect of the present invention is a substrate transport method for unloading a substrate from a stage (WST) which is moveable in a two dimensional plane. This method prepares beforehand a substrate holding member (318) provided on the stage, and formed with concavities or cutouts (330a, 330b) extending in a predetermined direction such that at least a part of an unload arm (352) is insertable therein in a condition with the substrate held on a substrate contact face side, and the method comprises: a first step for standing by the unload arm at a substrate transfer position;

a second step for moving the stage towards the substrate transfer position in order to insert at least a part (350a, 350b) of the unload arm into the concavities or cutouts of the substrate holding member which is holding the substrate; and a third step for after inserting at least a part of the unload arm into the concavities or cutouts, relatively moving the unload arm and the substrate holding member in a direction orthogonal to the two dimensional plane to separate the substrate from the substrate holding member.

According to this method, at first, the unload arm is stood by at the substrate transfer position. Then, the substrate stage is moved towards the substrate transfer position in order to insert at least a part of the unload arm into the concavities or cutouts of the substrate holding member which is holding the substrate. Subsequently, after inserting at least a part of the unload arm into the concavities or cutouts, the unload arm and the substrate holding member are moved relatively in a direction orthogonal to the two dimensional plane, to separate the substrate from the substrate holding member. Therefore, concurrent with standing by the unload arm at the substrate transfer position, various processing can be performed on the substrate which is held on the substrate holding member. Furthermore, the transfer of the substrate from the substrate holding member to the unload arm is performed, not with the unload arm, but by moving the stage (that is, substrate holding member) which moves at a higher speed, to the substrate transfer position. Then, after inserting at least a part of the unload arm into the concavities or cutouts of the substrate holding member which is holding the substrate, separating the substrate from the substrate holding member by relatively moving the unload arm and the substrate holding member in the direction orthogonal to the two dimensional plane. Consequently, compared to conventional unloading of the substrate by a common operation involving the unloading arm and the center-up, high speed unloading of the substrate from the substrate holding member becomes possible, enabling an improvement in throughput.

In this case, the operation in the second step of inserting at least a part of the unload arm into the concavities or cutouts of the substrate holding member which is holding a substrate, can of course be performed by moving the substrate stage towards the substrate transfer position with the loading arm stopped at the substrate transfer position. However, when in the second step at least a part (350a, 350b) of the unload arm (352) is inserted into the concavities or cutouts (330a, 330b), the unload arm may be simultaneously driven in the predetermined direction (the extension direction of the concavities or cutouts). In this case, the unload arm can be inserted into the concavities or cutouts in a shorter time, thus enabling even higher speed unloading of the substrate from the substrate holding member.

Another aspect of the present invention is a substrate transport method for loading a substrate (W') onto a stage (WST) which is moveable in a two dimensional plane. This method prepares beforehand a substrate holding member (318) provided on the stage, and formed with concavities or cutouts (330a, 330b) extending in a predetermined direction such that at least a part (350a, 350b) of a load arm (336) is insertable therein, and the method comprises: a first step for standing by the load arm which is holding a substrate at a substrate transfer position: a second step for moving the stage towards the substrate transfer position; a third step for inserting at least a part of the load arm into the concavities or cutouts of the substrate holding member from a direction orthogonal to the two dimensional plane; and a fourth step for after passing the substrate from the load arm to the substrate holding member, relatively moving the load arm and the stage to separate the substrate from the load arm.

In this method, at first the load arm holding the substrate is stood by at the substrate transfer position. Then, the stage (that is, the substrate holding member) is moved towards the substrate transfer position, and at least a part of the load arm is inserted into the concavities or cutouts of the substrate holding member from a direction orthogonal to the two dimensional plane. After this, the substrate is passed from the load arm to the substrate holding member, and the load arm and the stage are moved relatively so that the substrate is separated from the load arm. That is to say, in order to pass the substrate from the load arm to the substrate holding member, then, rather than the load arm, the stage which moves faster, is moved towards the substrate transfer position, and at least a part of the load arm is inserted into the concavities or cutouts of the substrate holding member from a direction orthogonal to the two dimensional plane, and the substrate is passed to the substrate holding member. After the substrate has been passed from the load arm to the substrate holding member, the load arm and the stage are moved relatively so that the substrate is separated from the load arm. Therefore, compared to the conventional loading of the substrate by a common operation involving the loading arm and the center-up, high speed loading of the substrate onto the substrate holding member becomes possible, enabling an improvement in throughput.

In this case, in the third step, it is of course possible to insert at least a part of the load arm into the concavities or cutouts of the holding member after completion of moving the stage to the substrate transfer position. However, in the third step, the insertion of at least a part (350a, 350b) of the load arm (336) into the concavities or cutouts (330a, 330b) of the substrate holding member (318) may be carried out during movement of the stage (WST). In this case, at least a part of the load arm can be inserted into the concavities or cutouts of the substrate holding member before completion of movement of the stage to the substrate transfer position. Therefore, the substrate can be more quickly passed from the load arm to the substrate holding member. However, in order to accurately pass the substrate to a predetermined position on the substrate holding member, it is necessary to have a aspect where the substrate holding member can move on the stage, or to move the load arm simultaneously in the opposite direction to the moving direction of the stage.

For this reason, when at least a part (350a, 350b) of the load arm (336) is inserted into the concavities or cutouts (330a, 330b) in the third step, it is desirable to move the load arm in a direction orthogonal to the two dimensional plane, and to simultaneously drive this in the predetermined direction.

Another aspect of the present invention is a substrate transport apparatus for unloading a substrate (W) from a stage (WST) which is moveable in a two dimensional plane. This apparatus comprises: an unload arm (352); an arm drive mechanism (356) for driving the unload arm; a substrate holding member (318) provided on the stage and formed with concavities or cutouts (330a, 330b) extending in a predetermined direction such that at least a part (350a, 350b) of the load arm is insertable therein, in a condition with the substrate held on a substrate contact face side; a stage drive unit (305) for driving the stage in the two dimensional plane; a relative drive mechanism (358) for relatively driving the unload arm and the substrate holding member in a direction orthogonal to the two dimensional plane; and a control unit (319, 320, 321). This control unit (319, 320, 321) has a first function for moving the unload arm via the arm drive mechanism to a substrate transfer position, a second function for moving the substrate stage via the stage drive mechanism towards the substrate transfer position in order to insert at least a part of the unload arm into the concavities or cutouts of the substrate holding member which is holding the substrate, and a third function for after inserting the unload arm into the concavities or cutouts, separating the substrate from the substrate holding member via the relative drive mechanism.

In this apparatus, at first by means of the control unit, the unload arm is moved to the substrate transfer position via the arm drive mechanism. Then, the stage is moved via the stage drive unit towards the substrate transfer position in order to insert at least a part of the unload arm into the concavities or cutouts of the substrate holding member which is holding a substrate. Then, after the unload arm has been inserted into the concavities or cutouts, the substrate is separated from the substrate holding member via the relative drive mechanism. Therefore, concurrent with standing by the unload arm at the substrate transfer position, various processing can be performed on the substrate which is held on the substrate holding member. Furthermore, the transfer of the substrate from the substrate holding member to the unload arm is performed, not with the unload arm, but by moving the stage (that is, substrate holding member) which moves at a higher speed, to the substrate transfer position. Then, after inserting at least a part of the unload arm into the concavities or cutouts of the substrate holding member which is holding the substrate, the substrate is separated from the substrate holding member by relatively moving the unload arm and the substrate holding member in the direction orthogonal to the two dimensional plane. Consequently, compared to conventional unloading of the substrate by a common operation involving the unloading arm and the center-up, high speed unloading of the substrate from the substrate holding member becomes possible, enabling an improvement in throughput.

In this case, the control unit (319, 320, 321) may further have a fourth function, for relatively moving the unload arm and the stage (WST) to withdraw the unload arm from the substrate holding member, after the substrate (W) has been transferred from the substrate holding member (318) to the unload arm (352). In this case, the withdrawal of the unload arm from the substrate holding member after the substrate has been transferred from the substrate holding member to the unload arm is possible by moving at least one of the unload arm and the stage. Therefore, as a result, the substrate can be quickly withdrawn from the unload arm, enabling the processing of the substrate after withdrawal to be started promptly.

In the above substrate transport apparatus, the control unit may move only the stage (WST) towards the substrate transfer position with the unload arm in the standby condition at the substrate transfer position, to thereby insert at least a part of the unload arm into the concavities or cutouts of the substrate holding member which is holding a substrate. However, the control unit (319, 320, 321) may control the arm drive mechanism (356) so that at the time of inserting at least a part (350a, 350b) of the unload arm (352) into the concavities or cutouts (330a, 330b), the unload arm is simultaneously moved in the predetermined direction. In this case, the unload arm can be more quickly inserted into the concavities or cutouts.

Moreover, in the substrate transport apparatus, the control unit (319, 320, 321) may, after inserting at least a part (350a, 350b) of the unload arm (352) into the concavities or cutouts (330a, 330b), control at least one of the arm drive mechanism (356) and the stage drive unit (315) so as to relatively move the unload arm and the stage (WST) in the predetermined direction. In this case, the insertion of the unload arm into the concavities or cutouts can be completed sooner, and the subsequent relative movement of the unload arm and the substrate holding member in the direction orthogonal to the two dimensional plane can be started that much earlier.

Another aspect of the present invention is a substrate transport apparatus for loading a substrate (W') onto a stage (WST) which is moveable in a two dimensional plane, and this apparatus comprises: a load arm (336) for holding a substrate at a substrate transfer position; a substrate holding member (318) provided on the stage and formed with concavities or cutouts (330a, 330b) extending in a predetermined direction such that at least a part (350a, 350b) of the load arm is insertable therein; a stage drive unit (315) for driving the stage in the two dimensional plane; a relative drive mechanism (338) for relatively driving the load arm and the substrate holding member in a direction orthogonal to the two dimensional plane; and a control unit (319, 320, 321). This control unit (319, 320, 321) has a first function for moving the stage via the stage drive mechanism towards the substrate transfer position, a second function for making the load arm approach the substrate holding member by means of the relative drive mechanism to thereby insert at least a part of the load arm into the concavities or cutouts of the substrate holding member from a direction orthogonal to the two dimensional plane, and a third function for after the substrate has been passed from the load arm to the substrate holding member, relatively moving the load arm and the stage to separate the substrate from the load arm.

In this apparatus, the load arm which is holding the substrate is stood by at the substrate transfer position. Then, the control unit, via the stage drive unit, moves the stage towards the substrate transfer position. After this, the control unit, via the relative drive mechanism, makes the load arm approach the substrate holding member to thereby insert at least a part of the load arm into the concavities or cutouts of the substrate holding member from a direction orthogonal to the two dimensional plane. As a result, the substrate is passed from the load arm to the substrate holding member. After this, the load arm and the stage are relatively moved by the control unit so that the substrate is separated from the load arm. That is to say, in order to pass the substrate from the load arm to the substrate holding member, rather than the load arm, the stage which moves faster, is moved towards the substrate transfer position, and at least a part of the load arm is inserted into the concavities or cutouts of the substrate holding member from a direction orthogonal to the two dimensional plane, and the substrate is passed to the substrate holding member. After the substrate has been passed from the load arm to the substrate holding member, the load arm and the stage are moved relatively so that the substrate is separated from the load arm. Therefore, compared to the conventional loading of the substrate by a common operation involving the loading arm and the center-up, high speed loading of the substrate onto the substrate holding member becomes possible, enabling an improvement in throughput.

In this case, of course, the control unit may insert at least a part of the load arm into the concavities or cutouts of the substrate holding member after completion of the movement of the stage to the substrate transfer position. However, the control unit (319, 320, 321) may insert at least a part of the load arm (336) into the concavities or cutouts (330a, 330b) of the substrate holding member (318) during movement of the stage (WST). In this case, the substrate can be passed from the load arm to the substrate holding member in a shorter time.

Moreover, in the case where the substrate transport apparatus is further provided with an arm drive mechanism for driving the load arm (336), then the control unit (319, 320, 321), when at least a part (350a, 350b) of the load arm (336) is inserted into the concavities or cutouts from a direction orthogonal to the two dimensional plane, may control the arm drive mechanism to drive the load arm in the predetermined direction in addition to driving in the direction orthogonal to the two dimensional plane. In this case, transfer of the substrate to a predetermined position on the substrate holding member can be completed before completion of moving the stage to the substrate transfer position.

Alternatively, a drive unit for driving the load arm (336) may be further provided in the substrate transport apparatus, and after inserting at least a part (350a, 350b) of the load arm (336) into the concavities or cutouts (330a, 330b), the control unit (319, 320, 321) may control at least one of the arm drive mechanism and the stage drive unit (315) to relatively move the load arm and the stage (WST) in the predetermined direction.

Another aspect of the present invention is a substrate transport apparatus for unloading a substrate (W) from a stage (WST) which is moveable in a two dimensional plane, and for loading another substrate (W') onto the stage. This apparatus comprises: an unload arm (352); a load arm (336) for holding the substrate at a substrate transfer position; an arm drive mechanism (356) for driving the unload arm; a substrate holding member (318) provided on the stage and formed with concavities or cutouts (330a, 330b) extending in a first direction such that at least a part (350a, 350b) of the unload arm is insertable therein in a condition with the substrate held on a substrate contact face side, and at least a part of the load arm is insertable therein; a relative drive mechanism (338, 358) for relatively driving at least one of the unload arm and the load arm, and the substrate holding member in a direction orthogonal to the two dimensional plane; a stage drive unit (315) for driving the stage in the two dimensional plane; and a control unit (319, 320, 321). This control unit (319, 320, 321) has a first function for moving the unload arm via the arm drive mechanism to the substrate transfer position, a second function for moving the substrate stage via the stage drive mechanism towards the substrate transfer position in order to insert at least a part of the unload arm into the concavities or cutouts of the substrate holding member which is holding the substrate, a third function for after inserting the unload arm into the concavities or cutouts, separating the substrate from the substrate holding member via the relative drive mechanism, a fourth function for withdrawing the unload arm via the arm drive mechanism from the substrate transfer position, a fifth function for after withdrawing the unload arm making the load arm approach the substrate holding member by means of the relative drive mechanism to thereby insert at least a part of the load arm into the concavities or cutouts of the substrate holding member from a direction orthogonal to the two dimensional plane, and a sixth function for, after the substrate has been passed from the load arm to the substrate holding member, relatively moving the load arm and the stage to separate the substrate from the load arm.

In this apparatus, the control unit moves the unload arm via the arm drive mechanism to the substrate transfer position, and moves the substrate stage via the stage drive mechanism towards the substrate transfer position in order to insert at least a part of the unload arm into the concavities or cutouts of the substrate holding member which is holding a substrate. Then, after insertion of the unload arm into the concavities or cutouts, the control unit separates the substrate from the substrate holding member via the relative drive mechanism. Next, the control unit withdraws the unload arm from the substrate transfer position via the arm drive mechanism. After this unload arm withdrawal, the control unit, via the relative drive mechanism, makes the load arm approach the substrate holding member to thereby insert at least a part of the load arm into the concavities or cutouts of the substrate holding member from a direction orthogonal to the two dimensional plane. Then, after passing the substrate from the load arm to the substrate holding member, relatively drives the load arm and the stage so that the substrate is separated from the load arm. Therefore, compared to the conventional case where the exchange of the substrate on the substrate holding member is performed by a common operation of the unloading arm and the center-up, and a common operation of the loading arm and the center up, high speed exchange of the substrate on the substrate holding member, that is unloading and loading becomes possible, enabling a shortening of the substrate transfer time, and an improvement in accuracy due to the small number of transfers after alignment.

In the above described substrate transport apparatus, the load arm (336) may be arranged at the substrate transfer position, and may be able to hold the substrate and rotate within a plane of the substrate. In this case, the apparatus may further comprise: a measuring device (340a, 340b, 340c) for measuring an external shape of a substrate (W') held in the load arm; a computing unit (321) for computing a positional displacement of the substrate within a plane parallel to the two dimensional plane based on measurement results of the measurement device; and a second control unit (320, 321) for controlling a rotation amount of the load arm to correct positional displacement of the substrate in a rotation direction computed by the computing unit.

In this case, before the stage is moved to the substrate transfer position, the external shape of the substrate held in the load arm can be measured by the measurement device, and based on the measurement result of the measurement device, the positional displacement of the substrate within a plane parallel to the two dimensional plane can be computed by the computing unit. The rotation amount of the load arm can then be controlled by the second control unit to correct the positional displacement of the substrate in the rotation direction computed by the computing unit. That is to say, prior to moving the stage to the substrate transfer position for unloading the substrate from the substrate holding member, rotation correction for the next substrate can be completed. Therefore, rotation correction of the substrate (prealignment) without any drop in throughput is possible.

In the abovementioned substrate transport apparatus, the unload arm (352) and load arm (336) may have prongs (350a, 350b) of a shape which is insertable into the concavities or cutouts (330a, 330b), and a space may be provided above the prongs such that the substrate can be moved in and out thereof in a second direction different from the first direction. In this case, the insertion and removal of the prongs of the unload arm and the load arm with respect to the concavities or cutouts of the substrate holding member may be performed by relatively moving the stage and the unload arm and the load arm in the first direction, and the loading or unloading of the substrate with respect to the substrate unload arm and load arm may be performed by moving the substrate in and out in the second direction.

In the abovementioned various aspects, the concavities or cutouts may include a first concavity formed in a position different from the substrate contact face and extending in a predetermined direction, and a second concavity communicated with the first concavity and formed in the substrate contact face, and based on the first concavity and the second concavity, a path with a L shape as seen from the side for guiding the unload arm may be formed. In such a case, a part of the substrate contact face protrudes at the part of the cutout extending in the predetermined direction on the opposite side thereof to the stage. Therefore, also in the case where a substrate with for example poor flatness is mounted on the substrate holding member, the substrate contacts the substrate holding face over substantially the whole face and is made flat. Therefore, the substrate is held on the substrate holding member with good flatness. Furthermore, when the unload arm is inserted into the cutouts of the substrate holding member with the substrate being held, the occurrence of any undesirable situation such as the insertion disturbing the substrate can be reliably avoided. Moreover, the contact area of the substrate contact face with respect to the substrate can be made even larger.

Another aspect of the present invention is an exposure apparatus for transferring a predetermined pattern onto a substrate on a stage (WST), and this exposure apparatus is provided with the above mentioned substrate transport apparatus as an apparatus for exchanging substrates on the stage.

In this way, by means of the substrate transport apparatus of the abovementioned various aspects, the speed of at least one of the loading of the substrate to the substrate holding member, and the unloading of the substrate from the substrate holding member can be increased, and therefore, an improvement in throughput is possible.

Another aspect of the present invention is an exposure apparatus for transferring a predetermined pattern onto a substrate on a stage (WST), and this exposure apparatus comprises the substrate transport apparatus as an apparatus for exchanging substrates on the stage, and a mark detection system (ALG) for detecting position detection marks on the substrate. The second control unit (320, 321) corrects positional displacement of the substrate in the two dimensional plane detected by the computing unit (321), using any of the corrections for; the positioning of the load arm (336), the positioning of the stage (WST), and the detection result for the position detection mark by the mark detection system (ALG).

In this exposure apparatus, since the substrate transport apparatus is provided as the apparatus for exchanging substrates on the stage, an improvement in throughput is possible due to the shortening of the time for exchanging substrates on the substrate holding member. Furthermore, in this case the mark detection system is further provided for detecting position detection marks on the substrate, and the second control unit corrects positional displacement of the substrate in the two dimensional plane detected by the computing unit, using any of the corrections for; the positioning of the load arm, the positioning of the stage, and the detection result for the position detection mark by the mark detection system. Therefore, prior to moving the stage to the substrate transfer position in order to unload the substrate from the substrate holding member, the rotation correction for the next substrate can be completed. Therefore, in addition to rotation correction of the substrate (prealignment) being possible without any drop in throughput, positional adjustment of both at the time of substrate transfer becomes unnecessary. Therefore, transfer time is shortened and the number of transfers reduced, thus enabling an improvement in substrate prealignment accuracy.

In this case, it is preferable to perform concurrently, the external shape measurement of the substrate by the measuring device, the computation of the positional displacement of the substrate by the computing unit, and the rotation correction of the substrate by the second control unit, at the same time as the operations on the substrate until completion of transfer of the mask pattern to the substrate.

Furthermore, the device manufacturing method of the present invention comprises an exposure step for performing exposure using the above described exposure apparatus.

BRIEF DESCRIPTION OF THE DRAWINGS

FIG. 34 through FIG. 36 are diagrams for explaining a construction of a load arm of FIG. 30.

FIG. 43 is a perspective view showing a condition where prongs of an unload arm have been inserted into cutouts of a wafer holder, while

FIG. 57 is a front elevation view, FIG. 58 is a plan view of FIG. 57, and FIG. 59 is a left side elevation view of FIG. 57.

BEST MODE FOR CARRYING OUT THE INVENTION

Hereunder is a description of specific embodiments of the present invention. However, the embodiments of the present invention are not limited to the following various embodiments, and for example structural components of these embodiments may of course also be appropriately combined.

Figure 1:
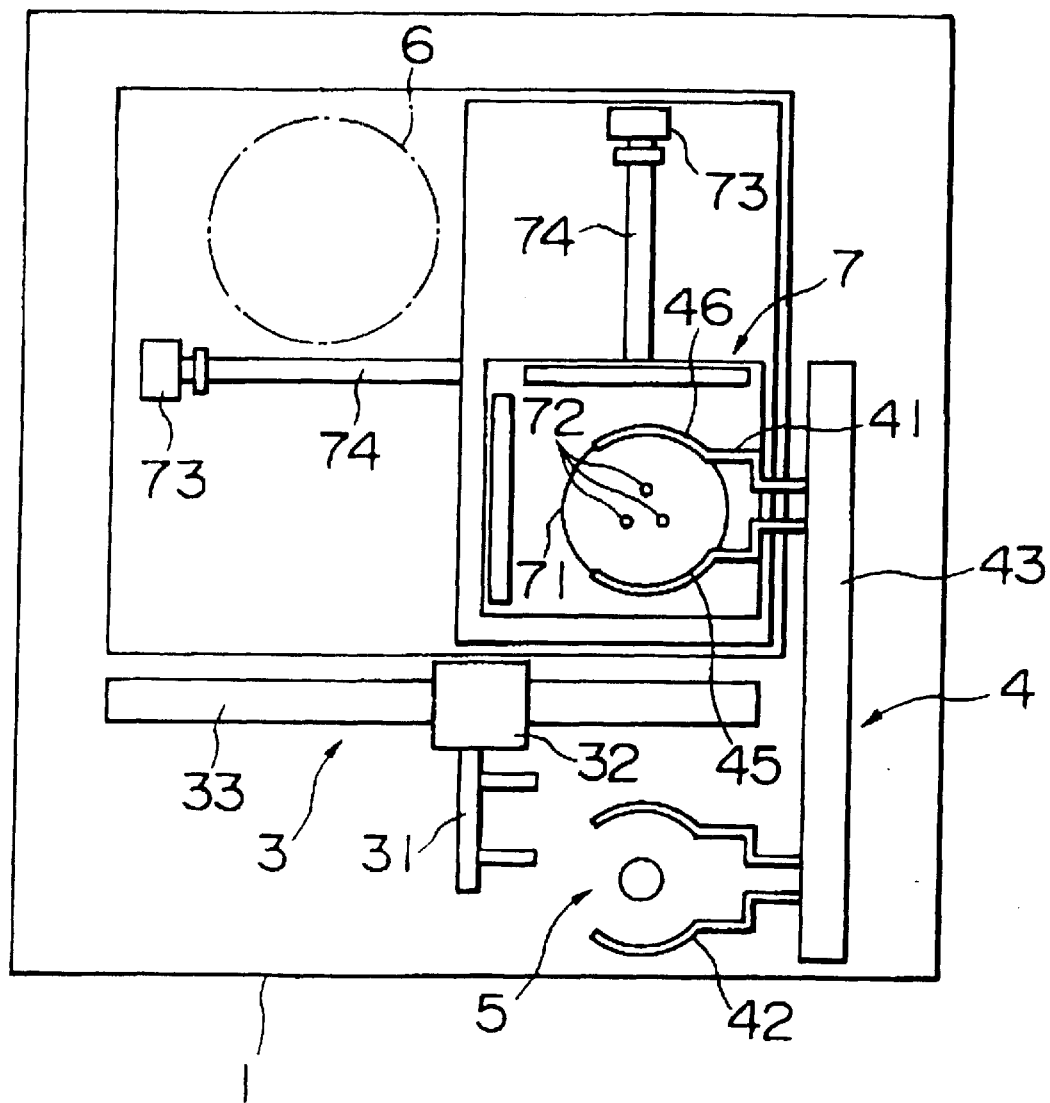
FIG. 1 is a plan view for explaining a construction of an exposure apparatus according to a first embodiment of the present invention.

FIG. 1 is a diagram showing a planar structure of an exposure apparatus, being a substrate processing apparatus which incorporates a substrate transport apparatus according to the present embodiment. As shown in the figure, the exposure apparatus comprises a first transport section 3 accommodated inside a chamber 1 for unloading a wafer W from a cassette (not shown in the figure), a second transport section 4 for performing transfer of the wafer W between the first transport section 3, an alignment section 5 for performing adjustment of the center and the rotation position of the wafer W which has been received from the second transport section 4, and an XY stage 7 for moving the wafer W received from the second transport section 4 to a position such as an exposure position directly beneath an exposure optical system 6.

The first transport section 3 comprises an arm 31 for transporting the wafer W while being attraction supported thereby, a raising drive section 32 for raising the arm 31 in a perpendicular/vertical direction, and a guide 33 for guiding the raising drive section 32 and moving the arm 31 horizontally.

The second transport section 4 comprises a pair of transport units 41, 42 at different vertical height locations, and a guide 43 for guiding the transport units 41, 42 and moving these horizontally. The two transport units 41, 42 each comprise a pair of arms. The wafer is retained with the pair of arms as one, and moves along the guide 43. When necessary, the spacing between the pair of arms is adjusted to perform transfer of the wafer W.

The alignment section 5, while not explained in detail, comprises a center sensor for computing the center position of the wafer W, and an orientation flat sensor for computing the rotation position of the wafer W.

The XY stage 7 comprises a mounting table 71 for attracting and retaining the wafer W. Support pins 72 are arranged at the center of the mounting table 71 for supporting the wafer rear face at three points and raising the wafer vertically. The XY stage 7 can be driven in two dimensions in a horizontal plane by driving a pair of drive units each comprising a motor 73 and a screw device 74.

Figure 2:
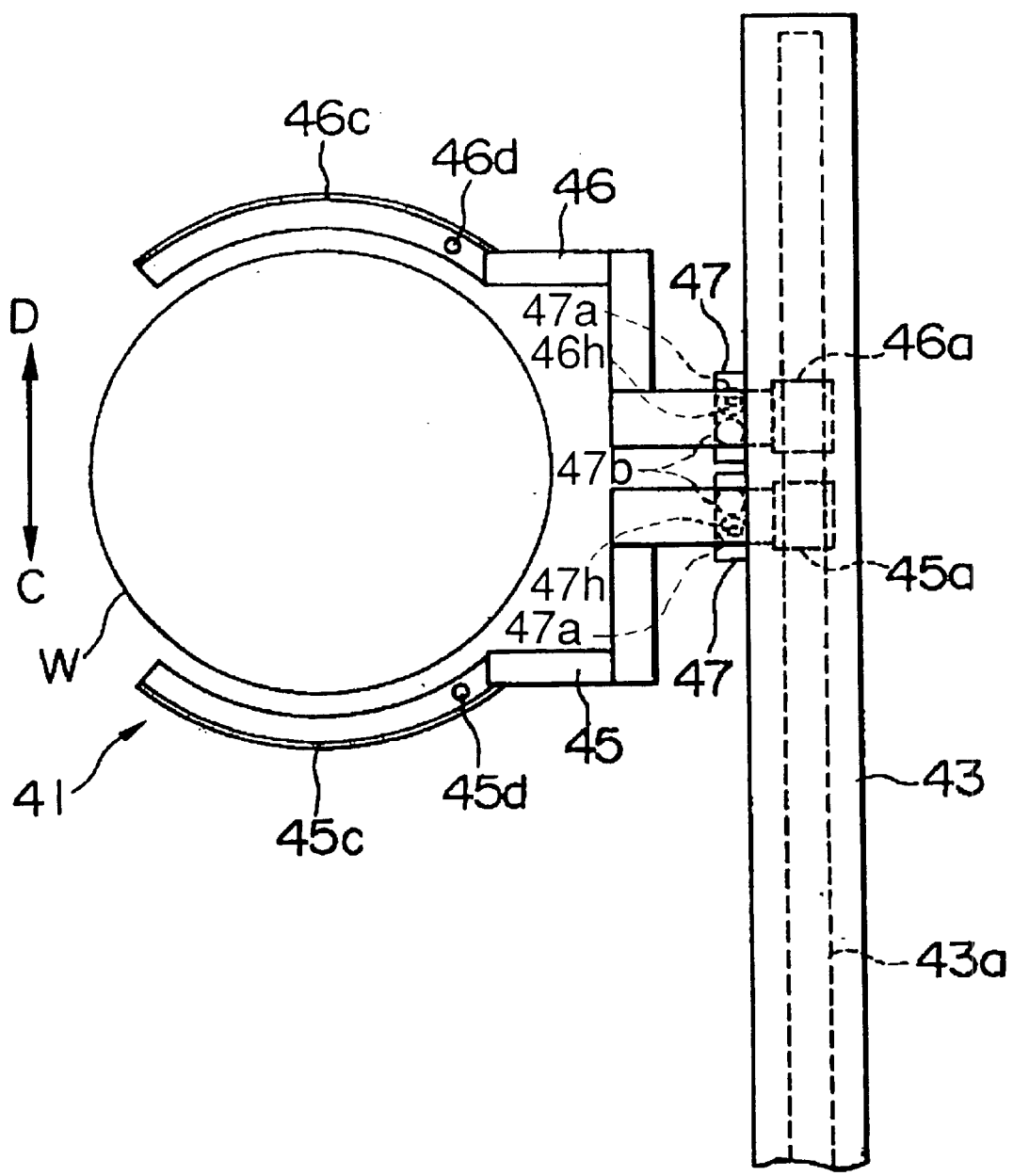
FIG. 2 is a plan view for explaining the construction of a second transport section shown in FIG. 1.

FIG. 2 illustrates the main parts of the second transport section 4. The transport unit 41 provided in the second transport section 4 comprises a pair of arm members 45, 46. Each of the arm members 45, 46 is movable independently in the horizontal direction by a linear motor provided in the guide 43. That is to say, coils 45a, 46a are wound around the bases of the respective arm members 45, 46, and by controlling the current supplied to each coil 45a, 46a, the two arm members 45, 46 can be moved along a magnet 43a provided inside the guide 43.

The tip end sides of the two arm members 45, 46 constitute substrate holding portions 45c, 46c having the same shape as the rim of the wafer W. When the wafer is being transported or transferred, the inside faces of the facing rim portions cooperate to hold the wafer W. Wafer sensors 45d, 46d comprising pressure sensitive sensors for detecting if the wafer W is present from the weight of the wafer W, are provided at the base side of the substrate holding portions 45c, 46c. The shape of the substrate holding portions 45c, 46c is not limited to being the same shape, and any shape is acceptable provided these can hold the rim of the wafer W.

As an apparatus for reliably judging if the two arm members 45, 46 have moved to a desired position, there is provided a pair of position sensors 47 on the side face of the guide 43. A pair of light projecting/receiving sections 47a, 47b are provided on the upper face side of each position sensor 47. The two position sensors 47 are arranged lower than the two arm members 45, 46, and mirrors 45h, 46h provided on the rear faces of the two arm members 45, 46 face the light projecting/receiving section 47a at a standby position, with the two arm members 45, 46 arranged as shown in the figure. At a transfer position where the two arm members 45, 46 are close together, these face the projecting/receiving section 47b. When the two arm members 45, 46 are moved horizontally, each position sensor 47 is positioned lower than the two arm members 45, 46, and hence mutual interference can be prevented. With the light projected from the light projecting/receiving sections 47a, 47b of the position sensors 47, when the mirrors 45h, 46h are above these, the light is reflected by the mirrors 45h, 46h and impinges on the light projecting/receiving sections 47a, 47b. If the detection output from the light projecting/receiving sections 47a, 47b is monitored, then it is possible to detect if the position of the two arm members 45, 46 is in either of the standby position shown in the figure, or the transfer position with these close to each other, and the two arm members 45, 46 can then be moved to the required position.

The transport unit 42, while detailed description is omitted, has the same construction as the transport unit 41. However, the height positions of the two units 41, 42 are made different to avoid mutual interference.

Figure 4:
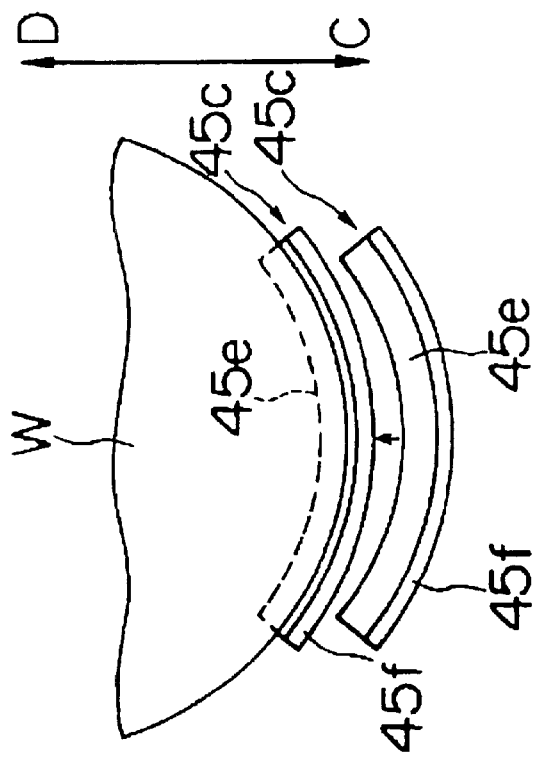
FIG. 3 and FIG. 4 are diagrams for explaining support of a wafer by a pair of arm members.
Figure 3:
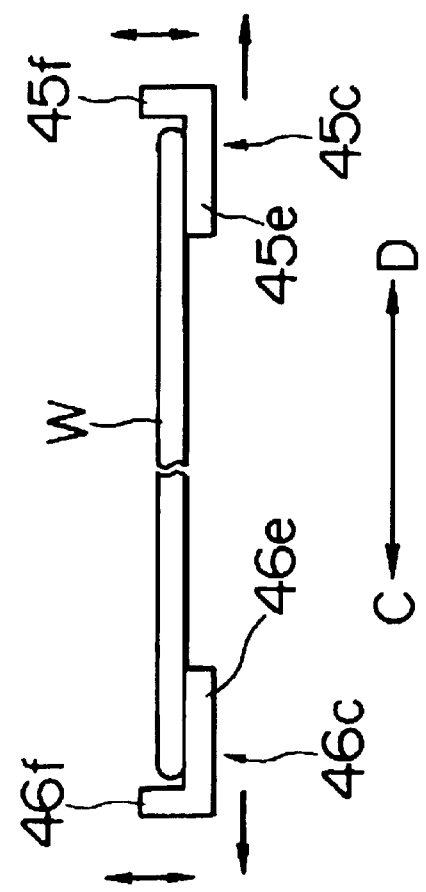

FIG. 3 and FIG. 4 are diagrams for explaining the holding of the wafer W by the arm members 45, 46. FIG. 3 is a view of the wafer W held in the substrate holding portions 45c, 46c as seen from the side, while FIG. 4 is a view of the wafer W held in the substrate holding portion 45c as seen from above. The substrate holding portions 45c, 46c have the same shape as the rim of the wafer W, and comprise a main body portion 45e, 56e for supporting the rear face of the wafer W periphery portion from beneath, and movement restricting portions 45f, 46f provided at the outer rim sides of the main body portion 45e, 56e for restricting movement of the wafer W in the horizontal direction. For example, when the wafer W is raised by the support pins 72 (refer to FIG. 1) the arm members 45, 46, that is the substrate holding portions 45c, 46c are moved appropriately so that the main body portions 45e, 46e move to directly beneath the rear face of the wafer W peripheral portion. After this, when the support pins 72 are lowered so that the wafer W is lowered to a predetermined position, the opposite rim portions of the wafer W are supported from beneath by the main body portions 45e, 46e. As a result, the wafer W is supported horizontally. Furthermore, when the substrate holding portions 45c, 46c are transported as one in the C-D direction with the mutual spacing (relative distance) maintained, the opposite movement restricting portions 45f, 46f prevent movement of the wafer W, thereby preventing dropping or positional displacement of the wafer W.

Figure 5:
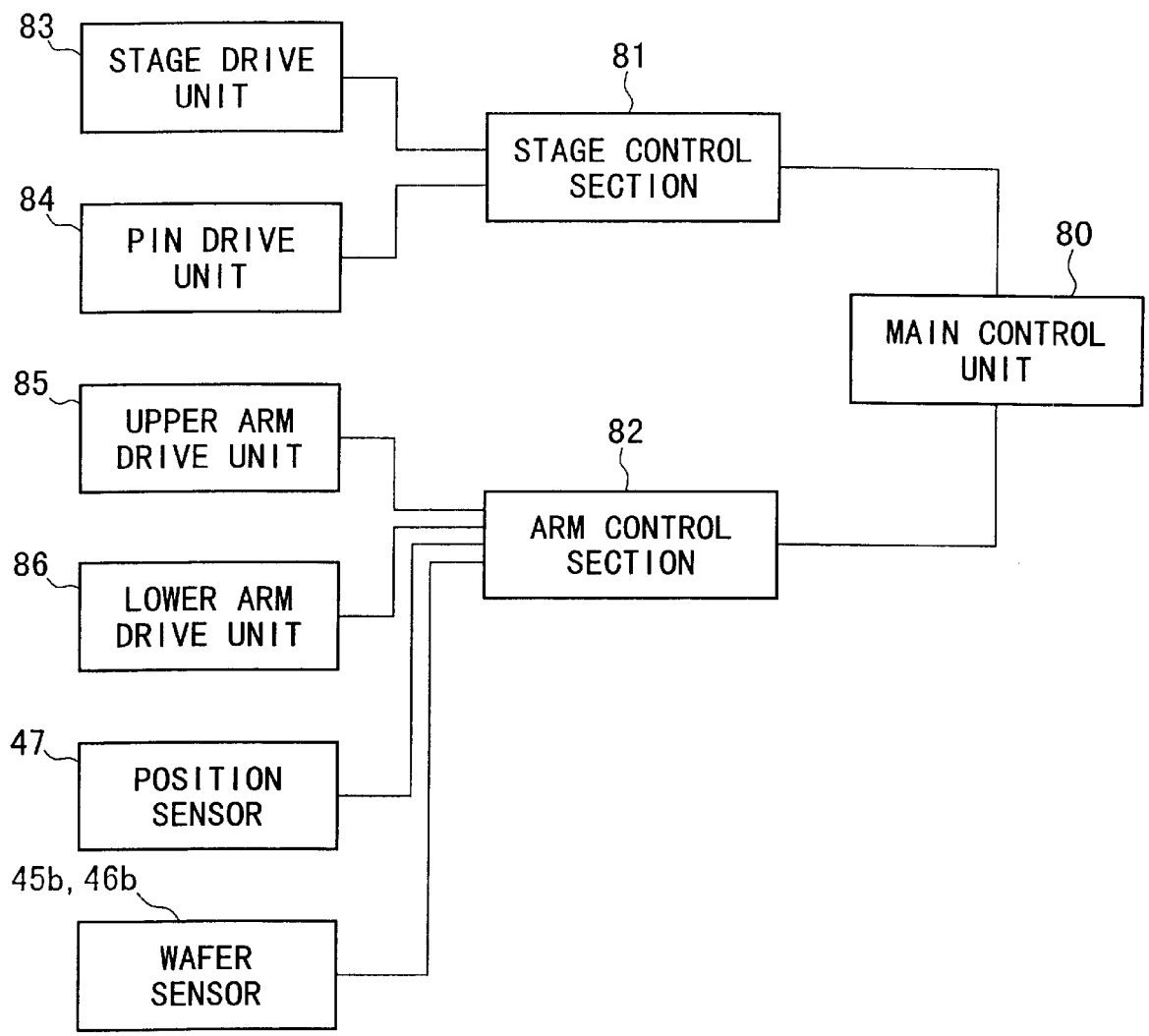
FIG. 5 is a diagram for explaining the main parts of a control mechanism of the apparatus of FIG. 1.

FIG. 5 is a block diagram for explaining the control apparatus for the second transport section 4, and the XY stage 7 shown in FIG. 1. A main control section 80 integrally controls the overall substrate apparatus. Under the control of the main control section 80 there is provided a stage control section 81 and an arm control section 82.

The stage control section 81 appropriately drives the motors 73 via a stage drive unit 83 while monitoring position information from a position measuring device (omitted from the figure) to thereby move the XY stage 7 of FIG. 1 to a desired position. Moreover, the stage control section 81 appropriately drives the support pins 72 up or down via a pin drive unit 84, to raise the wafer W on the mounting table 71 to a suitable position for transferring the wafer W to and from the arm members 45, 46.

The arm control section 82 controls the spacing and translational movement of the arm member 45 of FIG. 2 via an upper arm drive unit 85, and controls the spacing and translational movement of the arm member 46 via a lower arm drive unit 86. At this time, the detection outputs from the position sensor 47 and the wafer sensors 45d, 46d are monitored to prevent erroneous operation of the two arm members 45, 46.

Hereunder is a description of the operation of the exposure apparatus of FIG. 1. The wafer W which has been brought in from outside, is transferred to the second transport section 4 from the first transport section 3, and is then transported to the alignment section 5 and subjected to centering and rotational position adjustment. On completion of alignment, the wafer W is transferred from the second transport section 4 to the XY stage 7, and predetermined alignment and exposure processing is performed directly beneath the exposure optical system 6. On completion of the exposure processing, the wafer W is again transferred to the second transport section 4, and then returned to the first transport section 3 and taken out from the apparatus.

Hereunder is a detailed description of the sequence for wafer W exchange between the second transport section 4 and the XY stage 7. In the sequence of wafer W exchange, a wafer W which has completed exposure processing is recovered from the mounting table 71 of the XY stage 7, and an unexposed wafer W is mounted on the mounting table 71.

Figure 6:
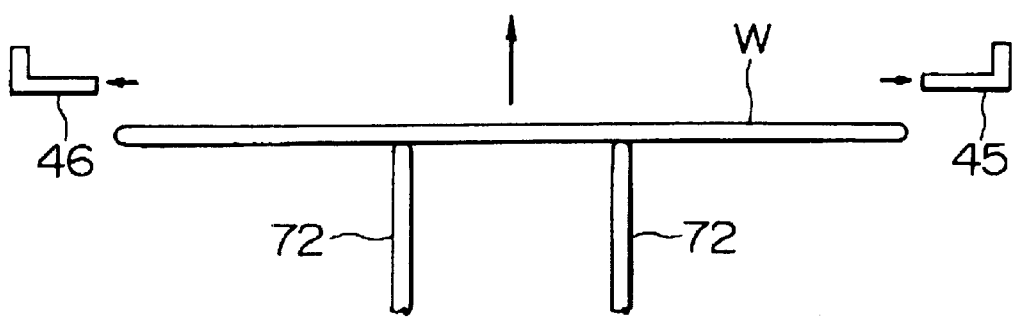
FIG. 6 and FIG. 7 are diagrams for explaining transfer of a wafer between support pins provided on a mounting table, and a pair of arm members.
Figure 7:
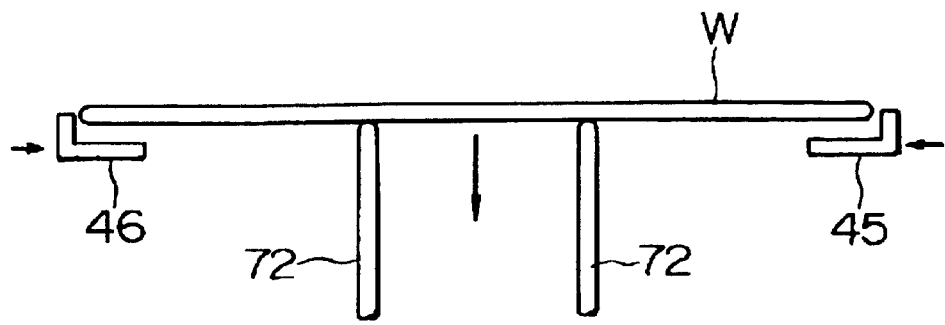

At first, as shown in FIG. 1, the XY stage 7 with the wafer W mounted thereon is moved to the wafer exchange position. At this time, the unload transport unit 41 is also moved to the wafer exchange position. When the transport unit 41 is moved to the wafer exchange position, the arm members 45, 46 are moved to a mutually separated standby position from the transfer position where these are slightly closer together than the diameter of the wafer W (refer to FIG. 6). Then, the mounting table 71 is driven so that the attraction on the wafer W is released, and raising of the support pins 72 is commenced. As a result, the already exposed wafer W on the mounting table 71 is lifted. Then, at the stage where the support pins 72 have been raised to a sufficiently higher position than the arm members 45, 46, the arm members 45, 46 are moved from the standby position to the transfer position where these are slightly closer to together than the diameter of the wafer W (refer to FIG. 7). After this, the support pins 72 are lowered, and the wafer W is passed from the support pins 72 to the arm members 45, 46, that is the transport unit 41. Subsequently, the transport unit 41 on which is mounted the exposed wafer W, and the loading transport unit 42 on which is mounted an unexposed wafer W are substituted. At this time, the arm member of the transport unit 42 is arranged at the transfer position. Then, the mounting table 71 is operated to commence raising of the support pins 72. With the raising of the support pins 72 to a position higher than the transport unit 42, the wafer W is transferred from the transport unit 42 to the support pins 72 side. The arm members of the transport unit 42 are then moved from the transfer position to the standby position. Then, the support pins 72 are lowered so that the wafer W is attracted and held on the mounting table 71. In the above steps, the substrate holding portions 45c, 46c provided on the arm members 45, 46 support the rim portion of the wafer W. Therefore, the arm members 45, 46 can be moved rapidly from the standby position to the transfer position, or from the transfer position to the standby position, and hence the transport of the wafer W can be made promptly. Moreover, at this time, since the wafer W is not held by attraction, then transfer of the wafer W is even more prompt.

Figure 8:
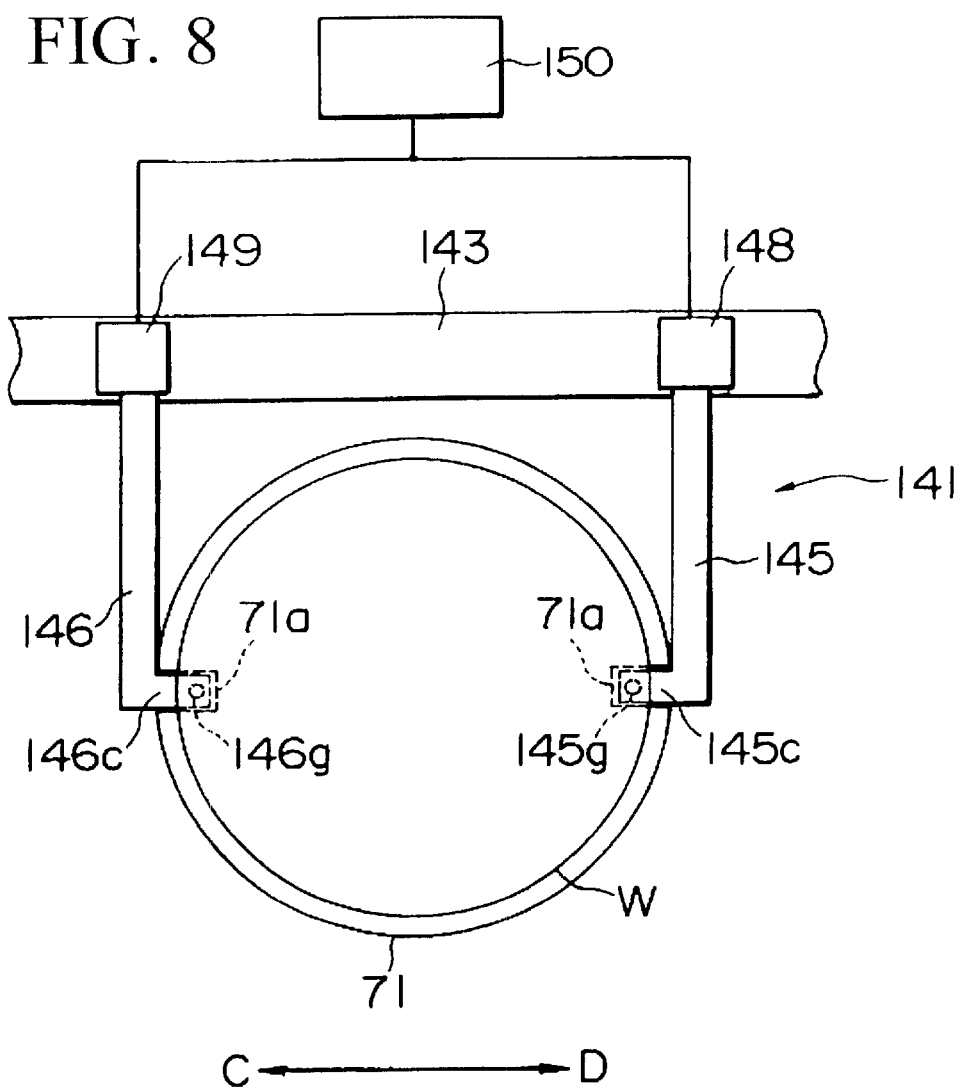
FIG. 8 is a plan view showing a modified example of the second transport section shown in FIG. 2.
Figure 9:
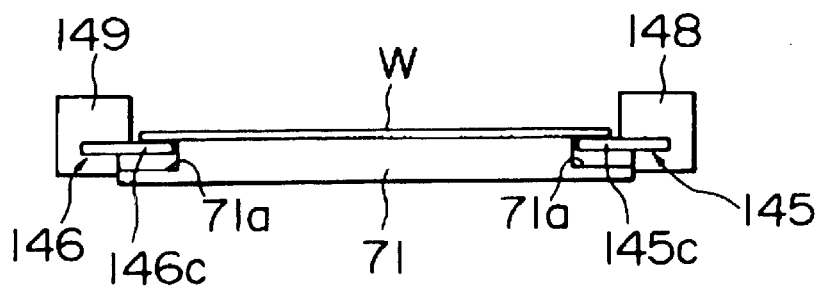
FIG. 9 is a side view showing a modified example of the second transport section shown in FIG. 2.

FIG. 8 and FIG. 9 are diagrams for explaining modified examples of the transport unit 41 shown in FIG. 2. FIG. 8 is a plan view of a transport unit 141, while FIG. 9 is a side view of the transport unit 141. The transport unit 141 comprises a pair of arm members 145, 146. At the bases of the two arm members 145, 146 are provided respective raising units 148, 149 so that the two arm members 145, 146 can be raised synchronously. Furthermore, the two raising units 148, 149 are also able to move independently in the C-D direction along a guide 143. The raising units 148, 149 are controlled to raise (the direction perpendicular to the page) and move in the C-D direction, by a control circuit 150.

Support portions 145c, 146c facing the wafer W for supporting a pair of peripheral portions of the wafer W, are provided at the tip ends of the arm members 145 146, and are formed upon upper faces thereof with attraction portions 145g, 146g for attracting and holding the rear face of the wafer W. A pair of notches 71a are provided opposed to each other in opposite portions in the mounting table 71 on which the wafer W is mounted. The notches 71a are formed larger than the shape of the support portions 145c, 146c so that the tip ends of the arm members 145, 146 (support portions 145c, 146c) can be inserted therein. That is, the two arm members 145, 146 are arranged at positions on either side of the mounting table 71, and separated wider than the diameter of the wafer W, and are moved to lower than the upper face of the mounting table 71 (the lower face of the wafer W). Then, when the two arm members 145, 146 are brought together, the two support portions 145c, 146c are inserted in the pair of notches 71a in the mounting table 71. In this condition the support portions 145c, 146c attract and hold the rear face of the wafer W, and when the two arm members 145, 146 are raised together, the wafer W can be stably raised. At this time, since the amount of movement between the standby position where the support portions 145c, 146c are separated, and the transfer position where the support portions 145c, 146c are brought together is small, then the transfer operation for the wafer W is prompt.

That is to say, the transfer of the wafer W to the mounting table 71 can be performed without using the support pins 72 as shown in FIG. 1. Moreover, due to this construction, the positioning of the wafer W relative to a vertical motion device for the wafer W and the stage can also be carried out.

With the present embodiment, the notches 71a are formed in the mounting table 71. However the mounting surface of the mounting table 71 may be constructed smaller than the size of the wafer W. That is to say, when the wafer W is mounted on the mounting table 71, then the peripheral portion of the wafer W is in a floating condition. In the case of this construction, the substrate holding portions 45c, 46c shown in FIG. 2 having the same shape as the rim of the wafer W may be used.

Figure 10:
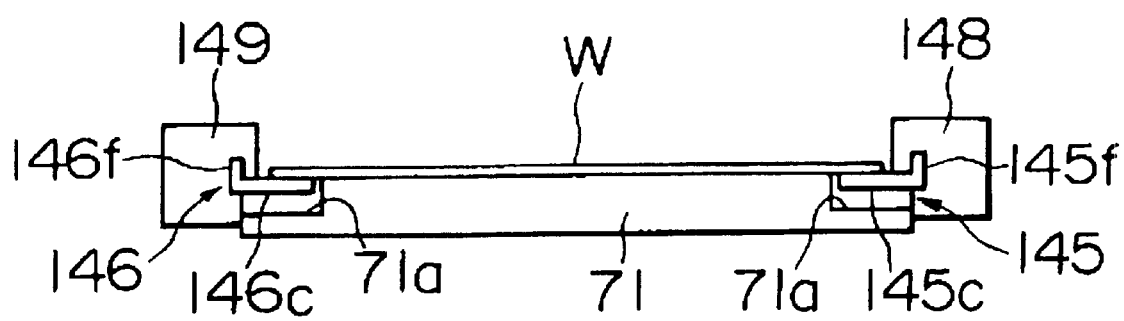
FIG. 10 is a side view showing a modified example of the second transport section shown in FIG. 6.

FIG. 10 shows an arrangement where the arm members 145, 146 shown in FIG. 8 and FIG. 9 are modified. In this case, instead of the attraction portions 145g, 146g, movement restricting portions 145f, 146f are provided upright on the outer side of the support portions 145c, 146c for restricting the horizontal movement of the wafer W.

In the above, the present invention has been described in accordance with the embodiments, however the present invention is not limited to the above embodiments. For example, with the present invention, the wafer W is held with a pair of arm members 45, 46. However if an attraction portion for attracting the wafer W is provided on the arm member 45, then the wafer W can be transported with only a single arm member 45, and the wafer W can be exchanged to and from the mounting table 71.

Furthermore, the wafer W may be transported with three or more arm members, and the wafer W mounted on the mounting table 71.

The present embodiment has been described for an exposure apparatus, however this may also be applied to other apparatus such as a pattern inspection apparatus, or a defect inspection apparatus.

Hereunder, is a description of another example of an embodiment of the present invention, with reference to the drawings. With this example, the present invention is applied to a wafer loader system of a step-and-scan type projection exposure apparatus.

Figure 11:
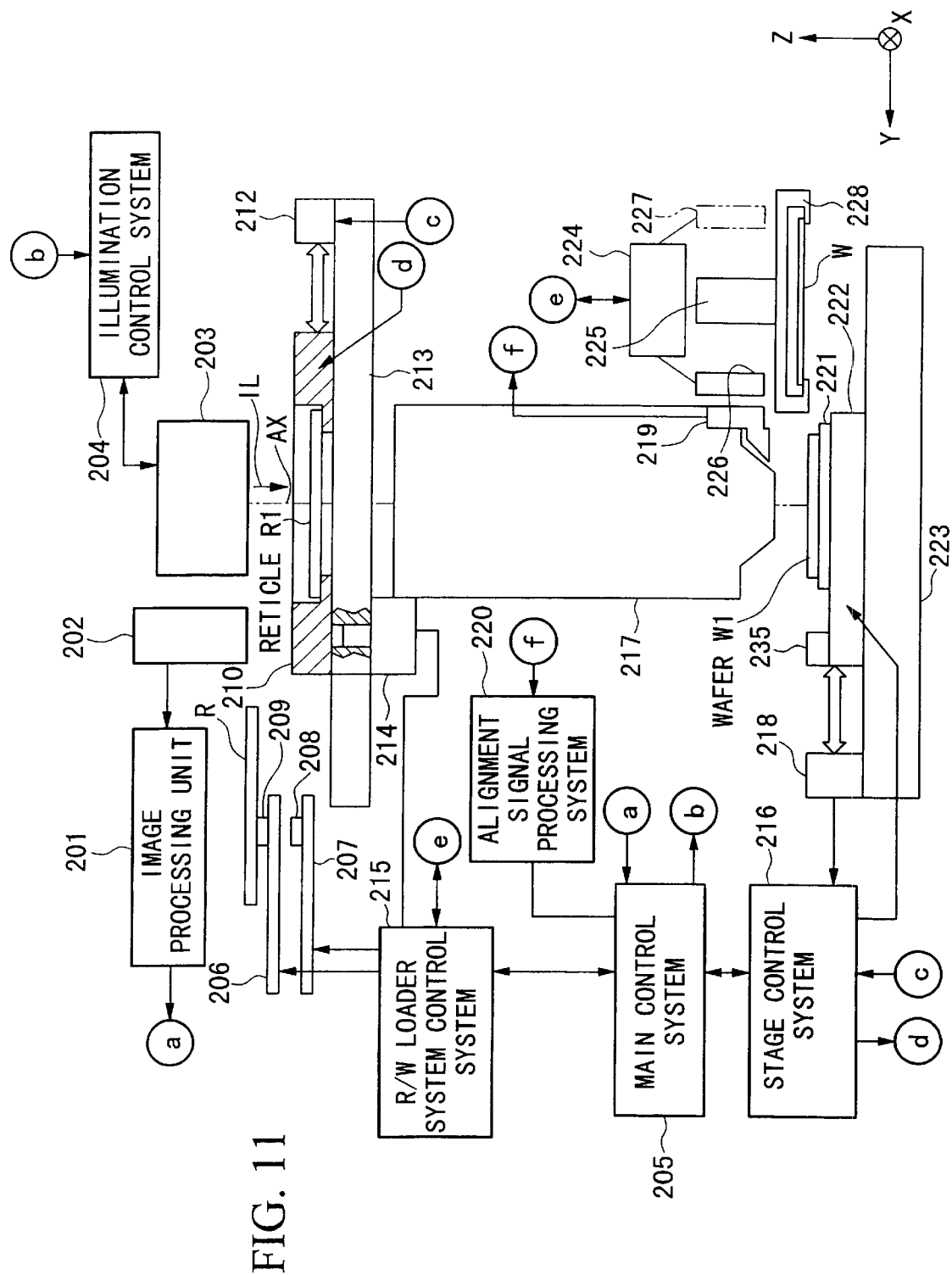
FIG. 11 is a diagram showing a schematic construction of a projection exposure apparatus used as an example of an embodiment of the present invention.

FIG. 11 is a schematic structural diagram showing a projection exposure apparatus of the example. In FIG. 11 at the time of exposure, exposure light IL is irradiated onto a rectangular shape illumination area on a reticle R1 from an illumination optical system 203 comprising; an exposure light source such as a mercury lamp or an excimer laser light source, a dimmer such as an ND variable filter for controlling the quantity of exposure light from the exposure light source, an optical integrator (fly-eye lens, or rod lens) for homogenizing the illumination distribution of the exposure light, a field stop for stipulating the illumination area, and a condenser lens system. For the exposure light IL, the i-ray (wave length 365 nm) of a mercury lamp, excimer laser radiation such as Krf (wave length 248 nm), ArF (wavelength 193 nm) or $F_2$ (wave length 157 nm) excimer laser radiation, or a soft X-ray may be used.

Moreover, with the exposure light IL, the image of the pattern formed on the reticle R is projected onto a rectangular shape exposure region 230 (refer to FIG. 12) on a shot region to be exposed on a wafer W at a projection magnification β (β is ⅕, ¼ etc.) via a projection optical system 217. A resist is applied to the surface of the wafer W1, and a measuring system for indirectly monitoring the exposure amount on the resist is provided inside the illumination optical system 203. Based on the measurement results of the measuring system and control information of a main control system 205 comprising a computer for controlling the operation of the overall equipment, the exposure control system 204 controls the output from the exposure light source, and the dimming proportion of the dimmer so that the illumination of the exposure light IL, and consequently the exposure amount on the resist is made appropriate. The exposure amount also depends on the scanning speed of the wafer W1 and the width in the scanning direction of the exposure area 230.

Hereunder the description is given taking the Z axis as parallel to the optical axis AX of the projection optical system 217, the X axis in the plane perpendicular to the Z axis and perpendicular to the page of FIG. 11 (non scanning direction), and the Y axis parallel to the page in FIG. 11 (scanning direction). At this time, the reticle R is held by vacuum attraction on a reticle stage 210. The reticle stage 210 is floatingly supported by air bearings above a reticle base 213, and is continuously moved in the Y direction by a drive mechanism such as a linear motor, and is moved slightly in a rotation direction about the X direction and the Y direction. The side faces of the reticle stage 210 in the X direction and Y direction are respectively formed with mirror faces serving as moving mirrors. A laser beam such as a three axes laser beam is irradiated from a reticle laser interferometer 212 onto these mirror surfaces, and the laser interferometer 212 measures the X coordinate, Y coordinate and rotation angle of the reticle stage 210. This measurement value is supplied to a stage control system 216 and the main control system 205. The stage control system 216 controls the scanning operation and the positioning operation of the reticle stage 210 based on these measurement values and control information from the main control system 205.

On the other hand, the wafer W1 being exposed, is held by vacuum attraction on top of a circular shape wafer holder 221 of a predetermined thickness. The wafer holder 221 is secured on top of a wafer stage 222, and the wafer stage 222 is floatingly supported via air bearings on top of a wafer base 223 comprising a surface plate. On side faces of the projection optical system 217 is arranged an auto focus sensor (AF sensor) of a multi-point oblique incident type comprising a light emitting system 232E, and a light receiving system 232R as shown by the dotted lines in FIG. 12. With this sensor, the position (focus position) in the optical axis direction of the projection optical system 217 is detected at several measuring points, by irradiating detection light onto the exposure region 230 on the wafer W1 and a plurality of measuring points inside a pre-read region on the near side in the scanning direction with respect to the exposure region 230. The detection results from the AF sensor are continuously supplied to the stage control system 216. Based on the detection results from the AF sensor, the stage control system 216 controls the operation of the Z drive section (not shown in the figure) for the three locations within the wafer stage 222 with an auto focus system and an auto leveling system so that the focus position of the surface of the wafer W1, and the inclination angle coincide with the image surface of the projection optical system 217 within the illumination area 230.

Furthermore, in FIG. 11, the side faces of the wafer stage 222 in the X direction and Y direction are also respectively formed with mirror faces serving as moving mirrors. A multi axis laser beam is irradiated from a wafer side laser interferometer 218 onto these mirror surfaces. The laser interferometer 218 measures the X coordinate, Y coordinate and rotation angle of the wafer stage 222. This measurement value is supplied to a stage control system 216 and the main control system 205. The coordinate system (X, Y) comprising the X coordinates and the Y coordinates of the wafer stage 222 (wafer W) measured by the laser interferometer 218 is referred to as the wafer stage coordinate system or the stationary coordinate system. The stage control system 216 controls the movement of the wafer stage 222 in the X direction and Y direction based on these measurement values and control information from the main control system 205. The wafer stage 222 is steppingly moved and continuously moved in the X direction and Y direction on top of the reticle base 223 by for example a linear motor system.

Then, at the time of exposing the wafer W1, after completing illumination of one shot region on the wafer W1, the wafer stage 222 is steppingly moved so that the next shot region on the wafer W1 is moved to before the exposure region 230 of the projection optical system 217. After this, the reticle stage 210 and the wafer stage 222 are driven so that the reticle R1 and the wafer W1 are synchronously scanned with respect to the projection optical system 217 with the projection magnification β as the speed ratio, and illuminated with exposure light IL. This movement is repeated in a step-and-scan method so that scanning exposure is performed on each shot region on the wafer W1.

In the case where such exposure is superimposed exposure, it is necessary to perform highly accurate alignment beforehand, between each shot region on the wafer W1 and the image of the pattern on the reticle R1. Furthermore, it is necessary to measure the imaging characteristics etc. of the projection optical system 217, and make corrections if possible. In order to perform this alignment, a reticle alignment microscope (not shown in the figure) is arranged above the reticle R1, and an image processing type alignment sensor 219 is arranged by an off-axis method, at a −Y direction side face portion of the projection optical system 217. The alignment sensor 219 comprises an illumination system for illuminating a test mark on the wafer W1, a magnified image formation system for forming an image of the test mark, and a two dimensional image pick-up device of a CCD type or the like, for capturing the image. The image signal from the image pick-up device is supplied to an alignment signal processing system 220, and at the time of wafer alignment, the alignment signal processing system 220 processes the image signal, and obtains the offset amount in the X direction and Y direction of the test mark with respect to a predetermined detection center, and supplies the offset amount to the main control system 205. The main control system 205 is also supplied with the coordinates of the wafer stage 222 measured by the laser interferometer 218 on the wafer side. The main control system 205 then adds the offset amount of the test mark to the coordinates, to thereby calculate the coordinates of the test mark on the coordinate system (X, Y) of the wafer stage.

Figure 15:
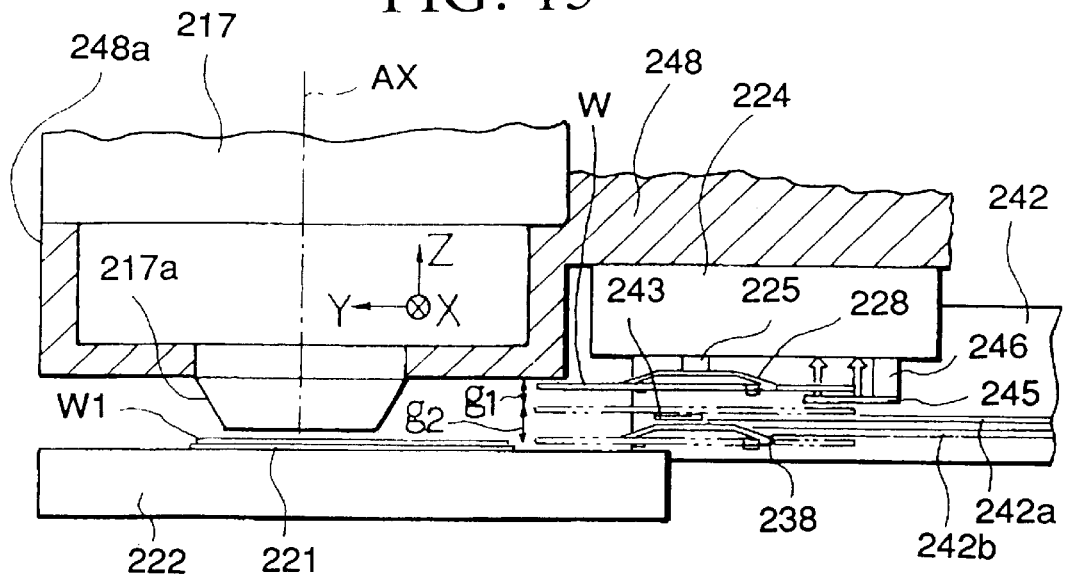
FIG. 15 is a partially cut away schematic diagram showing a support mechanism of the projection optical system 217 of FIG. 11 and a wafer loader system.

Furthermore, FIG. 15 shows the support mechanism for the projection optical system 217 of FIG. 11. In FIG. 15, the projection optical system 217 is supported on a support member 248 comprising a material (such as Invar) with a very small expansion coefficient. That is, a tip end portion 217a of the projection optical system 217 which supports the lens element of the part closest to the wafer, is housed inside a cylindrical shape support portion 248a of the support member 248. Furthermore, the tip end portion 217a of the projection optical system 217 and the support portion 248a of the support member 248 are respectively shown in dotted lines in FIG. 12.

Figure 12:
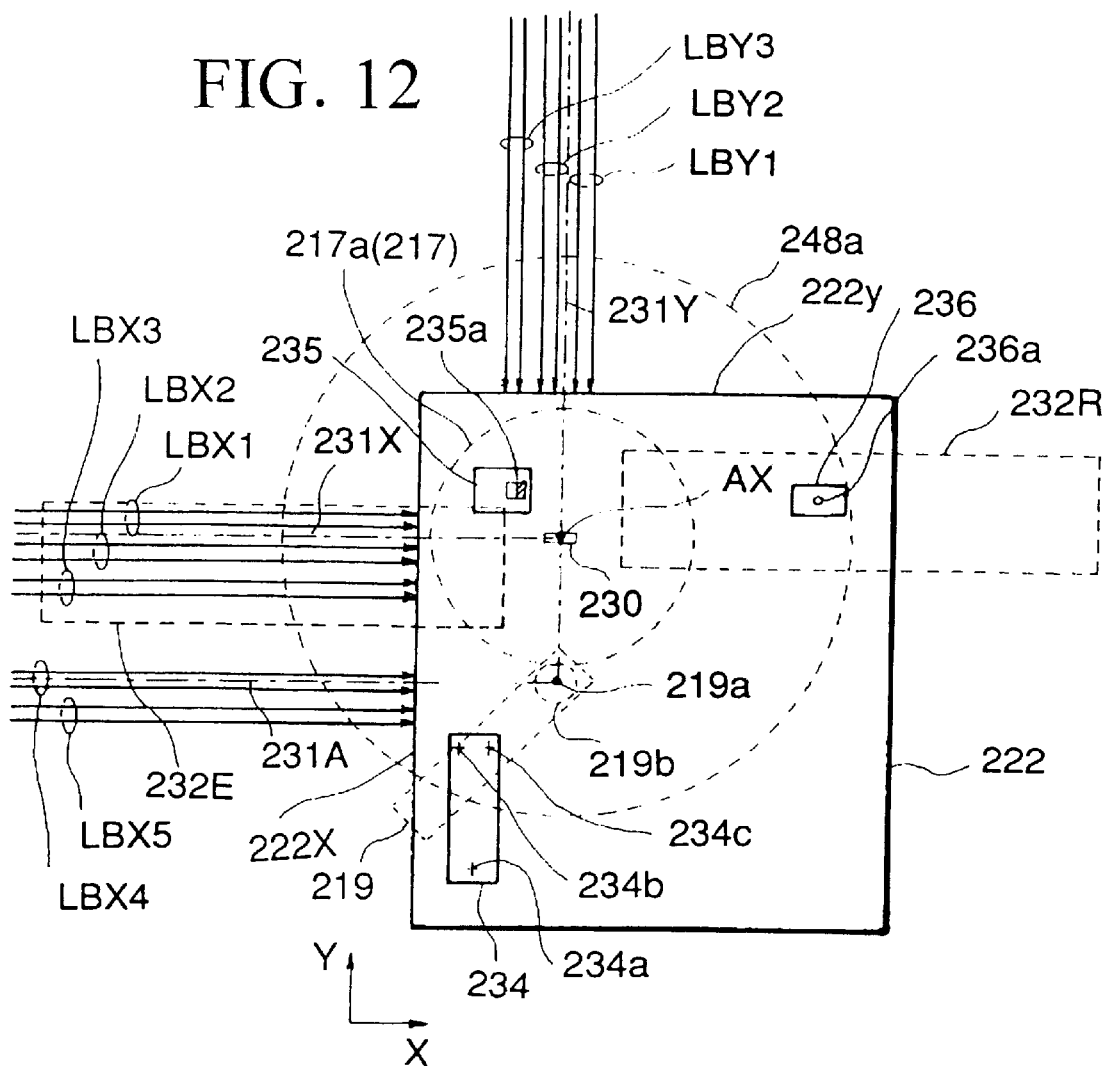
FIG. 12 is a plan view with parts omitted, showing an arrangement of laser beams of a laser interferometer 218, and a system for measuring imaging characteristics on a wafer stage 222 of FIG. 11.

FIG. 12 shows the arrangement of a laser beam from the laser interferometer 218 for measuring the coordinates of the wafer stage 222. In FIG. 12, the center of the rectangular shape exposure region 230 becomes the optical axis AX of the projection optical system 217. Furthermore, the center of the detection visual field 219b of the alignment sensor 219 becomes a detection center 219a. The detection center 219a is the position where for example the center of an index mark inside the alignment sensor 219 is projected onto the alignment image pick-up device. With this example, the detection center 219a and the optical axis AX are arranged on the same straight line parallel with the Y axis. Furthermore, a five axes laser beam comprising a first laser beam LBX1 to fifth laser beam LBX5 is irradiated parallel with the X axis onto an X direction mirror face 222X of the wafer stage 222 from the laser interferometer 218 on the wafer side in FIG. 11. Moreover a three axes laser beam comprising a first laser beam LBY~third laser beam LB3 is irradiated parallel with the Y axis onto a Y direction mirror face 222Y of the wafer stage 222.

In this case, the eight axes laser beams LBX1~LBY3 are respectively double pass types. These each interfere with a laser beam reflected from a reference mirror (not shown in the figure) provided for example on the side face of the projection optical system 217, so that the displacement at a corresponding measuring point is measured at a resolution finer than ½ compared to the single pass type. Furthermore, the optical axis 31X of the X axis two axes laser beams LBX1, LBX2, and the optical axis 231A of the single axis laser beam LBX4 are respectively parallel with the X axis and are on straight lines respectively passing through the optical axis AX of the projection optical system 217 and the detection center 219a of the alignment sensor 219. The optical axis 231Y of the Y axis two axes laser beams LBY1 and LBY2 is parallel with the Y axis and lies on a straight line passing through the optical axis AX and the detection center 219a.

Consequently, at the time of normal exposure, by making the mean value for the displacement measured by the X axis laser beams LBX1 and LBX2 the X coordinate of the wafer stage 222, and the mean value of the displacement measured by the Y axis laser beams LBY1 and LBY2 the Y coordinate of the wafer stage 222, then the displacement of the wafer stage 222 referenced on the optical axis AX of the projection optical system 217 can be measured at high accuracy without any Abbe error attributable to yaw amount. Moreover, the yaw amount of the wafer stage 222 can be obtained from the difference in displacement measured by the laser beams LBX1 and LBX2, or the difference in displacement measured by the laser beams LBY1 and LBY2. Furthermore, with this example, as will be clear from FIG. 11, since the optical path of the laser beam from the laser interferometer 218 deviates by a predetermined amount (made HZ1) lower than the surface of the wafer W1 with respect to the Z direction, then if there is a tilt angle about the X axis (pitching amount at the time of scanning exposure), or a tilt angle about the Y axis (rolling amount at the time of scanning exposure) of the wafer stage 222, then the Abbe errors are mixed into the respective Y coordinate and X coordinate of the wafer stage 222.

Therefore, in order to correct these Abbe errors, in FIG. 12, the laser beam LBY3 is irradiated onto a position shifted by a distance HZ2 in the Z direction with respect to the laser beams LBY1, LBY2. By dividing the difference between the Y coordinate detected via this laser beam LBY3 and the Y coordinate detected via the laser beams LBY1, LBY2 by the distance HZ2, then a pitching amount $\theta X$ of the wafer stage 222 is obtained. Then using this pitching amount $\theta X$, the stage control system 216 of FIG. 11 subtracts $\theta Y \times HZ1$ from the Y coordinate of the wafer stage 222 obtained in the above manner, to thereby obtain a Y coordinate which have been corrected for Abbe error. Similarly, with the X axis also the laser beam LBX3 is irradiated on a position shifted in the Z direction with respect to the laser beams LBX1, LBX2, and by using the measured value, the Abbe error attributable to the rolling amount $\theta Y$ is corrected.

On the other hand, at the time of wafer alignment, by making the displacement measured by the X axis laser beam LBX4 the X coordinate of the wafer stage 222, then the displacement of the wafer stage 222 with the detection center 219a of the alignment sensor 219 as the reference, can be measured to a high accuracy in a condition where there is no Abbe error attributable to the yaw amount. At this time also, in order to correct for the Abbe error attributable to the rolling amount of the wafer stage 222, the laser beam LBX5 is irradiated onto a position shifted by a distance HZ2 in the Z direction with respect to the laser beam LBX4.

Moreover, on the wafer stage 222 around the wafer holder 221 are arranged; a reference plate 234, an aerial image measuring system 235 and an illumination non uniformity sensor 236. On the surface of the reference plate 234 is formed a reference mark 234a for the alignment sensor 219, and reference marks 234b, 234c for the reticle on the reticle stage 210 of FIG. 11. By using these reference marks, a base line amount being the spacing between the center of the pattern image of the reticle (with this example, this coincides with the optical axis AX) and the detection center 219a of the alignment sensor 219, is detected. Furthermore, for the aerial image measuring system 235, there is provided for example a photoelectronic sensor which receives an amount of light which has passed a knife edge 235a. By processing the detection signal from this photoelectronic sensor, a best focus position of the projected image from the projection optical system 217, the image quality (resolution etc.) and various aberrations such as distortion are measured, and these measurement results are supplied to the main control system 205. Furthermore, illumination distribution and the like of the exposure light inside the rectangular shape exposure area 230 is measured by the illumination non uniformity sensor 236.

In order to execute this alignment and exposure, it is necessary to execute exchange of the wafer and the reticle. Hereunder, is a description of the reticle loader system and the wafer loader system of the projection exposure apparatus of FIG. 11. At first, in relation to the reticle loader, a reticle load arm 206 and a reticle unload arm 207 are moved freely along a transport mechanism (not shown in the figure) and arranged close to the reticle base 213. Attraction portions 209, 208 for performing vacuum attraction are respectively fitted to the tip end portions of the arms 206, 207. Operation of these arms 206, 207 is controlled by a R/W loader system control system 215 comprising a computer. Furthermore, a reticle rotating/elevating section 214 having a rotatable spindle which is protrudable within a movement stroke of the reticle stage 210, is arranged inside the reticle base 213. Above this is arranged an imaging system 202. Image signals from the imaging system 202 are supplied to an image processing unit 201. The operation of the reticle rotating/elevating section 214 is also controlled by the R/W loader system control system 215.

At the time of reticle exchange, the used reticle R1 is transferred to the attraction portion 208 of the reticle unload arm 207 via the raised spindle of the reticle rotating/elevating section 214. Then the reticle R on the reticle load arm 206 is temporarily mounted on the upper end of the protruded spindle of the reticle rotating/elevating section 214, and attracted and held. In this condition, the image signal of the imaging system 202 is processed by the image processing unit 201 to thereby obtain the offset amount of the reticle R from the center position, and the rotation error. This result is then supplied to the R/W loader system control system 215. The R/W loader system control system 215 corrects the position of the reticle stage 210 so as to correct the offset amount of the reticle R from the center position, and corrects the rotation angle of the spindle via the reticle rotating/elevating section 214 so as to correct the rotation error. After this, the spindle is lowered so that the reticle R is mounted on the reticle stage 210. In this way, the reticle R is loaded onto the reticle stage 210 in a prealigned condition.

Next, is a description of the wafer loader system for performing loading of the wafer onto the wafer holder 221 on the wafer stage 222, and unloading of the wafer from the wafer holder 221. In FIG. 11, a wafer loader system is arranged close to the −Y direction side face of the projection optical system 217 at a position so as not to mechanically interfere with the wafer side laser interferometer 218. That is, a wafer prealignment drive section 224 is arranged at the side face of the projection optical system 217, and a rotating/elevating section 225 is arranged parallel with the Z axis on the lower face of the wafer prealignment drive section 224. A wafer load arm (a wafer load arm) 228 is secured to a lower end of the rotating/elevating section 225. The wafer load arm 228 is an arm for holding a wafer W to be transported by holding from above. The construction is such that wafer load arm 228 can be displaced by a comparatively large amount in the Z direction, by means of the rotating/elevating section 225 using for example a direct acting spindle system. Moreover, by rotating the rotating/elevating section 225 as a whole, the wafer load arm 228 can be rotated clockwise and counter clockwise about a rotation axis thereof within a predetermined angle range.

Furthermore, an image pickup device 226 for detecting the position of the external shape of the wafer W held on the wafer load arm 228 is arranged on the wafer prealignment drive section 224. The image pickup device 226 as described later, comprises a plurality of image pickup devices arranged at different positions corresponding to a plurality of detection positions for the external shape of the wafer W. Each image pickup device comprises a magnified image formation system, and a two dimensional image pick-up device such as a CCD. Furthermore, an illumination system support section incorporating a plurality of illumination systems for transmission illumination is arranged at the bottom face of the wafer W supported in the wafer load arm 228, so as to so as to be insertable thereunder and withdrawable from thereunder. A plurality of image signals output from the image pickup device 226 due to this transmission illumination, are supplied to the R/W loader system control system 215 via the wafer prealignment drive section 224. In the R/W loader system control system 215, these image signals are subjected to image processing, and positioning (hereunder, referred to as "prealignment" for this example) is performed using the external shape reference of the wafer W. After this, the wafer W is transferred from the wafer load arm 228 onto the wafer holder 221 of the wafer stage 222. Furthermore, for the wafer loader system, as well as this, there is also provided a wafer unload arm for unloading the already exposed wafer W1 on the wafer holder 221, and a wafer transport arm for transporting the wafer W to the wafer load arm 228.

Here the wafer load arm 228 and the image pickup device 226 are each members with respective diameters for use with a 12 inch (approximately 300 mm) diameter wafer (12 inch wafer). For example, in the case of exposing an 8 inch (approximately 200 mm) diameter wafer (8 inch wafer), then another wafer load arm and image pickup device 227 matching this are used. Similarly, the wafer holder 221 is also for use with a 12 inch wafer, and at the time of exposing an 8 inch wafer, another small type wafer holder is used. However, the wafer holder 221 for example may be used in common with respect to a plurality of sized wafers.

Next is a detailed description of the support mechanism for the wafer holder, and the wafer unload arm.

FIG. 15, as already described, shows the support mechanism for the projection optical system 217. In this figure, the wafer prealignment drive section 224 is secured to the support member 248 comprising a low coefficient of expansion member for supporting the projection optical system 217. The wafer load arm 228 is supported via the rotating/elevating section 225 so as to be moveable in the Z direction and rotatable, at the bottom face of the wafer prealignment drive section 224. In this case, the construction is such that the wafer W supported on the wafer load arm 228 can be lowered within a range of a space (g1+g2) from the lower face of the support member 248 supporting the projection optical system 217 to the upper face of the wafer holder 221. As an example, the gap (g1+g2) is 50 mm.

Furthermore, an illumination system rotation shaft 246 is rotatably provided on the bottom face of the wafer prealignment drive section 224 at a location so as not to come in contact with the wafer W supported on the wafer load arm 228. On the bottom end of the illumination system rotation shaft 246 is secured an illumination system support section 245 incorporating a plurality of lights. At the time of prealignment of the wafer W, by raising the rotating/elevating section 225, the wafer W is raised to a position adjacent to the support portion 248a. The illumination system support section 245 is then inserted beneath the lower face of the wafer W in the range of the gap g1 from the lower face of the support portion 248a, by rotating the illumination system rotation shaft 246. Moreover a wafer transport mechanism support section 242 is arranged at the rear face side of the wafer prealignment drive section 224. A wafer transport arm 243 and a wafer unload arm (wafer unload arm) 238 are mounted on the wafer transport mechanism support section 242 within a range of the gap g2 from the lower face of the illumination system support section 245 to the upper face of the wafer holder 221. As an example, when the gap (g1+g2) is 50 mm, the gap g2 is 30 mm (gap g1 is 20 mm). The wafer unload arm 238 has the same shape as the wafer load arm 228.

Furthermore, the wafer transport arm 243 can be moved in the Y direction above the wafer unload arm 238 by means of a drive section (not shown in the figure) along a slit shape opening 242a formed parallel with the Y axis. Moreover, a slit shape opening 242b is formed in the wafer transport mechanism support section 242 at below the slit shape opening 242a and parallel with the opening 242a. The wafer unload arm 238 is supported so as to be moveable in the Y direction by means of a drive section (not shown in the figure) along this opening 242b. Furthermore, the wafer unload arm 238 is supported so as to be able to be raised in a predetermined range in the widthwise direction (Z direction) of the opening 242b. The wafer transport mechanism support section 242 is mounted on a different member to the support member 248 supporting the projection optical system 217. In this way, by securing the wafer transport mechanism support section 242, and the support member 248 for the projection optical system 217 and the wafer prealignment drive section 224, to mutually different members, then vibrations generated by the wafer transport arm 243 and the wafer unload arm 238 are not transmitted to the wafer prealignment drive section 224 and the image pickup device 227. Therefore prealignment and positioning at the time of exposure can be performed to a high accuracy.

Furthermore, on the right side of the wafer transport mechanism support section 242, while not shown in the figure, there is provided a wafer transport line for transporting unexposed and exposed wafers to and from a resist coater-developer or the like. The wafer transport arm 243 serves the role of transporting the unexposed wafer of this wafer transport line along the opening 242a as far as the wafer load arm 228. The wafer unload arm 238 serves the role of transporting the wafer after exposure which has been unloaded from the wafer holder 221, along the opening 242b as far as the wafer transport line. Furthermore, when the wafer is transferred from the wafer transport line to the wafer transport arm 243, then as an example, adjustment of the position and rotation angle of the wafer is carried out roughly by the external shape reference, via a turntable and position detection device (not shown in the figure). Considering that adjustment of the position or the like using this turn table is made with a first time preliminary positional alignment, then it can also be considered to make a second preliminary positional alignment of the prealignment of the wafer W held in the wafer load arm 228.

Figure 16:
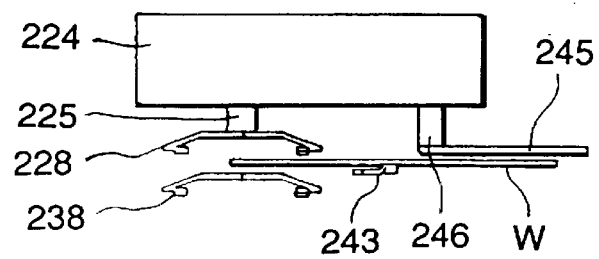
FIG. 16 is a diagram of main parts illustrating the case where a wafer is transferred from a wafer transport arm 243 to a wafer load arm 228.

In the above manner, when the wafer W is transferred from the wafer transport arm 243 to the wafer load arm 228, as shown in FIG. 16, the illumination system support section 245 is withdrawn by the rotation of the illumination system rotation shaft 246. Furthermore, with the support member 248 in a condition slightly lowered to a height a little lower than the opening 242a in FIG. 15, then after moving the center of the wafer W to the center of the rotating/elevating section 225 by means of the wafer transport arm 243, the wafer load arm 228 is raised to thereby transfer the wafer W to the wafer load arm 228. The operation of the rotating/elevating section 225, the illumination system rotation shaft 246, the wafer transport arm 243, and the wafer unload arm 238 is controlled by the R/W loader system control system 215 of FIG. 11. The R/W loader system control system 215 performs transfer of timing information and the like to and from the main control system 205.

Figure 13:
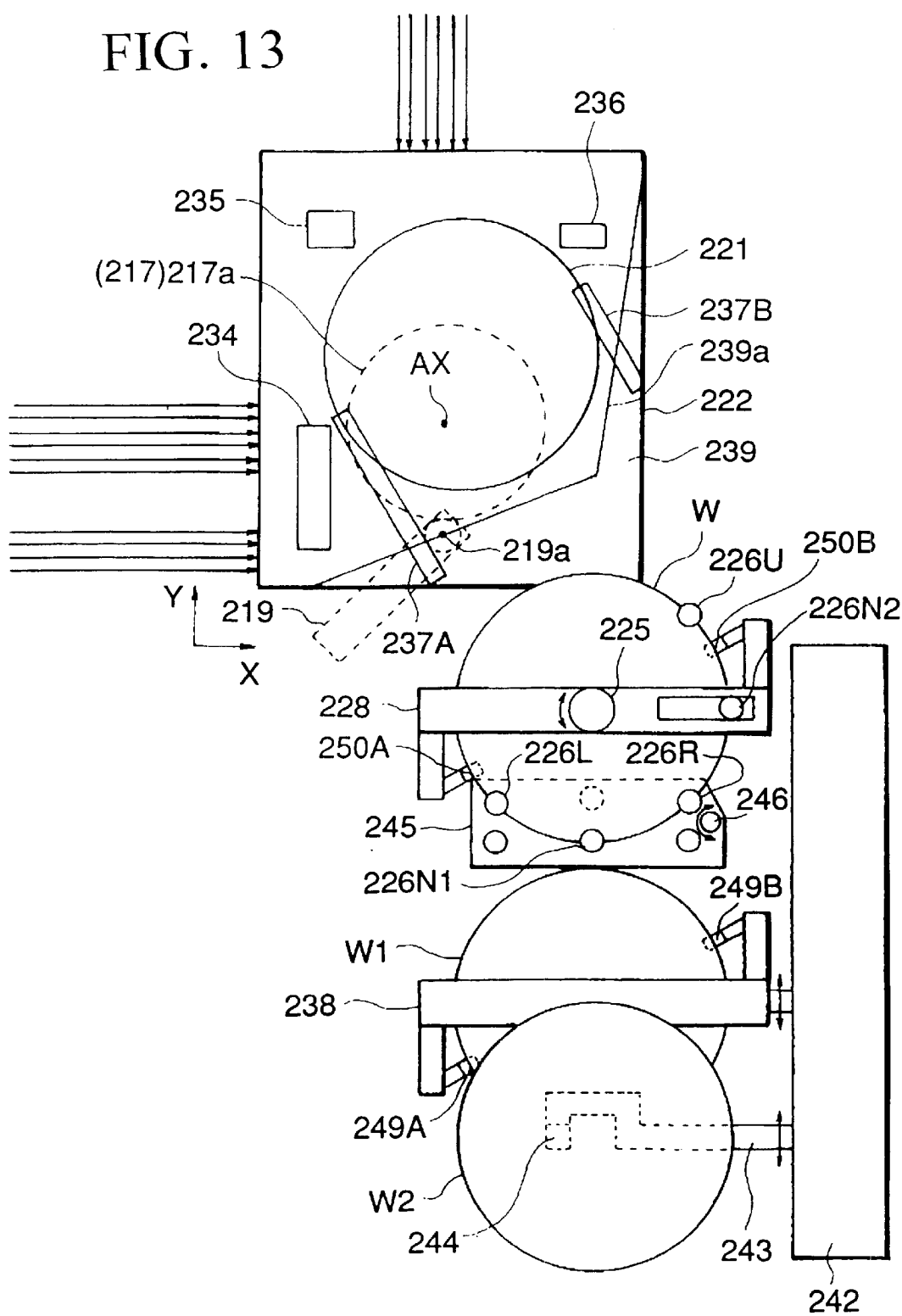
FIG. 13 is a plan view showing the wafer stage 222 in FIG. 11 and a wafer loader system for 12 inch wafers.

FIG. 13 is a plan view showing the positional relationship between the wafer stage 222 and the wafer loader system in the projection exposure apparatus of this example. This FIG. 13 is representative of a system for a 12 inch wafer. This time, the wafer load arm 228 is constructed to hold from above the wafer W to be loaded. Attraction portions 250A, 250B are formed at two contact portions for the wafer, for holding the wafer with vacuum attraction. As shown in FIG. 15 and FIG. 16, the attraction portions 250A, 250B project further downward of bottom face of the wafer W to be held. Similarly, on the wafer unload arm 238 of FIG. 13 there is also formed attraction portions 249A, 249B for holding the wafer to be unloaded (wafer W1) from the lower face side by vacuum attachment. The attraction portions 249A, 249B also protrude downwards of the bottom face of the wafer W1. Therefore, so that these attraction portions 250A, 250B, 249A, 249B do not come into contact with the surface of the wafer holder 221 on the wafer stage 222, two parallel grooves 237A, 237B are formed straddling from the upper face of the wafer stage 222 to the upper face of wafer holder 221.

The spacing of the grooves 237A, 237B is the same as the spacing of the attraction portions 250A, 250B in the wafer load arm 228, that is to say, the same as the spacing of the attraction portions 249A, 249B in the wafer unload arm 238. The respective widths of the grooves 237A, 237B are formed wider than the width of the respective lower end portions of the attraction portions 250A, 250B, and attraction portions 249A, 249B. The respective depths of the grooves 237A, 237B are formed deeper than the respective thicknesses of the attraction portions 250A, 250B and the attraction portions 249A, 249B. With this example, in the condition where according to the results from the prealignment, the wafer load arm 228 is rotated by a predetermined angle via the rotating/elevating section 225 and the respective attraction portions are inserted into the grooves 237A, 237B, drive of the wafer stage 222 is carried out. Therefore, in order to correspond with the upper limit of the change in the spacing etc. of the attraction portions 250A, 250B at this time, the width of the grooves 237A, 237B is set to have some leeway.

With this construction, in transferring the wafer W from the wafer load arm 228 onto the wafer holder 221, then after moving the wafer stage 222 so that the center of the wafer holder 221 is aligned with the center of the rotating/elevating section 225, the wafer load arm 228 is lowered so that the attraction portions 250A, 250B are inserted into the grooves 237A, 237B. After this, the wafer stage 222 can be moved to the upper left along the grooves 237, 237B. Conversely, at the time of transferring the wafer W1 from the wafer holder 221 to the wafer unload arm 238, in advance, the center of the wafer unload arm 238 is aligned with the center of the rotating/elevating section 225, and with the height of the attraction portions 249A, 249B aligned with the grooves 237A, 237B, the wafer stage 222 is moved parallel with the grooves 237A, 237B. After the center of the wafer holder 221 has been moved as far as the center of the rotating/elevating section 225, the wafer unload arm 238 can be raised.

In this way, the heretofore operation of the vertical motion of the wafer lift pins protrudably provided in the wafer holder, is replaced by the raising and lowering operation of the wafer load arm 228 and the wafer unload arm 238. Moreover, for example the avoidance operation carried out heretofore on the wafer load arm and the wafer unload arm side is substituted by the movement operation of the wafer stage 222. Therefore, there if no longer the need to provide the wafer lift pins on the wafer holder 221 side. Consequently, the construction of the wafer stage 222 can be simplified, and miniaturization of the wafer stage 222 is also possible. Therefore, the stepping drive speed of the wafer stage 222 and the scanning speed can be easily improved without increasing the output of the drive motor such as a linear motor for driving the wafer stage 222, and consequently without increasing the amount of heat generated. Therefore the throughput of the exposure process can be improved.

Here the length of the grooves 237A, 237B provided straddling from the wafer holder 221 to the upper face of the wafer stage 222, should at least be set to a range where there is just an overlap of the attraction portions 250A, 250B (or the 249A, 249B) and the wafer W (or W1). However, considering the differences in the timing for raising the wafer load arm 228, and the timing for lowering the wafer unload arm 238, and the timing for moving the wafer stage 222, then desirably this should be made a length with a certain amount of leeway.

However, supposing that the thickness of the wafer holder 221 on the wafer stage 222 is a thickness so as to have an allowance over the thickness of the attraction portions 250A, 250B or 249A, 249B, then the grooves 237A, 237B may be provided in only the wafer holder 221, and there is no need to provide these on the wafer stage 222 side. In this case, the ends of the grooves 237A, 237B are open. Therefore, the degree of freedom for the timing of the raising of the wafer load arm 228 and the lowering of the wafer unload arm 238 is increased. Therefore for example the movement speed of the wafer stage 222 can be increased, thus improving throughput.

On the other hand, as with this example, in the case where the thickness of the wafer holder 221, and the thickness of the attraction portions 250A, 250B, or 249A, 249B are approximately the same, or thinner, then in the case where the upper face of the wafer stage 222 is flat, in order to prevent coming into contact with the attraction portions 250A, 250B or 249A, 249B, it is necessary to form the grooves 237A, 237B long as shown by the full lines in FIG. 13. Here, these are also appropriate for the case where the wafer holder 221 is used in combination with the wafer stage 222, that is to say in the case where the upper face of the wafer stage 222 and the upper face of the wafer holder 221 are in the same plane. In this case, in order to prevent the end portions etc. of the grooves 237A, 237B coming into contact with the attraction portions 250A, 250B or 249A, 249B, then at the time of wafer exchange it is desirable for example, for the moving speed of the wafer stage 222 to be slowed down. Therefore, there is the likelihood of a drop in throughput.

Therefore, with the present example, a step portion 239 of a predetermined depth is formed in the upper face of the wafer stage 222 in the portion to the lower left of the wafer holder 221. The sum of the depth of the step portion 239 and the thickness of the wafer holder 221 is set so as to be thick enough to have a leeway with respect to the thickness of the attraction portions 250A, 250B and 249A, 249B. In this way, the requirement for forming the grooves 237A, 237B inside of an edge portion 239a of the step portion 239 disappears. Therefore, compared to the case where the grooves 237A, 237B are formed long, the wafer stage 222 can be moved at a high speed, and hence throughput improved.

In FIG. 13, prealignment of the wafer W supported on the wafer load arm 228 is performed. The wafer W2 which is to be exposed after the wafer W, is supported on the wafer transport arm 243. In the tip end portion of the wafer transport arm 243 is also formed an attachment portion 244 for vacuum attaching the wafer. In this case, image pickup devices 226L, 226N1, 226R, 226N2, and 226U are arranged above five locations on the periphery of the wafer W which is being held in the wafer load arm 228. The detection centers of these five image pickup devices 226L~226U are respectively set on the same circumference, with the rotation axis (central axis) of the rotating/elevating section 225 as a center. The illumination system support section 245 is arranged on the lower face side of the wafer W so as to be rotatable about the axis of the illumination system rotation shaft 246. In FIG. 13, the rotation angle of the illumination system support section 245 is set so that the lighting system inside the illumination system support section 245 is arranged so as to face the image pickup devices 226L, 226N1 and 226R.

Figure 17:
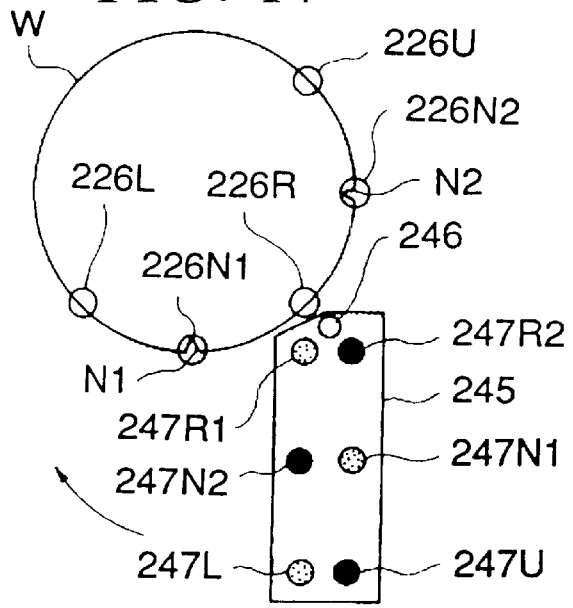
FIG. 17 through FIG. 20 are diagrams for explaining a measuring method for the case where prealignment of a 12 inch wafer is carried out in an example of an embodiment of the present invention.

FIG. 17 through FIG. 20 are diagrams for explaining the operation for the case where prealignment is performed on a 12 inch wafer W. FIG. 17 shows the condition where the illumination system support section 245 is withdrawn from the lower face of the wafer W. Six lighting systems 247L, 247N2, 247R1, 247U, 247N1, 247R2 are secured to the illumination system support section 245. These lighting systems comprise a light source for generating each of the lights, and a condenser lens. Moreover, in the 12 inch wafer W there is provided a notch N1 (referred to hereunder as 0 degrees direction) formed for example according to the SIA standard (Semiconductor Industry Association of America), and a 90 degree direction notch N2 at a position rotated 90 degrees with respect to the notch N1. Here the location and number of notches is optional, and instead of a notch an orientation flat or the like may be provided.

Figure 18:
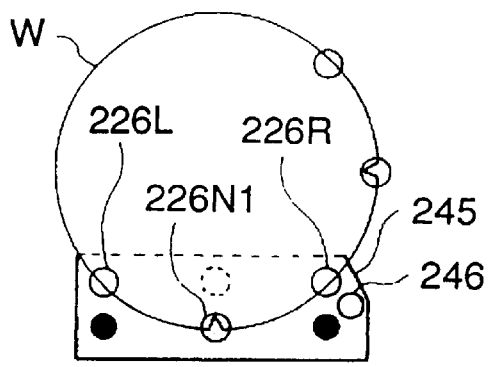
Figure 20:
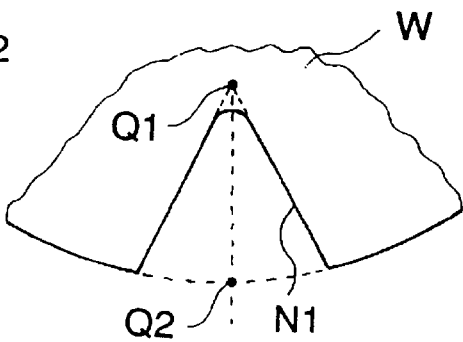

In the case here with two notches N1, N2, the image pickup devices 226N1, 226N2 are set up for observing the notches N1, N2. Furthermore, the image pickup devices 226L, 226R are arranged for observing the left and right peripheries of the notch N1. Moreover, image pickup devices 226R, 226U are provided for observing the left and right peripheries of the notch N2. Furthermore, when detecting the notch N1 and the periphery of the wafer W to the left and right of this, then as shown in FIG. 18, the illumination system support section 245 is rotated 90 degrees from the condition of FIG. 17 so that the lighting systems 247L, 247N1, 247R1 in the illumination system support section 245 respectively face the image pickup devices 226L, 226N1, 226R. Then, by processing the image signal of the image pickup devices 226L, 226R, then as an example, the two dimensional positional displacement amount of the point closest to the detection center at the periphery of the wafer W from that detection center is obtained. Furthermore, for the notch N1, by processing the image signal of the image pickup device 226N1, then as an example as shown in FIG. 20, the two dimensional positional displacement amount from the detection center of the intersection point Q2 (hereunder referred to as the "notch center") of the straight line bisecting the notch N1 and centered on the imaginary intersection point Q1 of the left and right edges of the notch N1, and the circular arc for the imaginary extension of the periphery of the wafer W is obtained.

Figure 19:
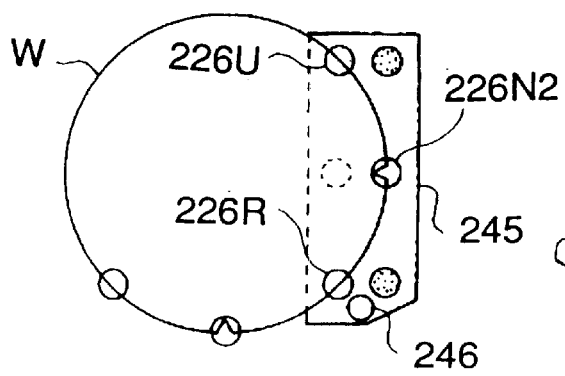

Next, when detecting the notch N2 and the periphery of the wafer W to the left and right of this, then as shown in FIG. 19, the illumination system support section 245 is rotated 90 degrees from the condition of FIG. 18 so that the lighting systems 247R2, 247N2, 247U in the illumination system support section 245 respectively face the image pickup devices 226R, 226N2, 226U. Then, by processing the image signal of the image pickup devices 226R, 226U, then as an example, the two dimensional positional displacement amount of the point closest to the detection center at the periphery of the wafer W is obtained. Then by processing the image signal of the image pickup device 226N2, as an example the positional displacement of the center of the notch N2 is obtained.

After this, in the R/W loader system control system 215, the periphery of the wafer W and the positional displacement amount from the center of the notches N1 and N2 is processed using a least squares method or the like. In this way, the positional displacement amount of the center of the wafer in the X direction and the Y direction ($\Delta WX$, $\Delta WY$) with respect to the rotation axis of the rotating/elevating section 225 of FIG. 13, and the rotation angle error (rotation error) $\Delta\theta W$ of the wafer W referenced on the notches N1, N2 is computed. The rotation error $\Delta\theta W$ referenced on the notches N1, N2, as an example is the mean value of the inclination angles with respect to the Y axis and X axis, of the straight lines connecting the center of the notches N1 and N2 and the center of the wafer W. After this, the R/W loader system control system 215 rotates the rotating/elevating section 225 of FIG. 13 so as to compensate for the rotation error ΔθW, and thus corrects the rotation angle of the wafer W, and supplies the positional displacement amount (ΔWX, ΔWY) to the main control system 205. In the main control system 205, the positional displacement amount (ΔWX, ΔWY) is added to an offset for at the time of performing the final alignment (fine alignment) of the wafer W.

In this way, with this example, by rotating the illumination system support section 245 in two steps, the position of the periphery of the wafer W at the two sets of measuring points is detected. Therefore even if the wafer W is a large size 12 inch wafer, the illumination system support section 245 can be miniaturized, and the wafer loader system can also be miniaturized.

Here FIG. 13, and FIG. 17 through FIG. 20 show the structure for a 12 inch wafer. In the case where the wafer to be exposed is an 8 inch wafer, the respective structures of FIG. 14, FIG. 21 and FIG. 22 are used.

Figure 14:
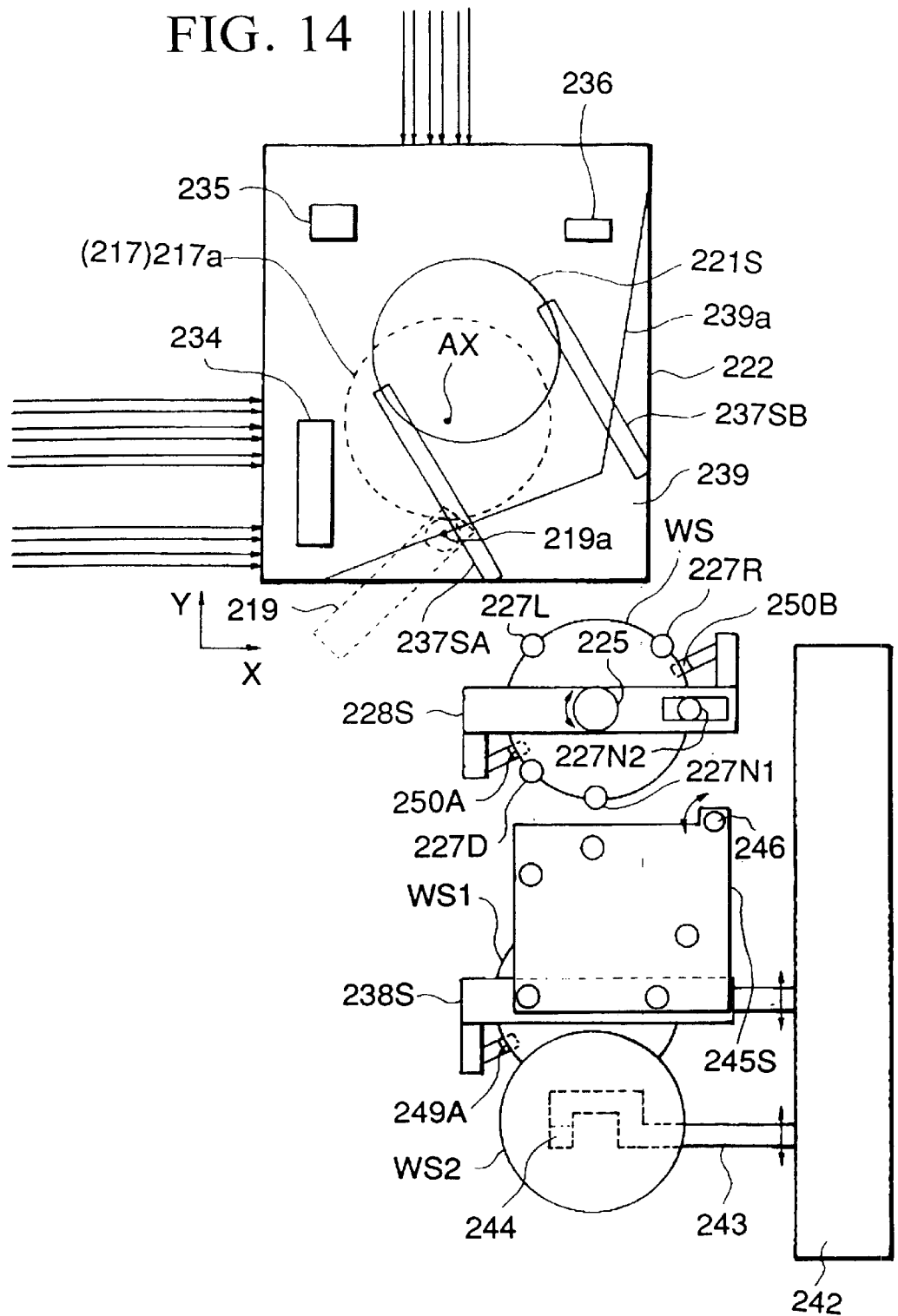
FIG. 14 is a plan view showing the wafer stage 222 in FIG. 11 and a wafer loader system for 8 inch wafers.

That is to say, FIG. 14 is a plan view wafer corresponding to FIG. 13, showing the wafer loader system for the case where exposure is carried out on an 8 inch. In FIG. 14, a disc shape wafer holder 221S with a diameter slightly larger than 8 inches is secured to the upper face of the wafer stage 222. Parallel grooves 237SA, 237SB are formed so as to touch opposite edges of the wafer holder 221S. In this case also, when the wafer holder 221S is thick, it is not necessary to form the grooves 237SA, 237SB in the wafer stage 222. In the case where the wafer holder 221S is thin, or is formed integral with the wafer stage 222, then by providing a step portion 239, the requirement for forming the grooves 237SA, 237SB inside of an edge portion 239a of the step portion 239 disappears. Therefore, the wafer stage 222 can be moved at high speed, thereby improving throughput. Here, the wafer stage 222 can be further miniaturized.

Furthermore, the wafer load arm 228S for holding the 8 inch wafer WS during prealignment can also be miniaturized. Image pickup devices 227D, 227N1, 227N2, 227R, 227L are arranged for detecting the position of five locations on the periphery of the wafer WS. Moreover, attraction portions 250A, 250B for attracting and holding the wafer W from the underside are also provided in the wafer load arm 228S. These attraction portions 250A, 250B are accommodated in grooves 237SA, 237SB. Furthermore, an illumination system support section 245S is provided on the bottom face side of the wafer WS so as to be freely inserted and removed by rotation about the illumination system rotation shaft 246. Five lighting systems are fitted inside the illumination system support section 245s. Moreover, the wafer unload arm 238s is miniaturized to suit an 8 inch wafer WS1, and an 8 inch wafer WS2 is also mounted on the wafer transport arm 243. Other construction is the same as for the example of FIG. 13.

Figure 21:
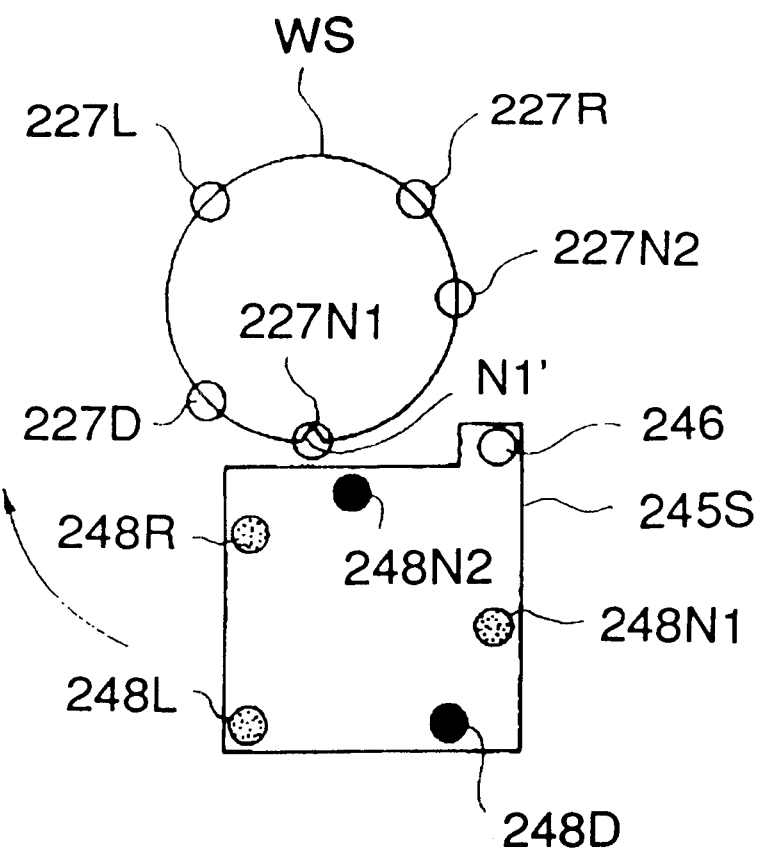
FIG. 21 and FIG. 22 are diagrams for explaining a measuring method for the case where prealignment of an 8 inch wafer is carried out in an example of an embodiment of the present invention.
Figure 22:
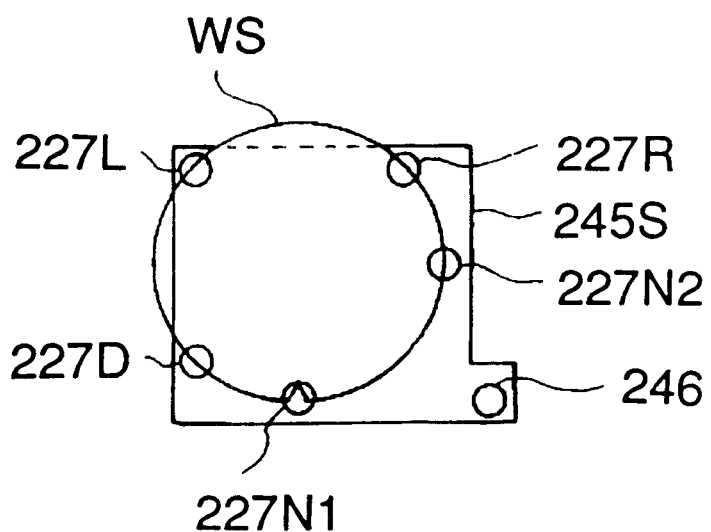

FIG. 21 and FIG. 22 are diagrams for explaining the operation for the case where prealignment is performed for an 8 inch wafer WS. FIG. 21 shows the condition where the illumination system support section 245S is withdrawn from the lower face of the wafer WS. Five lighting systems 248L, 248D, 248N1, 248N2, 247R are secured to the illumination system support section 245S. Moreover, in the 8 inch wafer WS also there is provided according for example to SIA specifications, a 0 degrees direction notch N1' and/or a 90 degree direction notch N2' at a position rotated 90 degrees with respect to the notch N1'. In this example the location and number of notches is optional, and instead of a notch an orientation flat or the like may be provided.

With the example of FIG. 21, the image pickup devices 227N1, 227N2 are arranged for observing the 0° notch N1' and the 90° notch N2', and image pickup devices 227D, 227L, 227R are provided clockwise from the notch N1' for observing the position of the periphery of the wafer WS. Furthermore, when detecting the position of the periphery of the wafer WS, then as shown in FIG. 22, the illumination system support section 245S is rotated 90° from the condition of FIG. 21 so that the five lighting systems 248N1~248N2 in the illumination system support section 245S respectively face the image pickup devices 227N1~227N2. Then, by processing the image signal of the five image pickup devices 227N1~227N2, the positional displacement amount in the X direction and the Y direction of the center of the wafer WS with respect to the rotation axis of the rotating/elevating section 225 of FIG. 14, and the rotational error of the wafer WS referenced on the notch N1 or the like is computed.

In this way, in the case of an 8 inch wafer, even though a lighting system is provided for simultaneously illuminating the detection fields for all of the image pickup devices 227N1~227N2, the illumination system support section 245S is not very large. Therefore the wafer WS can be illuminated at one time. Consequently, the prealignment can be performed at high speed. A more detailed method for detecting the central position and rotation angle of the wafer, from the position detected in the plurality of detection regions on the periphery of the wafer, is disclosed for example in Japanese Unpublished Patent Application No. 9-36202. Furthermore, with the 8 inch wafer, there is also the case where instead of the notch, an orientation flat is used. In order to use in combination illumination of the orientation flat and illumination of the notch, a light such as a fluorescent lamp or a fluorescent screen with a wide illumination area may be provided in the illumination system support section 245S.

Figure 23:
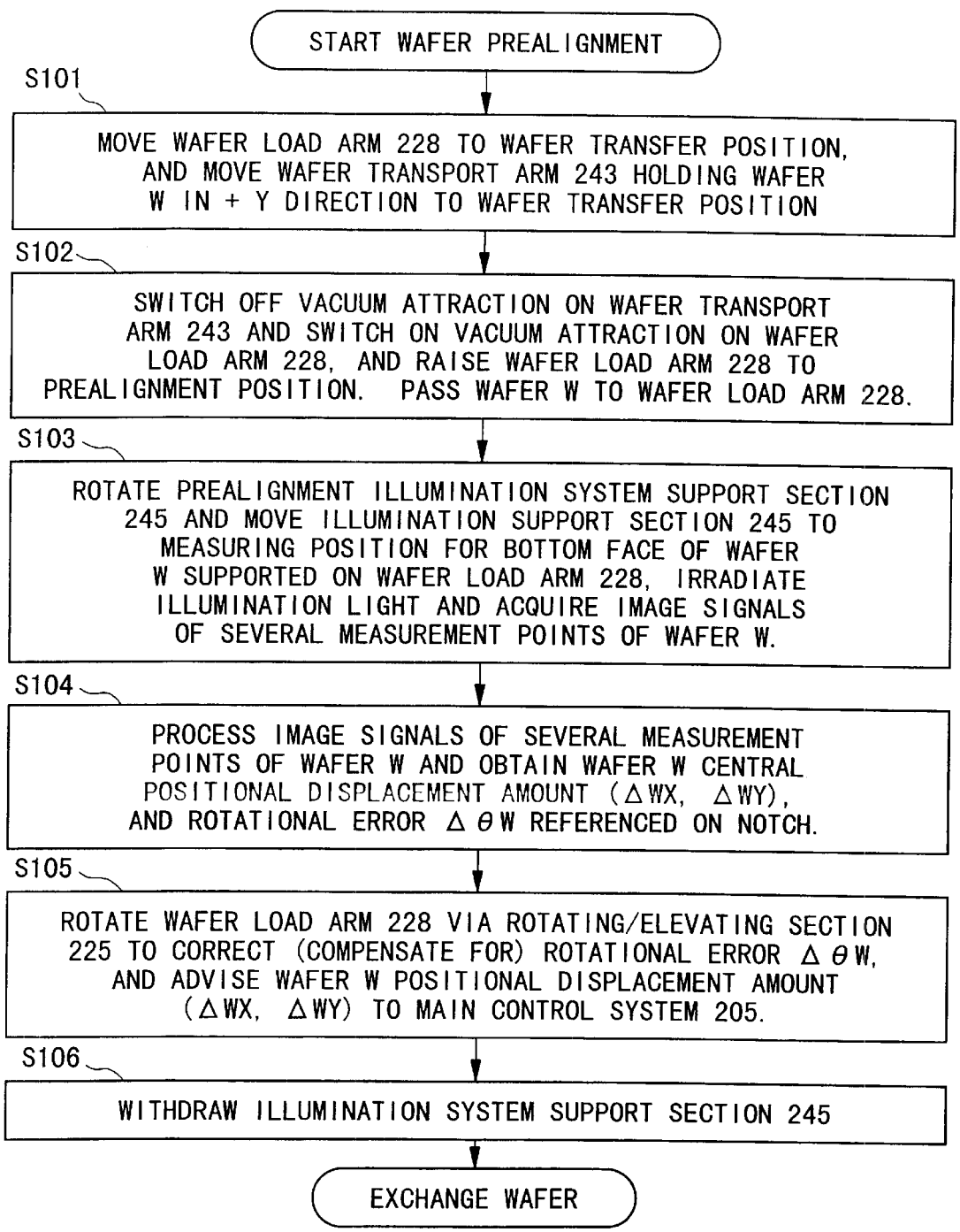
FIG. 23 is a flow chart illustrating operations in the case of performing wafer prealignment in the example of the embodiment of the present invention.
Figure 24:
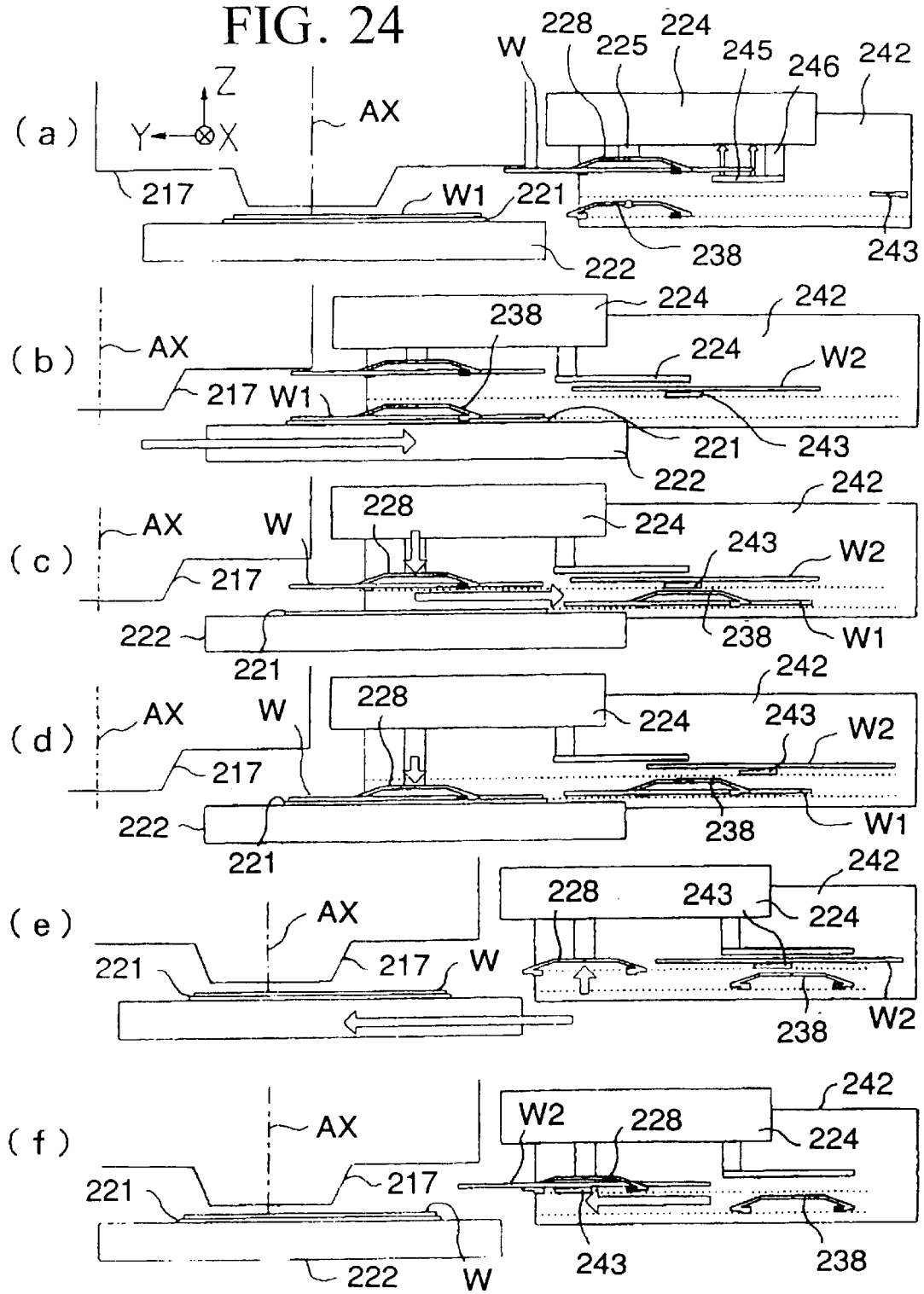
FIG. 24 is a diagram for providing an explanation of a series of operations for the case where wafer prealignment and wafer exchange is performed.

Next is a description of a series of operations at the time of prealignment of the wafer W shown in FIG. 13, with reference to the flow chart of FIG. 23 and to FIG. 24. FIGS. 24(a) through 24(f) respectively show the bottom portion of the projection optical system 217, and the wafer holder system.

At first, in step S101 of FIG. 23, the wafer load arm 228 of FIG. 24(a) is moved to a wafer receiving position which is at a height so as not to mechanically interfere with the wafer unload arm 238. At this time, the illumination system support section 245 is withdrawn. Then, the wafer transport arm 243 (the arm which holds the wafer W) is moved in the +Y direction to the wafer receiving position along the wafer transport mechanism support section 242. After this, in step S102, the vacuum attraction of the wafer transport arm 243 is switched off, and the vacuum attachment of the attraction portions 250A, 250B (refer to FIG. 13) of the wafer load arm 228 is switched on, and the wafer load arm 228 is raised in the Z direction as far as the prealignment position. In this way, the wafer is transferred to the attraction portions 250A, 250B of the wafer load arm 228.

Next in step S103, the illumination system support section 245 is moved to a first measuring position (the condition of FIG. 18) for the bottom surface of the wafer W by means of the illumination system rotation shaft 246, and the illumination light irradiated. This condition is the condition shown in FIG. 24(a). Then, the image signals of the image pickup devices 226L, 226N1, 226R of FIG. 18 are acquired by the R/W loader system control system 215 of FIG. 11. After this, the illumination system support section 245 is again moved to a second measuring position (the condition of FIG. 19) for the bottom face of the wafer W by means of the illumination system rotation shaft 246, and the image signals of the image pickup devices 226R, 226N2, 226U of FIG. 19 are acquired by the R/W loader system control system 215 of FIG. 11.

Continuing on from this in step S104, the R/W loader system control system 215 processes the respective image signals as mentioned before, and computes the positional displacement amount ($\Delta WX, \Delta WY$) referenced on the rotation axis of the rotating/elevating section 225, and the rotation error $\Delta \theta W$ referenced on the notch. Furthermore, in step S105, the R/W loader system control system 215 rotates the wafer load arm 228 by $-\Delta \theta W$ by means of the rotating/elevating section 225 to a standby position, and supplies the positional displacement amount ($\Delta WX, \Delta WY$) of the wafer W to the main control system 205. With this example, the positional displacement amount ($\Delta WX, \Delta WY$) is considered as the offset for when performing the final alignment of the wafer W. However instead of this, for example in FIG. 13, when the wafer stage 222 is moved to the loading position, the position of the wafer stage 222 may be shifted by this positional displacement amount ($\Delta WX, \Delta WY$). After this, in step S106, as shown in FIG. 24(*b*), the illumination system rotation shaft 246 is rotated so that the illumination system support section 245 is withdrawn to thereby complete the prealignment. Then after this, wafer exchange is executed. Moreover, while executing this prealignment, on the wafer stage 222 exposure of the wafer W1 is concurrently executed.

Figure 25:
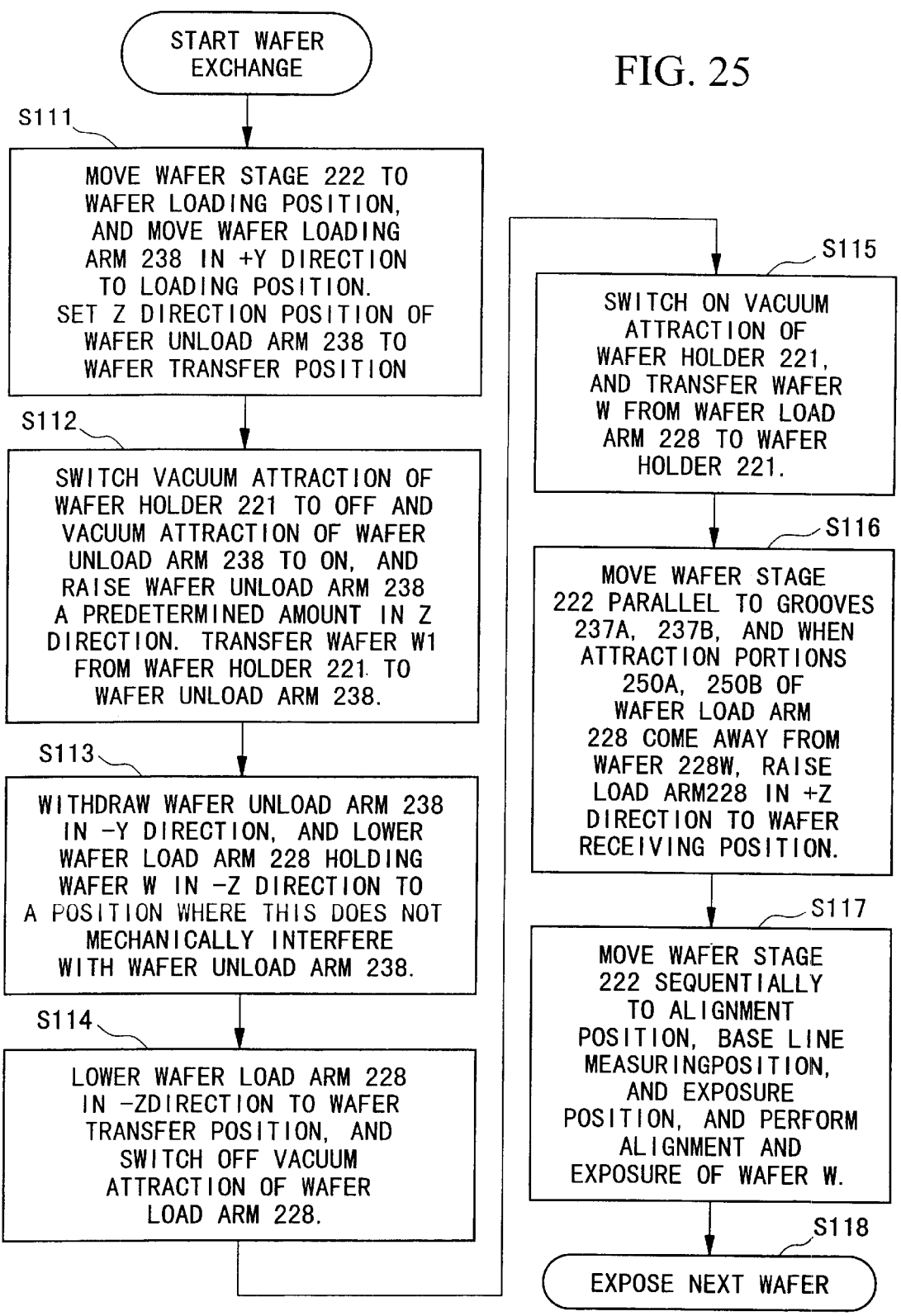
FIG. 25 is a flow chart illustrating operations for the case where wafer exchange, wafer alignment, and exposure of the wafer is performed in an example of an embodiment of the present invention.

Next is a description of an example of wafer exchange, final alignment of the wafer, and the wafer exposure operation, with reference to the flow chart of FIG. 25.

In step S111 of FIG. 25, as shown in FIG. 24(*b*), the wafer stage 222 is moved so that the center of the wafer holder 221 (here this is also referred to as "the center of the wafer stage 222") coincides with the loading position of the wafer. The "loading position" of this example is the point where the plane including the surface of the wafer holder 221, and the central axis (rotation axis) of the rotating/elevating section 225 of the wafer load arm 228 intersect. Hereunder, driving the wafer stage 222 so that the center of the wafer holder 221 is moved to a predetermined point, is referred to simply as driving the wafer stage 222 to this predetermined point. Moreover, as shown in FIG. 24(*b*), before moving the wafer stage 222 as far as the loading position, beforehand, the center of the wafer unload arm 238 reaches to above the loading position along the wafer transport mechanism support section 242, and the Z direction position of the attraction portions 249A, 249B (refer to FIG. 13) of the wafer unload arm 238 is set to a position so as to be accommodated in the grooves 237A, 237B on the wafer stage 222. This position is referred to as "the wafer transfer position". Consequently, by moving the wafer stage 222 as far as the loading position on completion of exposure of the wafer W1, the attraction portions 249A, 249B of the wafer unload arm 238 are inserted beneath the wafer W1. At this time, the wafer load arm 228 is waiting above the wafer unload arm 238 so as to overlap.

Then in step S112, the vacuum attachment of the wafer holder 221 is switched off, and the vacuum attachment of the wafer unload arm 238 is switched on, and the wafer unload arm 238 is raised by a predetermined amount in the Z direction (here as far as a position where the wafer W1 or the attraction portions 249A, 249B of the wafer unload arm 238 do not mechanically interfere with the wafer stage 222 or the wafer holder 221). As a result, the wafer W1 which has been exposed, is transferred from the wafer holder 221 to the wafer unload arm 238. After this, in step S113, as shown in FIG. 24(*c*), concurrent with withdrawing the wafer unload arm 238 in the −Y direction along the wafer transport mechanism support section 242, the wafer load arm 228 is raised in the Z direction as far as a position so as not to mechanically interfere with the wafer unload arm 238 and stood by. This is to avoid contact in the case where there is a deviation in the timing of the movement of the wafer unload arm 238, and to shorten the distance from the wafer load arm 228 to the wafer stage 222 after the wafer unload arm 238 has been withdrawn, to thereby enable a reduction in processing time.

Then, in step S114, as shown in FIG. 24(*d*), the wafer load arm 228 is lowered as far as the wafer transfer position. As a result, the attraction portions 250A, 250B of the wafer load arm 228 in FIG. 13 are accommodated in the grooves 237A, 237B in the wafer stage 222. Here, from immediately before the attraction portions 250A, 250B are accommodated in the grooves 237A, 237B, the vacuum attachment of the wafer load arm 228 is switched off. In the next step S115, the vacuum attachment of the wafer holder 221 is switched on so that the not yet exposed wafer W1 is transferred from the wafer load arm 228 to the wafer holder 221. Concurrent with this operation, in FIG. 24(*d*) the wafer unload arm 238 is moved further in the −Y direction as far as the wafer transport line (not shown in the figure), and the wafer W1 is transferred to this wafer transport line, and the wafer unload arm 238 then returns.

In the next step S116, as shown in FIG. 24(*e*), the wafer stage 222 is moved, and after the wafer load arm 228 has been withdrawn from the bottom face of the wafer W, the wafer load arm 228 is raised. More specifically, as shown in FIG. 13, the wafer stage 222 is moved to the upper left parallel with the grooves 237A, 237B, and when the attraction portions 250A, 250B of the wafer load arm 228 are separated from the rear face of the wafer W, the wafer load arm 228 is raised by the rotating/elevating section 225 as far as a position where the wafer transport arm 243 can receive the wafer being transported in, that is to say as far as the wafer receiving position. Continuing on from this, in step S117, as shown in FIG. 24(*f*), the wafer stage 222 is successively moved to the alignment position, the base line amount measuring position, and the exposure position, and final alignment (fine alignment) of the wafer W and exposure is performed. Concurrent with this, the center of the wafer transport arm 243 on which is mounted the next wafer W2 to be exposed, is moved as far as the center of the wafer load arm 228. Then by raising the wafer load arm 228, the wafer W2 is transferred to the wafer load arm 228. This is the same as the operation for the steps S101, S102 of FIG. 23. At this time, the wafer unload arm 238, as shown in FIG. 24(*a*) is stood by at the wafer transfer position. After this, in step S118, the above operations are repeated to thereby perform exposure for the next wafer.

Next is a description of an example of an alignment and exposure operation for the wafer W of step S117 of FIG. 25, with reference to FIG. 26 through FIG. 29.

Figure 26:
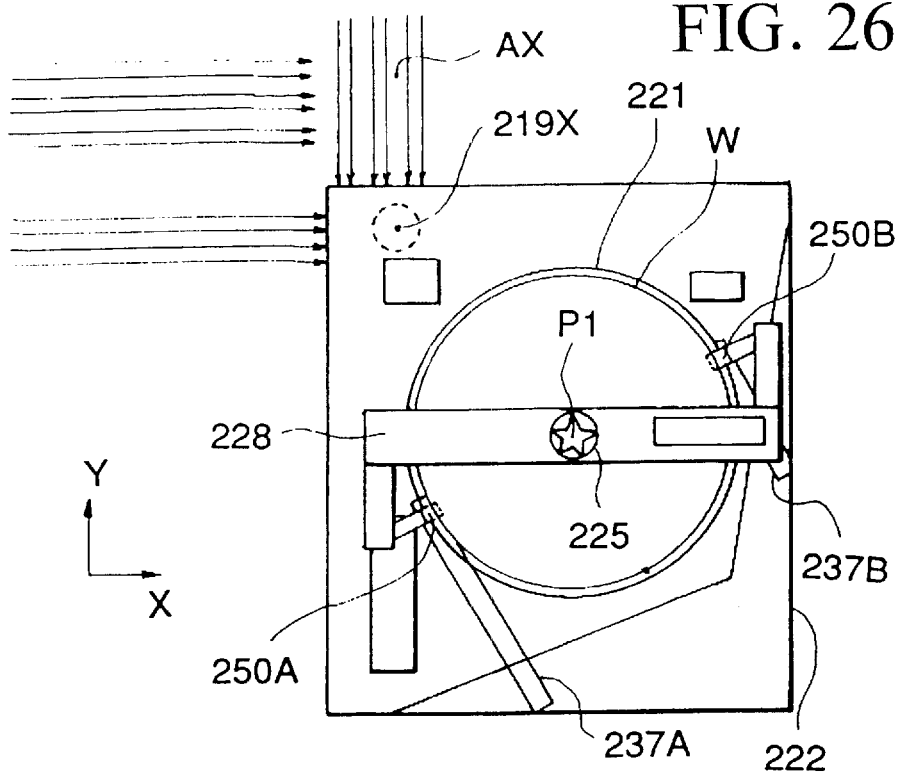
FIG. 26 is a plan view showing a condition where the wafer stage 222 is at a loading position.

At first, FIG. 26 shows the condition where in step S111, the wafer stage 222 is moved to a loading position P1 (denoted by a star sign, and similarly hereunder), that is, the center of the wafer holder 221 has moved to the center line of the rotating/elevating section 225. In FIG. 26, the wafer W is transferred from the wafer load arm 228 to the wafer holder 221. In this condition also the laser beam from the laser interferometer 218 of FIG. 1 irradiates the end portion of the side face of the wafer stage 222 to thereby measure the position of the wafer stage 222 to a high accuracy.

Figure 27:
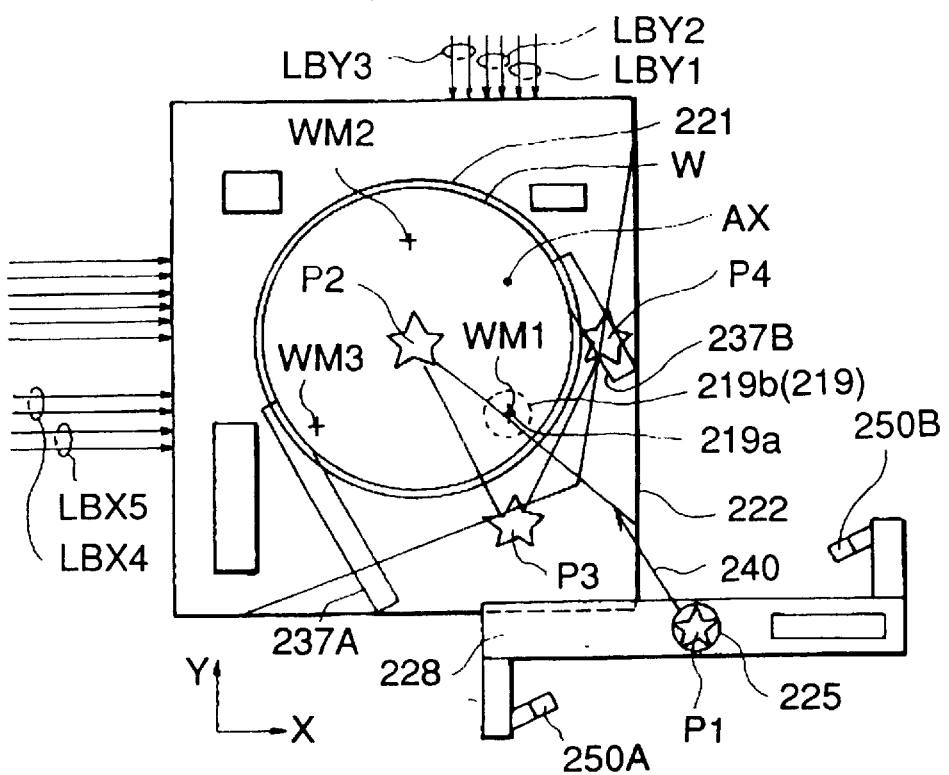
FIG. 27 is a plan view showing a condition where the wafer stage 222 has been moved to an alignment position and alignment is being carried out.

Next, FIG. 27 shows the locus of the wafer stage 222, that is, the locus 240 of the center of the wafer holder 221, for the case where final alignment (fine alignment) of the wafer W is performed. The wafer stage 222 moves to the upper left from the condition of FIG. 26 following the grooves 236A, 237B, and the after the attraction portions 250A, 250B of the wafer load arm 228 come away from beneath the wafer W, moves successively as shown by the locus 240 to three alignment positions P2, P3, P4. With this example, wafer marks for fine alignment in two dimensions are respectively affixed to all of the shot regions on the wafer W. Coordinates (X, Y) of wafer marks WM1, WM2, WM3 for three shot regions (sample shots) which are not in the same straight line and which have been selected beforehand from the respective shot regions, are measured using the alignment sensor 219 of FIG. 1. The measurement results of these are then processed to compute the array coordinates of all of the shot regions on the wafer W. For this, an EGA (enhanced global alignment) alignment method can be considered, where the number of sample shots to be measured is a minimum of three. This method is called a three point EGA method. Here the number of sample shots may be set at more than three (for example eight). Since the EGA alignment method is disclosed in Japanese Unexamined Patent Application, First Publication No. 61-44429, detailed description is omitted.

Then, the first alignment position P2 is determined by correcting the shot array for the design of the wafer W, with the results of the prealignment steps of FIG. 23. That is to say, the array coordinates obtained by adding the positional displacement amounts ($\Delta$WX, $\Delta$WY) of the center of the wafer W obtained in step S105 of FIG. 23, as an offset to the array coordinates for the design of each shot region on the wafer W (here these are assumed to be the same as the array coordinates for the corresponding wafer marks), are made the array coordinates (SX1, SY1) for after the first offset correction. Then, from these array coordinates of the wafer mark WM1 for after the first offset correction, the position of the wafer stage 222 is obtained in order to make the wafer mark WM1 correspond to the detection center 219a inside the detection field 219b of the alignment sensor 219. This position is then made the first alignment position P2. As a result, when the wafer stage 222 reaches the first alignment position P2, the wafer mark WM1 on the wafer W is accommodated inside the observation field 219a. Therefore, with this example, the search alignment step for obtaining the general shot array on the wafer becomes unnecessary. This is possible because the prealignment accuracy of this example is high.

Then, at the time of measuring the coordinates XM1, YM1 of the wafer mark WM1 via the alignment sensor 219, the positional displacement amounts ($\Delta$EX1, $\Delta$EY1) in the X direction and Y direction with respect to the detection center 219a of the wafer mark WM1 is obtained, and the array coordinates (SX1, SY1) for after the abovementioned first offset correction are further corrected by the positional displacement amounts ($\Delta$EX1, $\Delta$EY1), to obtain the array coordinates (SX2, SX2) for after a second offset correction. Furthermore, the X coordinates of the wafer stage 222 for the alignment positions P2–P4 are measured using the laser beams LBX4, LBX5 so that Abbe error does not occur. Then, after moving the wafer stage 222 so as to correct the positional displacement amount ($\Delta$EX1, $\Delta$EY1), the coordinates (XM1', YM1') of the wafer mark WM1 are again measured via the alignment sensor 219. This is because at the peripheral portion of the observation field 219b for the image processing method, there is the possibility that the position detection accuracy will drop due to aberrations of the imaging system. Therefore, this is to make the mark to be detected as close as possible to the detection center 219a in order to improve the detection accuracy. Consequently, in the case where the aberrations of the imaging system are very small even at the peripheral portion, or in the case where strict overlap accuracy is not particularly required, then it is not necessary to re-measure the position of the wafer mark WM1.

Next, in FIG. 27, the wafer stage 222 is moved to the second alignment position P3, and the coordinates (XM2, YM2) of the wafer mark WM2 are measured via the alignment sensor 219. This alignment position P3 is the position of the wafer stage 222 determined in order to align the wafer mark WM2 with the detection center 219a of the alignment sensor 219, based on the array coordinates of the wafer mark WM2 on the array coordinates (SX2, SX2) after the abovementioned second alignment correction. In this case, with the present example, the inclination angle $\Theta$ of the straight line joining the coordinates (XM1', YM1') of the wafer mark WM1 and the coordinates (XM2, YM2) of the wafer mark WM2 with respect to the straight line joining the two marks WM1, WM2 for design is obtained. The array coordinates (SX2, SX2) for after the second offset correction are then rotated about the wafer mark WM1 by this inclination angle $\Theta$, and array coordinates (SX3, SX3) for after a third offset and rotation correction are obtained.

Moreover, here also the position of the wafer stage 222 is finely adjusted so that the position where the wafer W has been rotated by the inclination angle $\Theta$ becomes the detection center 219a of the alignment sensor 219, and again the coordinates (XM2', YM2') of the second wafer mark are measured. After this, the wafer stage 222 is moved to a third alignment position P4 based on the third offset, and the array coordinates (SX3, SX3) for after rotation angle correction, and the coordinates (XM3, YM3) of the wafer mark WM3 are measured via the alignment sensor 219. Then, from the measurement values for the coordinates of the three wafer marks WM1, WM2, WM3, six conversion parameters for the shot array on the wafer W comprising; X direction and Y direction scaling, rotation, orthogonality error, and positional displacement in the X direction and Y direction are determined. Using these conversion parameters, the shot array for the design on the wafer W is converted, and the array coordinates for all of the shot regions on the wafer W are computed. Here, the fine alignment of the wafer W is completed.

Figure 28:
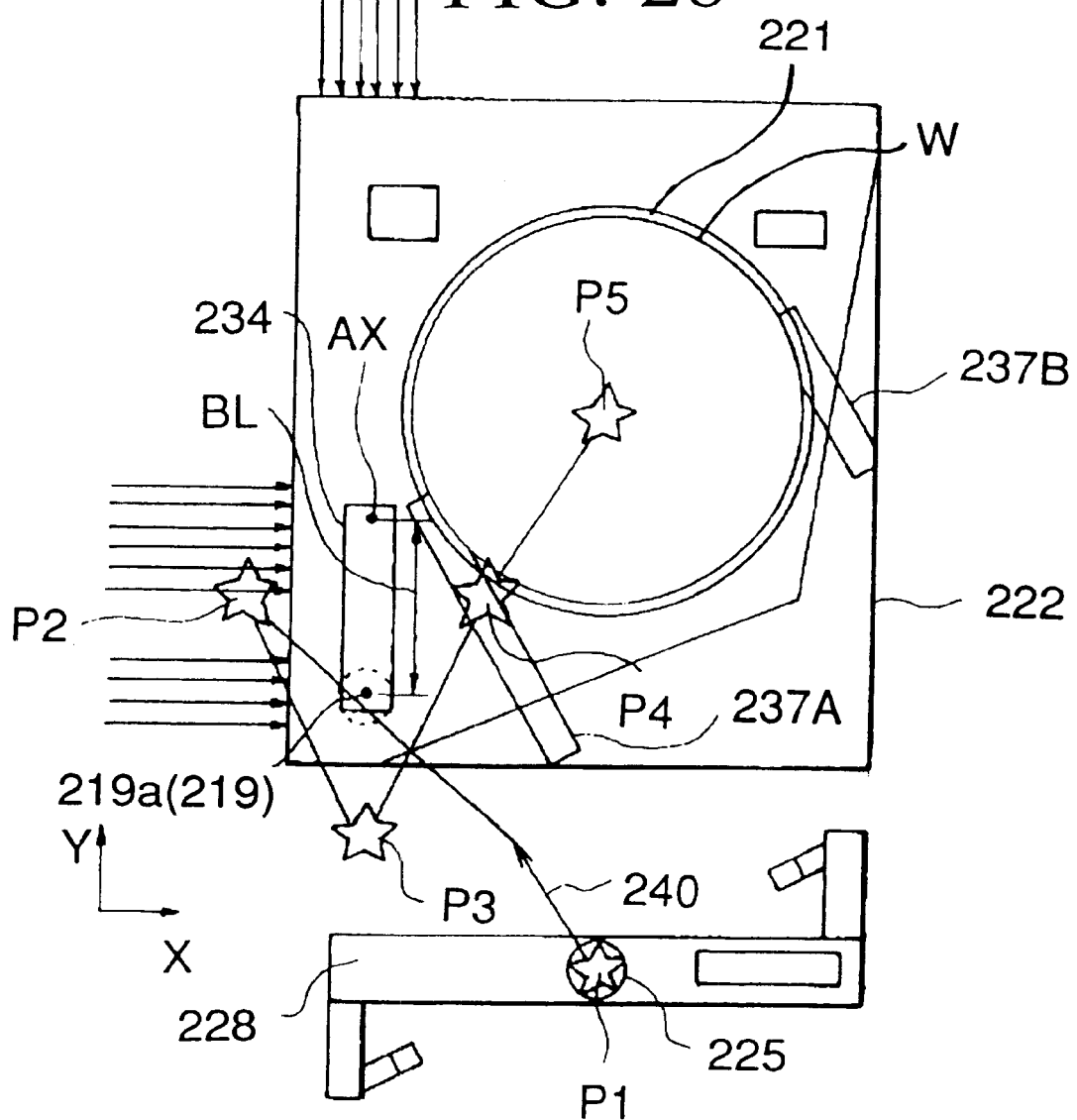
FIG. 28 is a plan view showing a condition where the wafer 222 has been moved to a base line value measuring position and measurement of the base line value is being carried out.

Next, as shown in FIG. 28, the wafer stage 222 is moved to a base line amount measuring position P5. At the base line amount measuring position P5, the reference plate 234 on the wafer stage 222 approximately overlaps the optical axis AX of the projection optical system 217 and the detection center 219a of the alignment sensor 219. In this condition, the positional displacement amount of the reference mark corresponding to the alignment mark on the reticle R1 of FIG. 11 is measured, and the positional displacement amount of the reference mark corresponding to the detection center 219a of the alignment sensor 219 is measured, and these positional displacement amounts are added to the spacing of the respective reference marks. As a result, the base line amount BL, being the spacing between the center (here coinciding with the optical axis AX) of the pattern image of the reticle R1, and the detection center 219a of the alignment sensor 219, is measured to a high accuracy. After this, the array coordinates for the shot region on the wafer W obtained in FIG. 27 can be superimposed at a high accuracy on the pattern image of the reticle R1 for each shot region, by driving the wafer stage 222 based on the coordinates which have been corrected by this base line amount.

Figure 29:
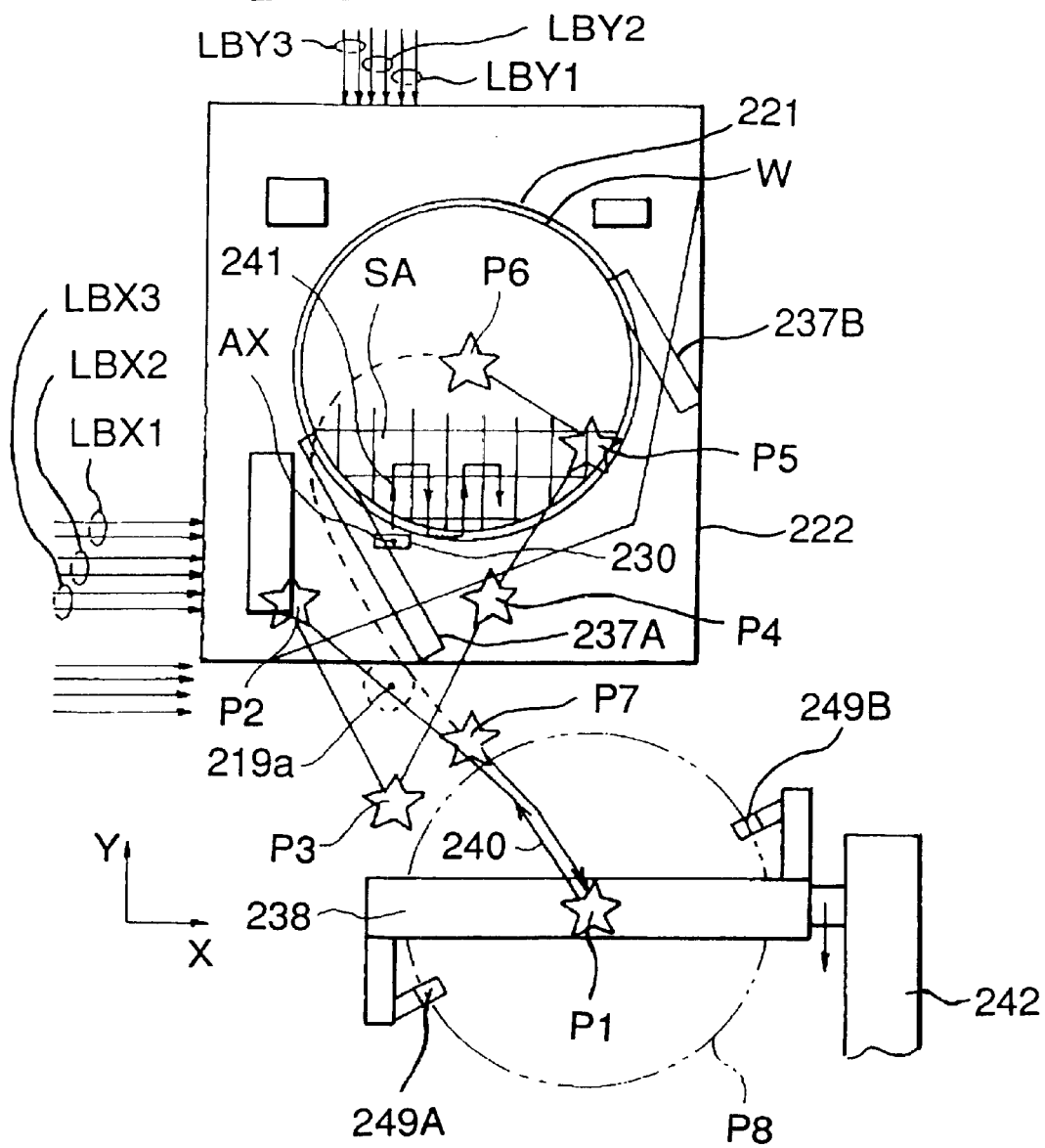
FIG. 29 is a plan view showing operation of the wafer stage 222 in the case of performing exposure of the wafer.

Consequently, as shown in FIG. 29, the wafer stage 222 is moved to an exposure start position P6, and scanning exposure for each shot region SA on the wafer W is commenced. That is to say, so that Abbe error with respect to the exposure region 230 due to the projection optical system 217 does not occur, the X coordinate of the wafer stage 222 is measured using the laser beams LBX1~LBX3, and the wafer stage 222 is driven so as to scan each shot region SA, with the exposure region 230 meandering as shown by the locus 241. After this, on completion of exposure of all of the shot regions, the wafer stage 222 reaches an exposure completion position P7. Then, as shown by the locus 240, so that the wafer stage 222 in the vicinity of the loading position P1 moves parallel with the grooves 237A, 237B, the wafer stage 222 is moved as far as the loading position P1. At this time, since the wafer unload arm 238 is already standing by beforehand at the loading position P1, then the wafer W can be transferred as is, to the wafer unload arm 238.

With the abovementioned embodiment, as shown in FIG. 15 and FIG. 16, the prealignment for the wafer to be exposed is executed for the wafer load arm 228 at the bottom end of the rotating/elevating section 225 which is attached to the wafer prealignment drive section 224 secured to the support member 248 for supporting the projection optical system 217. In order to transfer the wafer to the wafer holder 221 on the wafer stage 222 while being held in this wafer position, the positioning accuracy for when the wafer is transported with respect to the wafer holder 221 is improved from heretofore. Therefore, the search alignment can be omitted, and the time required for overall alignment reduced, thereby improving throughput of the exposure step.

Moreover, since the construction is such that the height of the wafer load arm 228 and the height of the wafer unload arm 238 when carrying out prealignment are made different in the Z direction so that during the exposure operation, prealignment can be made concurrently, then throughput is further improved. Moreover, with this example, since the withdrawal of the illumination system support section 245 is performed by rotating the illumination system rotation shaft 246, there is also the effect that the occurrence of foreign matter in the region through which the wafer passes is suppressed.

Here, it is assumed that the projection optical system 217 of the abovementioned embodiment is a refraction system. However in the case where for example ArF (wave length 193 nm) excimer laser radiation is used as the exposure light, since materials having a good transmissivity are few, then a catadioptric system is used as the projection optical system 217. In this case also, the present invention can be applied. Moreover, the present invention can also be applied to wafer holder systems of exposure apparatus (for example scanning exposure types) which use extreme ultraviolet light (EUVL, or XVL) of wave lengths less than around 100 nm for the exposure beam, or two wafer holder systems for electron beam image devices which do not use a mask. Since with extreme ultraviolet light it is preferable to have a vacuum light path, then instead of holding the substrate such as the reticle or wafer using a vacuum attachment in the abovementioned embodiment, it is necessary to adopt a method where the substrate is held with a 3-point type mounting where flatness is set stringently, or where the substrate is held with electrostatic attraction.

Furthermore, for the alignment sensor 219, instead of the image processing method, a method such as a laser step alignment (LSA) method or a 2-beam interference method (LIA method) may be used. The above embodiment has been described for a step-and-scan type (scanning exposure type) projection exposure apparatus. However the present invention may also be applied to a projection exposure apparatus of a one-shot exposure type such as a stepper, or to a proximity type exposure type apparatus which does not use a projection optical system. Furthermore, the present invention may also be applied to a wafer stage of an electron beam exposure apparatus. In this way, the present invention is not limited to the above embodiments and may take various aspects within the scope of the claims, which do not depart from the gist of the present invention.

Hereunder is a description of another embodiment of the present invention, based on FIG. 30 through FIG. 46.

Figure 30:
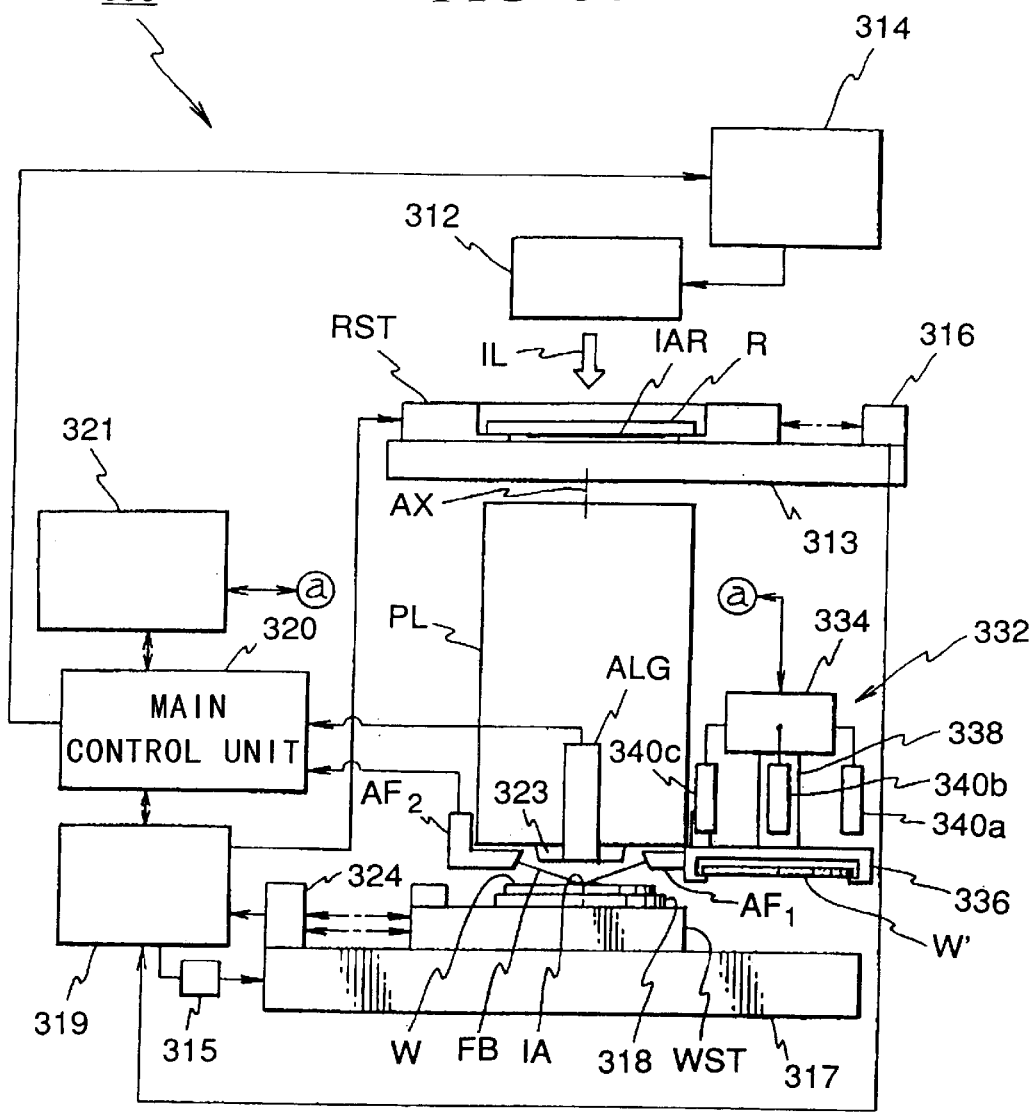
FIG. 30 is a diagram schematically showing the overall construction of an exposure apparatus of another embodiment of the present invention.

FIG. 30 shows the structure of an exposure apparatus 300 which includes a substrate transport apparatus according to one embodiment. This exposure apparatus 300 is step-and-scan system scanning type projection exposure apparatus (a so called scanning stepper).

The exposure apparatus 300 comprises an illumination system 312 including an exposure light source, a reticle stage RST for holding a reticle R serving as a mask, a projection optical system PL, a wafer stage WST serving as a stage for mounting a wafer W serving as a substrate, and a control system for these.

The illumination system 312 comprises an exposure light source and an illumination optical system (both omitted from the figure). The illumination optical system includes; an illumination homogenizing optical system comprising optical elements such as a collimator lens and a fly-eye lens or load type integrator, a relay lens, a variable ND filter, a reticle blind, and a relay lens.

Here is a description of the various structural parts of the illumination system, and their operation. Illumination light IL generated from the exposure light source is converted to a light beam having a predetermined illumination where the illumination distribution is approximately uniform, by means of the illumination homogenizing optical system and the variable ND filter which controls the illumination. For the illumination light IL, for example excimer laser radiation such as KrF excimer laser radiation, ArF excimer laser radiation, or $F_2$ excimer laser radiation (wave length 157 nm), or the higher harmonics of a copper vapor laser or YAG laser, or the emission line (g line, i line etc.) of the ultraviolet region from a super voltage mercury lamp is used.

The light beam emitted from the illumination homogenizing optical system reaches the reticle blind via the relay lens. The relay lens is arranged at a plane which is optically conjugate with the pattern forming plane of the reticle R and the exposure plane of the wafer W.

With the reticle blind, several moveable shield plates (for example two L-shape moveable shield plates) are opened and closed for example by means of a motor, to thereby adjust the size of the opening (slit width.), thereby enabling an illumination area IAR (refer to FIG. 33) of a slit shape for illuminating the reticle R, to be set to an optional shape and size.

Here, the respective drive sections inside the illumination system, that is for the variable ND filter, the reticle blind and the like, are controlled by an illumination control device (exposure controller) according to instructions from a main control unit 320.

The reticle stage RST is arranged on a reticle base plate 313, with the reticle R being secured to the upper face thereof for example by vacuum attachment. The reticle stage RST can be driven minutely two dimensionally (in the X direction, the Y direction orthogonal to this, and in a rotation direction about a Z axis orthogonal to the XY plane) within a plane perpendicular to the optical axis of the illumination optical system (corresponding to an optical axis AX of the later described projection optical system PL) in order to align the reticle R. This drive is achieved by means of a reticle stage drive section (not shown in the figure) comprising a magnetic levitation type two dimensional linear actuator. Moreover, the reticle stage RST may be driven at a specified scanning speed in a predetermined scanning direction (here the Y direction). The reticle stage RST has a Y direction drive stroke so that the whole face of the reticle R can at least cross the optical axis of the illumination optical system.

Mirror surface processing is performed on the side face of the reticle stage RST, to thereby form a reflection face for reflecting an interferometer beam from a reticle laser interferometer (hereunder referred to as "reticle interferometer") 316. In the reticle interferometer 316, the light returning from the reflection face, and the light returning from a reference section (not shown in the figure) are made to interfere, and based on a photoelectric conversion signal for the interference light, the position of the reticle stage RST within a stage movement plane is continuously detected, for example at a resolution of around 0.5~1 nm. The length measurement axis for the reticle interferometer 316 is actually two axes in the scanning direction and one axis in the non scanning direction.

The position information for the reticle stage RST from the reticle interferometer 316 is sent to a stage control unit 319, and then via this to the main control unit 320. The stage control unit 319, in accordance with instructions from the main control unit 320 drives the reticle stage RST via a reticle stage drive section (omitted from the figure) based on the position information for the reticle stage RST.

Here, by merely measuring the position of the reflection face with the reticle interferometer 316, the position of the reticle R can be controlled to a sufficiently high accuracy for determining the initial position for the reticle stage RST, so that the reticle R can be positioned at good accuracy at a predetermined reference position using a TTR reticle alignment system (not shown in the figure).

The projection optical system PL is arranged beneath the reticle stage RST in FIG. 30. However actually this is held in a main body column (not shown in the figure) via a holding member 322 (not shown in FIG. 30, refer to FIG. 32) referred to as a first Invar. The direction of the optical axis AX (coinciding with the optical axis of the illumination optical system) of the projection optical system PL is in the Z direction. Here, a dioptric system comprising a plurality of lens elements arranged at a predetermined spacing along the direction of the optical axis AX so as to constitute a double sided telecentric optical arrangement is used. A small diameter protruding portion 323 is formed beneath (on the wafer side) of a body tube of the projection optical system PL. Furthermore, the projection optical system PL is a reducing optical system having a predetermined projection magnification (for example ⅕ (or ¼).

Therefore, when the illumination area IAR of the reticle R is illuminated by the illumination light IL from the illumination system 312, a reduced image (partial inverted image) of a circuit pattern on the reticle R in the illumination area IAR portion is formed via the projection optical system PL by means of the illumination light IL which has passed through the reticle R, on the wafer W having a resist (photo sensitive material) applied to the surface thereof.

The wafer stage WST is arranged on a wafer base plate 317 which is arranged beneath the projection optical system PL in FIG. 30, and a wafer holder 318 serving as a substrate holding member is mounted on the wafer stage WST. A 12 inch diameter wafer W is vacuum attached on the wafer holder 318. The wafer holder 318 is constructed so as to be able to be tilted in an optional direction with respect to the best imaging face of the projection optical system PL, and so as to be minutely moveable in the direction of the optical axis AX (Z direction) of the projection optical system PL, by means of a drive section (not shown in the figure). Moreover, the wafer holder 318 can also be rotated around the Z axis.

With the wafer stage WST, the construction is such that not only is this moved in the scanning direction (Y direction), but this is also moveable in the non scanning direction (X direction) perpendicular to the scanning direction so that the plurality of shot regions on the wafer W can be positioned at an exposure area IA (refer to FIG. 33) which is conjugate with the illumination area IAR. The wafer stage WST performs a step-and-scan operation which repeats an operation for scanning illuminating each shot region on the wafer W as described later, and an operation for moving to a scanning start position for exposure of the next shot.

The wafer stage WST is here driven in the two dimensional plane of the X axis and the Y axis by means of a wafer drive unit 315 serving as a stage drive unit, comprising a magnetic levitation type two dimensional linear actuator. Here while the wafer drive unit 315 comprises the above-mentioned two dimensional linear actuator, in FIG. 30, for convenience of illustration, this is shown as a block.

Figure 31:
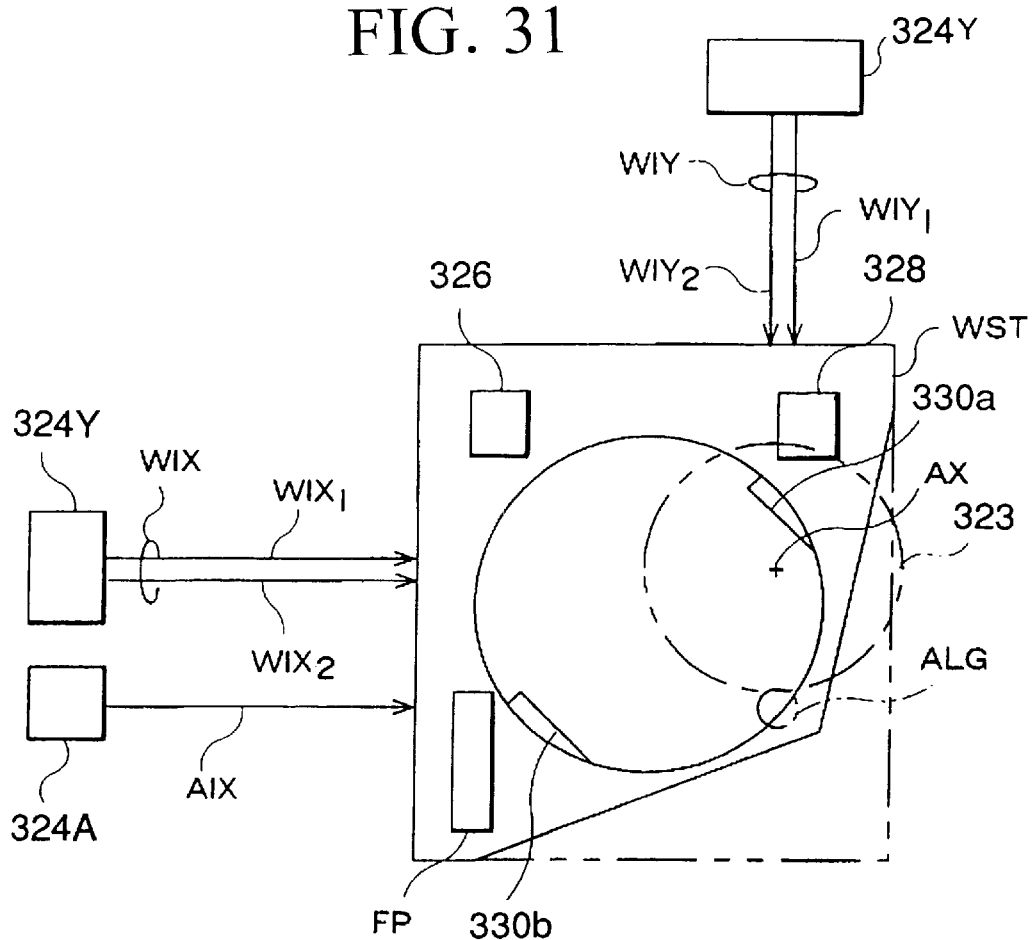
FIG. 31 is a plan view showing a wafer stage of FIG. 30.

FIG. 31 shows a plan view of the wafer stage WST. As shown in FIG. 31, the wafer stage WST is a hexagon shape with the part of the rectangular shape shown by the imaginary line removed. Mirror surface processing is respectively performed on one Y direction side face (+Y direction) and one X direction side face (−X direction) to thereby form reflection faces for respectively reflecting an interferometer beam WIY from a Y axis laser interferometer 324Y, and an interferometer beam WIX from an X axis laser interferometer 324X. In this case, an interferometer beam AIX from an alignment laser interferometer 324A is also projected onto the reflection surface on one X direction side.

The interferometer beam WIY includes a Y direction first length measurement axis WIY1 and second length measurement axis WIY2 centered on the protruding portion 323 of the projection optical system PL, that is to say passing through X positions separated equidistant in the X direction from the optical axis AX. Moreover, this includes a third length measurement axis (not shown in FIG. 30) passing downward in the Z direction through one of these. Each of the first length measurement axis WIY1 and the second length measurement axis WIY2 are actually so called double pass type light beams. Similarly, the length measurement beam WIX includes an X direction fourth length measurement axis WIX1 and fifth length measurement axis WIX2 passing through Y positions separated equidistant in the Y direction from the optical axis AX. Moreover, this includes a sixth length measurement axis passing downward in the Z direction through one of these. Each of the fourth length measurement axis WIX1 and the fifth length measurement axis WIX2 are: actually so called double pass type light beams. Moreover, the length measuring beam AIX is an X direction light beam (double pass type light beam) passing through the detection center of an alignment microscope ALG as mentioned later.

With the interferometers 324X, 324Y, 324A, for each of the measuring axes, the light returning from the reflection face, and the light returning from a reference section (not shown in the figure) are made to interfere, and based on a photoelectric conversion signal for the interference light, the position of the wafer stage WST within a stage movement plane is continuously detected, for example at a resolution of around 0.5~1 nm.

The measurement values for each length measurement axis of the interferometers 324X, 324Y, 324A are sent to the stage control unit 319 of FIG. 30, and then via this to the main control unit 320. Then in the stage control unit 319, the position of the wafer stage WST is computed in the following manner.

That is to say, the stage control unit 319 obtains the Y position of the wafer stage WST based on the mean value (Y1+Y2)/2 of measurement values Y1, Y2 of the first length measurement axis WIY1 and the second length measurement axis WIY2 of the Y axis laser interferometer 324Y. Moreover the stage control unit 319 obtains the X position of the wafer stage WST based on the mean value (X1+X2)/2 of measurement values X1, X2 of the fourth length measurement axis WIX1 and the fifth length measurement axis WIX2 of the X axis laser interferometer 324X. Furthermore, the stage control unit 319 obtains the θ rotation (yaw amount) of the wafer stage WST using at least one of the difference (Y1−Y2) of the measurement values Y1, Y2, and the difference (X1−X2). Moreover, the stage control unit 319 obtains the rotation amount (pitch amount) of the wafer stage WST about the X axis based on the difference between the measurement value of the first length measurement axis WIY1 (or the second length measurement axis WIY2) and the measurement value of the third length measurement axis. Furthermore, the stage control unit 319 obtains the rotation amount of the wafer stage WST about the Y axis (yaw amount) based on the difference between the measurement value of the fourth length measurement axis WIX1 (or the fifth length measurement axis WIX2) and the measurement value of the sixth length measurement axis.

Furthermore, at the time of a later described alignment, the stage control unit 319 computes the X position of the wafer stage WST based on the measurement value from the alignment laser interferometer 324A. That is to say, with the present embodiment, at the time of either exposure or alignment, the X, Y position of the wafer stage WST can be obtained without the so called Abbe error.

The stage control unit 319 controls the wafer stage WST in accordance with instructions from the main control unit 320 so as to move to an optional position based on the position of the wafer stage WST obtained in the above manner. Here as the interferometer for measuring the position of the wafer stage WST, as above, three interferometers namely the interferometer 324Y, the interferometer 324X and the interferometer 324A are provided. However in FIG. 30, these are shown representatively as the wafer laser interferometer 324.

Figure 33:
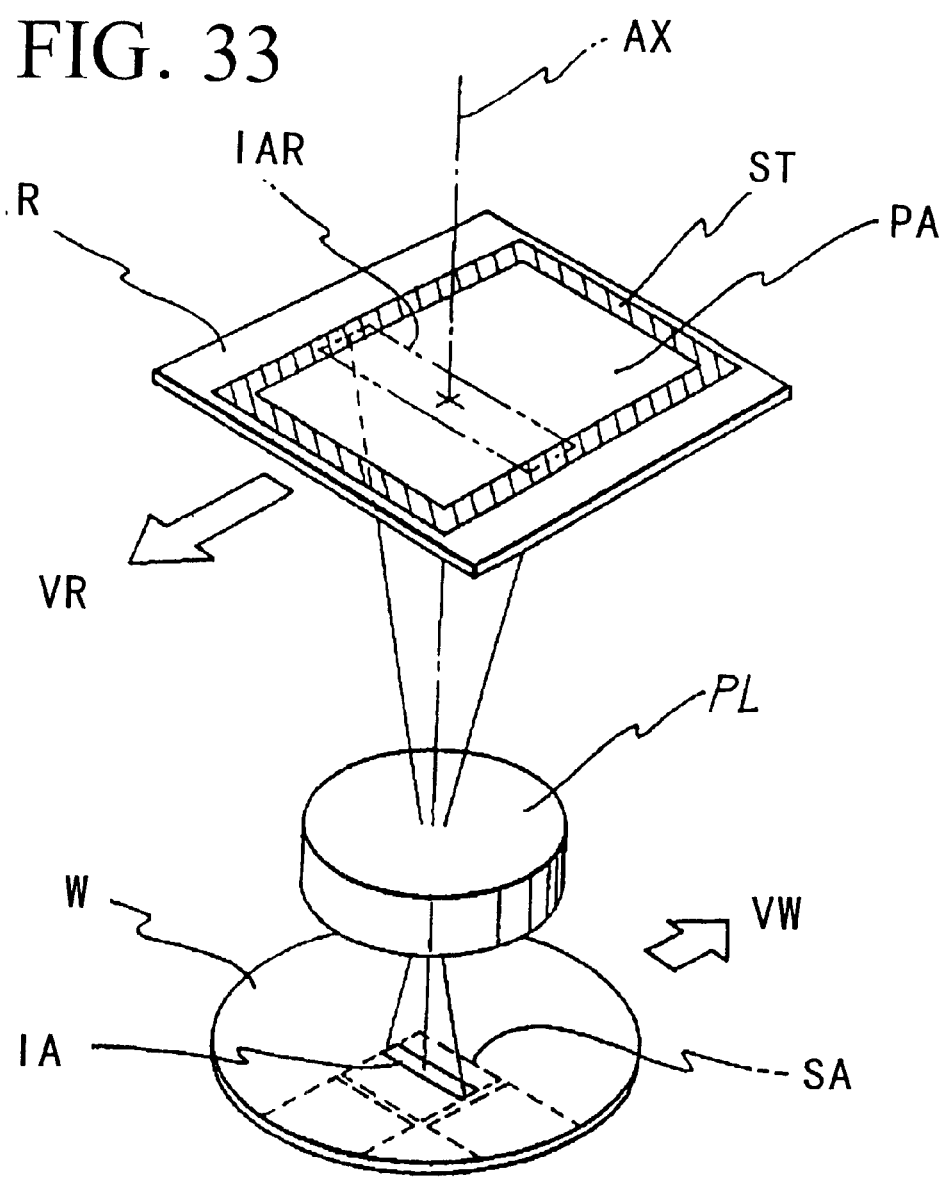
FIG. 33 is a diagram for explaining a theory of scanning exposure of FIG. 30.

The theory of scanning exposure in the exposure apparatus 300 is now briefly described based on FIG. 33.

The reticle R is illuminated with an illumination area IAR of a rectangular shape (slit shape) having a longitudinal direction in a direction perpendicular to the scanning direction (Y direction) of the reticle R, and is scanned in the −Y direction at a velocity $V_R$ at the time of exposing the reticle R. The illumination area IAR (with the center approximately coinciding with the optical axis AX) is projected onto the wafer W via the projection optical system PL, so that a slit shape projection area, that is to say an exposure area IA is formed. Since the wafer W has an inverted image forming relation with the reticle R, the wafer W is synchronized with the reticle R with the direction of the velocity $V_R$ in the opposite direction (+Y direction) and is scanned at a velocity Vw, so that the whole surface of a shot area on the wafer W can be exposed. The scanning speed ratio VW/VR is made accurately proportional to the reduction magnification of the projection optical system PL, so that the pattern of a pattern area PA of the reticle R is accurately reduction transferred onto the shot area SA on the wafer W. The width in the longitudinal direction of the illumination area IAR is set so as to be wider than width in the non scanning direction of the pattern area PA on the reticle R, and narrower than the maximum width of a light stop area ST, so that the whole surface of the pattern area can be illuminated by scanning.

Here the operation of the various parts such as the illumination system 312, the reticle stage RST, and the wafer stage WST at the time of the abovementioned scanning exposure, is managed by the main control unit 320 via an illumination control unit 314 and the stage control unit 319.

Furthermore, with the exposure apparatus 300 of this embodiment, an off-axis type alignment microscope, for example an imaging type alignment sensor ALG of an image processing system, is provided on the side face of the projection optical system PL as shown in FIG. 30, as a mark detection system for detecting the position of alignment marks (wafer marks) attached to each shot region on the wafer W. The measurement results from the alignment sensor ALG are supplied to the main control unit 320. Here the alignment sensor ALG is actually arranged as shown in FIG. 32, and is held in a holding member 322 so that the detection portion is positioned on the other side in the Y direction (−Y direction) of the protruding portion 323 of the projection optical system PL.

Moreover, with the exposure apparatus 300, an oblique incident type multi-point focal position detection system AF is secured to the holding member 322 (refer to FIG. 32) for supporting the projection optical system PL. This comprises; an illumination optical system AF1 for supplying an imaging light beam (detection beam FB) for forming a plurality of slit images facing the best image formation plane of the projection optical system PL in an oblique direction with respect to the direction of the optical axis AX, and a reception optical system AF2 for receiving via the respective slits, each light beam of the imaging light beams reflected at the surface of the wafer W. For this multi-point focal position detection system AF (AF1, AF2) a device of the same construction as that disclosed for example in Japanese Unexamined Patent Application, First Publication No. 5-190423 is used. This is used for detecting the positional displacement in the Z direction with respect to the image plane of the multiple points on the wafer surface, and driving the wafer holder 318 in the Z direction and the incline direction so as to hold the wafer and the projection optical system PL at a predetermined spacing. The wafer position information from the multi-point focal position detection system AF is sent to the stage control unit 319 via the main control unit 320. The stage control unit 319 then drives the wafer holder 318 in the Z direction and the incline direction based on this wafer position information.

Figure 32:
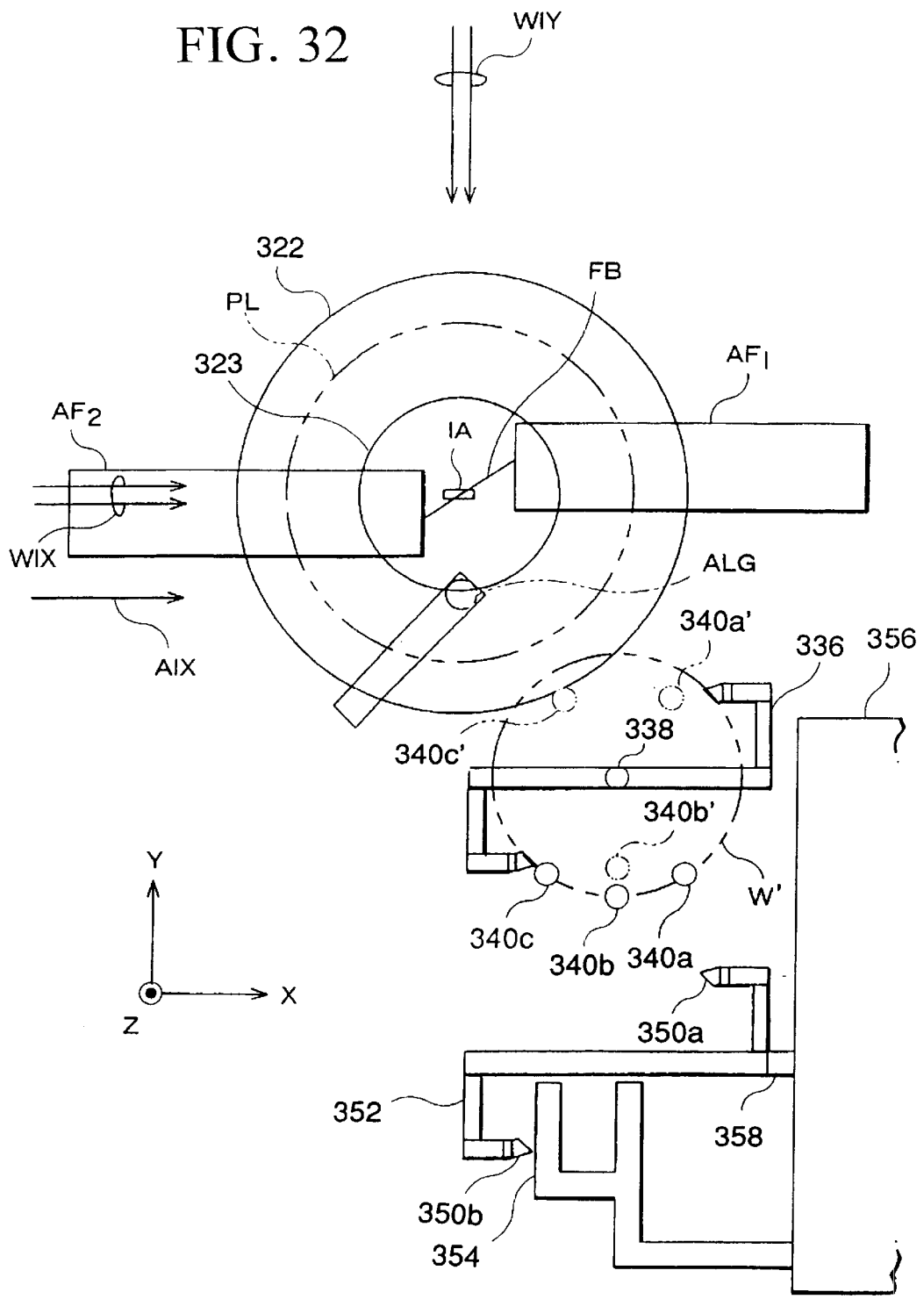
FIG. 32 is a plan view showing an arrangement of structural components in the vicinity of a projection optical system constituting the apparatus of FIG. 30, and the structural components of a wafer transport system.

The illumination optical system AF1 and the reception optical system AF2 are actually arranged as shown in FIG. 32 so that the detection beam FB irradiates the wafer surface from a 45 degree inclined direction with respect to the X direction and Y direction. However, in FIG. 30, for convenience of drawing, the illumination optical system AF1 and the reception optical system AF2 are shown arranged at opposite ends in the X direction of the projection optical system PL.

Above the wafer stage WST, as shown in FIG. 31 there is provided a reference plate FP on which is formed reference marks other than the base line measurement reference mark, for measuring the relative positional relationship between the position of the detection center of the alignment sensor ALG and the position of the projection image of the reticle pattern. Moreover there is provided an AIS reference plate 326 containing a sensor for measuring the displacement of the wafer surface from the conjugate position with respect to the reticle pattern surface, and various aberrations of the image quality of the reticle pattern. Furthermore, there is provided an illuminance non uniformity sensor 328 for measuring the illuminance non uniformity inside the exposure area IA.

Furthermore, on the upper face (wafer mounting face) side of the wafer holder 318 of the wafer stage WST, as shown in FIG. 31 there is formed a pair of predetermined depth cutouts 330a, 330b extending in a direction inclined approximately 45 degrees to the X axis and the Y axis. This pair of cutouts 330a, 330b are for inserting prongs of a later described load arm and unload arm.

Returning to FIG. 30, the exposure apparatus 300 further comprises a wafer prealignment unit 332 arranged at a wafer transfer position. The wafer prealignment unit 332 comprises a prealignment unit main body 334, an elevating/rotating mechanism 338 provided beneath the prealignment unit main body 334 serving as a relative movement mechanism for supporting the wafer load arm (hereunder referred to as the "load arm") 336 and rotating and moving this vertically, and three CCD cameras 340a, 340b, 340c serving as a measuring devices arranged above the load arm 336. Inside the prealignment unit main body 334 is housed a control unit containing systems such as an image processing system for processing image signals from the CCD cameras 340a, 340b, 340c, and a control system for the elevating/rotating mechanism 338.

The CCD cameras 340a, 340b, 340c are for respectively detecting the outer rim of the wafer W held in the load arm 336. The CCD cameras 340a, 340b, 340c, here as shown in plan view in FIG. 32, are arranged at positions where they are able to image the outer rim including the notch of the 12 inch wafer (hereunder referred to suitably as wafer W') held in the load arm 336. Of these, the central CCD camera 340b is for detecting the notch.

The wafer prealignment unit 332 is controlled by a wafer loader control unit 321 of FIG. 30, and the outer rim (external shape) of the wafer W is detected by the three CCD cameras 340a, 340b, 340c. Then, the image signal from the CCD cameras 340a, 340b, 340c is processed by the control unit housed in the prealignment unit main body 334, and the X, Y, θ error of the wafer W' is obtained by the wafer loader control unit 321 based on the signal from this control unit. Then, the wafer loader control unit 321 controls the elevating/rotating mechanism 338 so as to correct the θ error of these.

In the case where an 8 inch wafer is used, instead of the CCD cameras 340a, 340b, 340c, CCD cameras 340a', 340b', 340c', as shown by the imaginary line (two-dot chain line) in FIG. 32 are used. With a dual purpose 8 inch/12 inch loader, the CCD cameras 340a, 340b, 340c and the CCD cameras 340a', 340b', 340c', are simultaneously arranged.

Moreover, the position of the notch of the wafer W' is the position of the CCD camera 340b. Consequently, this direction is the −Y direction (the 6 o'clock direction) as seen from the center of the wafer W'. However there is also the case where the wafer W' is mounted on the wafer holder 318 in a condition turned 90 degrees from this condition, that is to say, the condition where the notch comes to the −X direction (the 3 o'clock direction) as seen from the center of the wafer W'. In this case, for example as disclosed in Japanese Unexamined Patent Application, First Publication No. 9-36202, the CCD camera may be arranged at positions corresponding to the two directions, namely the 3 o'clock direction and the 6 o'clock direction. Alternatively, after the external shape is detected using the CCD cameras 340a, 340b, 340c, the wafer may be turned through 90 degrees using the elevating/rotating mechanism 338 of the wafer prealignment unit 332. Here this processing method and the optical arrangement and wafer XYθ error computation method are known. Since this is substantially the same as the method disclosed for example in Japanese Unexamined Patent Application, First Publication No. 9-36202, here detailed described is omitted.

Here, the X, Y error obtained based on the wafer outer shape measurement by the wafer prealignment unit 332 is sent to the main control unit 320 via the wafer loader control unit 321. Then by means of the main control unit 320, for example at the time of a later described wafer search alignment operation, correction is made by adding the X, Y error portion offset.

FIG. 34 through FIG. 36 show momentary aspects for where the wafer W' held on the load arm 336 is transferred to the wafer holder 318. Of these, FIG. 34 is a plan view showing the wafer W' with part broken off, FIG. 35 is a front elevation view, and FIG. 36 is a left side elevation view.

As shown by these figures, the load arm 336 comprises the following members. A first horizontal member 342 attached horizontally beneath the elevating/rotating mechanism 338. A pair of inclined members 344a, 344b each with one end thereof respectively attached to a face on one side and the other side in a direction orthogonal to the longitudinal direction of the first horizontal member 342, and with an other end extending downward at an incline in a direction orthogonal to the longitudinal direction of the first horizontal member 342. A pair of second horizontal members 346a, 346b each with one end thereof respectively attached to the other end of the incline members 344a, 344b, and an other end extending inward and parallel with the first horizontal member 342. A pair of vertical members 348a, 348b each with one end thereof respectively attached to a lower face of the other end side of the two horizontal members 346a, 346b. A pair of prongs 350a, 350b respectively attached to the other ends of the vertical members 348a, 348b, formed at tip ends thereof with first direction inclined surfaces being the direction of the cutouts 330a, 330b of the wafer holder 318.

On the upper face of the pair of prongs 350a, 350b is provided suction apertures (not shown in the figure) for attracting the rear face of the wafer. Furthermore, the spacing of the mutual gap of the tip end portions of the prong 350a and the prong 350b is made narrower than 12 inches (the diameter of the wafer W'). Consequently, with the load arm 336, in the condition with the rear face of the wafer W attached and held via the suction apertures of the prongs 350a, 350b, the prongs 350, 350b are inserted from above into the cutouts 330a, 330b of the wafer holder 318 (refer to FIG. 34) and the attraction to the wafer W' released. Then, with the vertical direction position being maintained, the wafer holder 318 and the load arm 336 are relatively moved along the first direction so that the wafer W' can be transferred to the wafer holder 318, and the prongs 350a, 350b of the load arm 336 can be withdrawn from the wafer holder 318.

Furthermore, as will also be understood from FIG. 35, above the prongs 350a, 350b there is provided a space with a greater width than the diameter of the wafer (the space enclosed by the first horizontal member 342, the inclined members 344a, 344b, and the second horizontal members 346a, 346b). This is so that with a later described wafer transport arm, the wafer W can be loaded to inside this space portion from a direction orthogonal to the page in FIG. 35 (the Y direction).

Furthermore, with the exposure apparatus 300 of this embodiment, as shown in FIG. 32, there is provided; a wafer unload arm (hereunder referred to as an "unload arm") 352 for unloading the wafer from on the wafer holder 318, a wafer transport arm 354 for loading a wafer to the load arm 336, and an arm drive mechanism 356 for driving these. The unload arm 352 as is also clear from FIG. 32, is constructed exactly the same as the beforementioned load arm 336. However, these differ from the point that the load arm 336 is held on the bottom end of the elevating/rotating mechanism 338, whereas the unload arm 352 is held on an elevating/sliding mechanism 358 which includes the moveable element of a linear motor. In the following description, for the pair of prongs of the unload arm, the same reference symbols 350a, 350b as for the prongs of the load arms are used.

The unload arm 352 and the wafer transport arm 354 are driven at a predetermined stroke along the Y direction by the arm drive mechanism 356. Here in the case where an 8 inch wafer is used, then for the load arm and the unload arm, ones where the spacing between the tip end portions of the prong 350a and the prong 350b is narrower than 8 inches (the diameter of the 8 inch wafer) are used.

Figure 37:
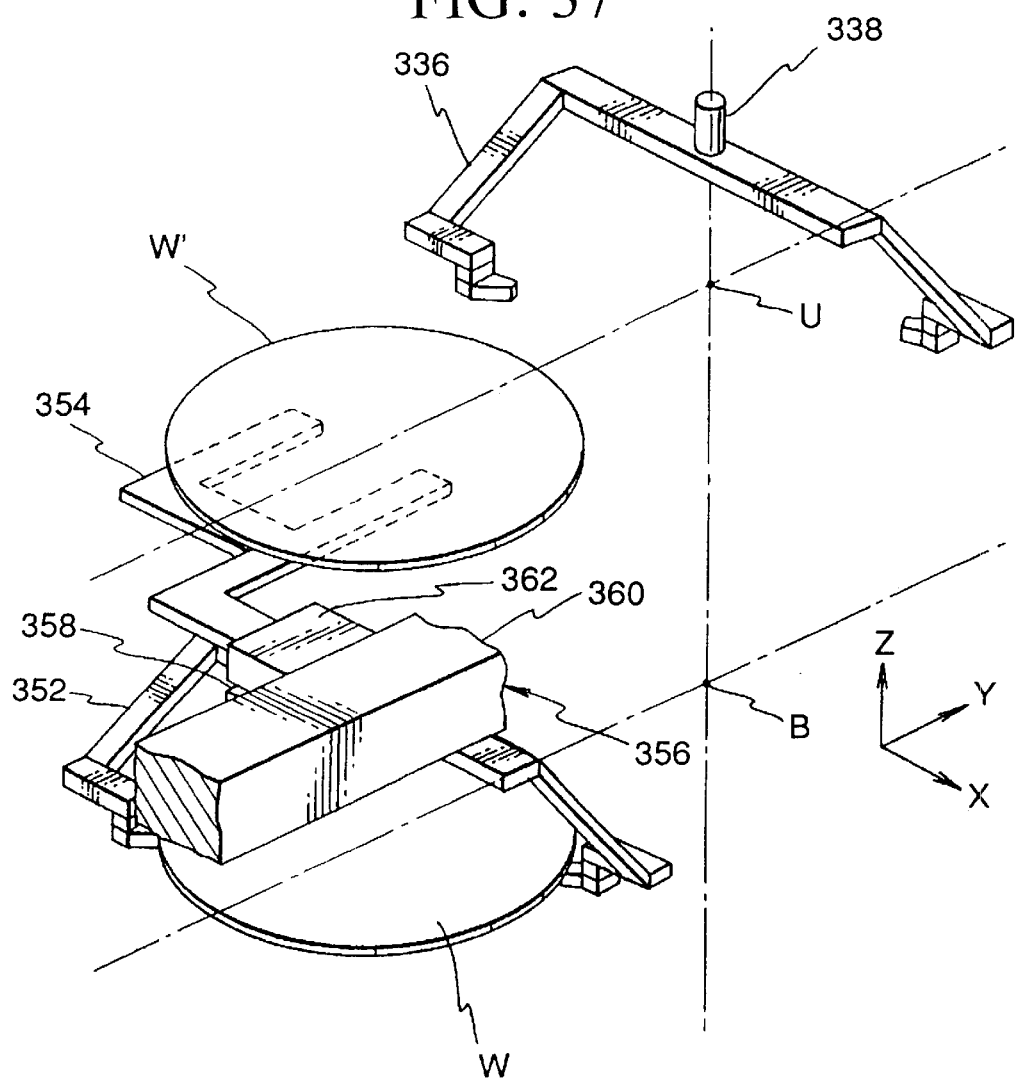
FIG. 37 is a schematic perspective view for explaining a mutual positional relationship between a load arm, a wafer transport arm, and an unload arm.

FIG. 37 shows a schematic perspective view for explaining the positional relationship between the load arm 336, the wafer transport arm 354 and the unload arm 352. FIG. 37 is more specifically a view showing the condition along the way where the wafer W has been unloaded from the wafer holder by the unload arm 352, and the wafer W' is being transported towards the load arm 336. As shown in FIG. 37, the arm drive mechanism 356 comprises; a linear guide 360 extending in the Y direction, the elevating/sliding mechanism 358 functioning as a relative drive mechanism for reciprocal movement in the Y direction along the linear guide 360, and a slide mechanism 362. Of these, the unload arm 352 as mentioned above is held in the elevating/sliding mechanism 358. Moreover, the wafer transport arm 354 is held in the slide mechanism 362. The elevating/sliding mechanism 358 and the slide mechanism 362 are controlled by the wafer loader control unit 321 of FIG. 30. Furthermore, in this case in order to prevent vibration, the linear guide 360 is attached to a frame away from the body of the exposure apparatus 300 which contains the wafer base plate 317 and the like.

Next is a description based on FIG. 38 through FIG. 46 of the overall operation for the exposure apparatus 300 constructed as described above, centered on the operation of the wafer transport system.

Figure 38:
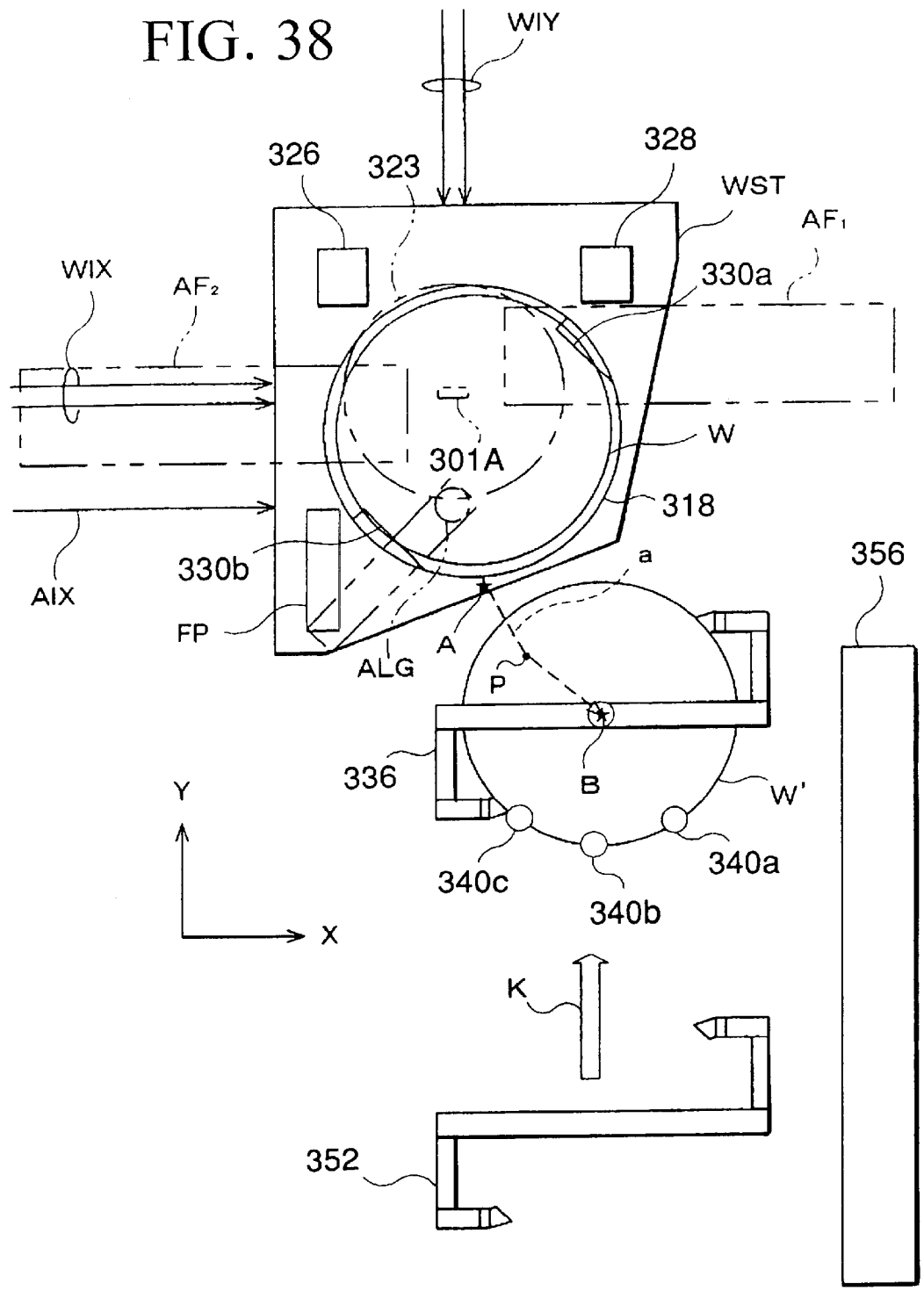
FIG. 38 is a diagram for explaining an operation in the middle of carrying out exposure of a wafer.

At first is a description of the operation during exposure of the wafer W held on the wafer holder 318 on the wafer stage WST, using FIG. 38. FIG. 38 shows a plan view of at the center while exposure of the wafer is being performed. Point A indicated by the star in FIG. 38 is the position where the reference point (here the center point of the wafer W (the wafer holder 318)) of the wafer stage WST is positioned, at the point in time where the exposure of the beforementioned step-and-scan method has been completed for each shot region on the wafer W. Hereunder, while not particularly limited, the description is for where the position of the reference point is made the position of the wafer stage WST.

During the abovementioned exposure, the main control unit 320 instructs the wafer loader control unit 321 as to the prealignment measurement of the wafer W' to be exposed next, and the standby at the loading position of the unload arm 352. As a result, the following operations are carried out during the time until the wafer stage WST arrives at point A, that is to say during the time until exposure is completed.

That is, the wafer transport arm 354 which holds the wafer W' is driven via the slide mechanism 362 constituting the arm drive mechanism 356 by means of the wafer loader control unit 321 to a predetermined position (point U in FIG. 37) inside the space of the load arm 336 arranged above the wafer transfer position (loading position). After this, the load arm 336 is driven up by a predetermined amount to perform transfer of the wafer W' to the load arm 336. Subsequently, the prealignment of the wafer W' is performed by the wafer loader control unit 321 using the wafer prealignment unit 332. More specifically, external shape measurement is performed by the control unit of the wafer prealignment unit 332 using the three CCD cameras 340a–340c, and the θ rotation error of the X, Y, θ errors is corrected using the elevating/rotating mechanism 338. After completion of this prealignment, the load arm 336 is stood by in this condition.

Furthermore, concurrently with the abovementioned operation the wafer loader control unit 321 drives in the Y direction (refer to arrow K in FIG. 38), the unload arm 352 for which the transport of the last wafer to be exposed has been completed, as far as the loading position (that is to say point B (refer to FIG. 37)) indicated by the star sign in FIG. 38, via the elevating/sliding mechanism 358 constituting the arm drive mechanism 356.

That is to say, at the point in time where exposure of the wafer W on the wafer stage WST has been completed and the wafer stage WST reaches point A, the load arm 336 and the unload arm 352 attain a vertically overlapped condition at point B being the loading position.

On completion of exposure, the main control unit 320 instructs the stage control unit 319 to move the wafer stage WST from point A towards point B as shown by the kink shape dotted line arrow "a" in FIG. 38, via the wafer drive unit 315 while monitoring the measurement values from the interferometer 324Y and the interferometer 324X.

With the movement path "a" from point A to point B, the part after the middle point P becomes the extension direction (first direction) of the cutouts 330a, 330b of the wafer holder 318. Here, in the case where points A and B are determined with a positional relationship such that a straight line path joining point A and point B becomes the first direction, the wafer stage WST may be moved along that first direction straight line path.

Here, during this movement the interferometer beam WIX from the interferometer 324X deviates from the reflection face of the measuring face of the wafer stage WST. However before this interferometer beam WIX deviates from the reflection face, that is to say, during the time while the interferometer beam WIX and the interferometer beam AIX from the interferometer 324A are impinging on the reflection surface, switching of the interferometers is performed by the stage control unit 319 according to instructions from the main control unit 320. After this switching, the wafer stage WST is position controlled using the interferometer beam WIY of the interferometer 324Y, and the interferometer beam AIX of the interferometer 324A, and hence there is no inconvenience.

Figure 43:
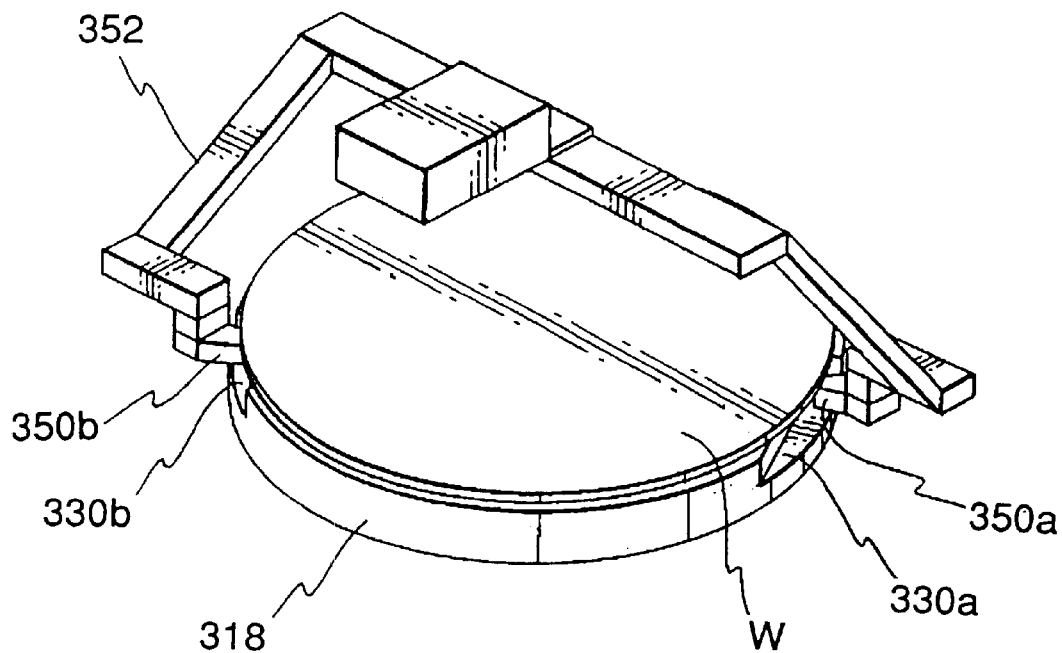

Due to the abovementioned movement along the path "a", the prongs 350a, 350b of the unload arm 352 which is standing by at the loading position, are inserted along the cutouts 330a, 330b of the wafer holder 318 to reach a position where the wafer W can be held from beneath. At this time, acceleration and speed control in the X, Y direction of the wafer stage WST is performed by the stage control unit 319 so that the prongs 350a, 350b do not contact with the inner walls of the cutouts 330a, 330b. FIG. 43 shows the condition where in this way, the prongs 350a, 350b of the unload arm 352 are inserted into the cutouts 330a, 330b of the wafer holder 318.

Figure 39:
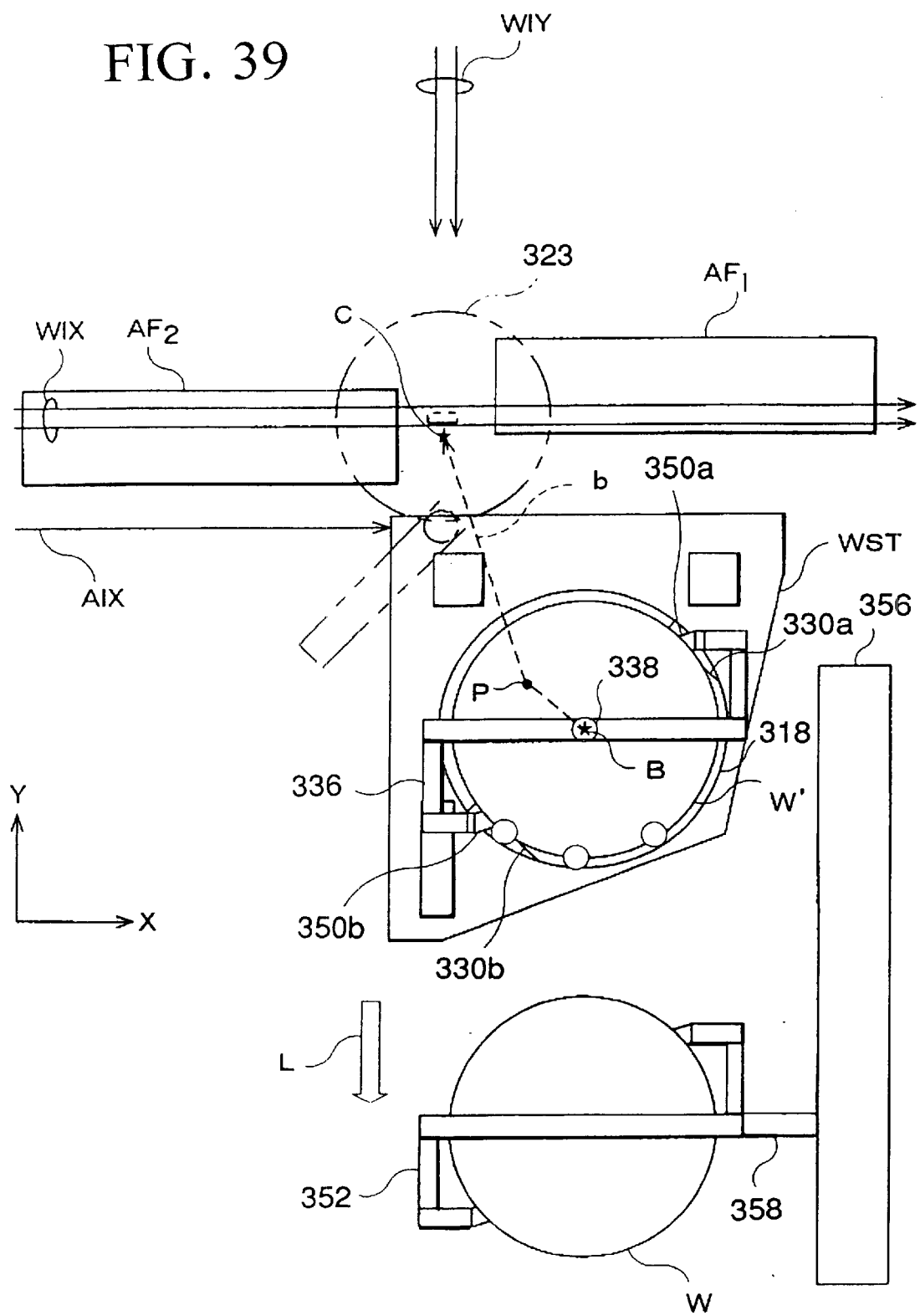
FIG. 39 is a diagram for explaining an operation for after a wafer stage has been moved to a loading position.

Next is a description using FIG. 39, of the operation after the time where the wafer stage WST has been moved to point B, being the loading position.

When the wafer stage WST reaches the point B being the loading position, the main control unit 320 releases the attachment of the wafer W by the wafer holder 318, and at the same time instructs the wafer loader control unit 321 for the unloading (unloading) of the wafer W from the wafer holder 318, and the loading (loading) of the wafer W' to the wafer holder 318. As a result, unloading of the wafer W on the wafer holder 318 and loading of the wafer W' to the wafer holder 318 is carried out as follows:

At first, the wafer loader control unit 321 switches on the vacuum for the unload arm 352 via the arm drive mechanism 356 (commence attraction) and raises by a predetermined amount, the unload arm 352 via the elevating/sliding mechanism 358 constituting the arm drive mechanism 356. During raising of the unload arm the rear face of the wafer W is attracted by the prongs 350a, 350b of the unload arm 352. After this the unload arm 352 is further raised, reaching to a position slightly above the upper face of the wafer holder 318, and then stops.

Figure 44:
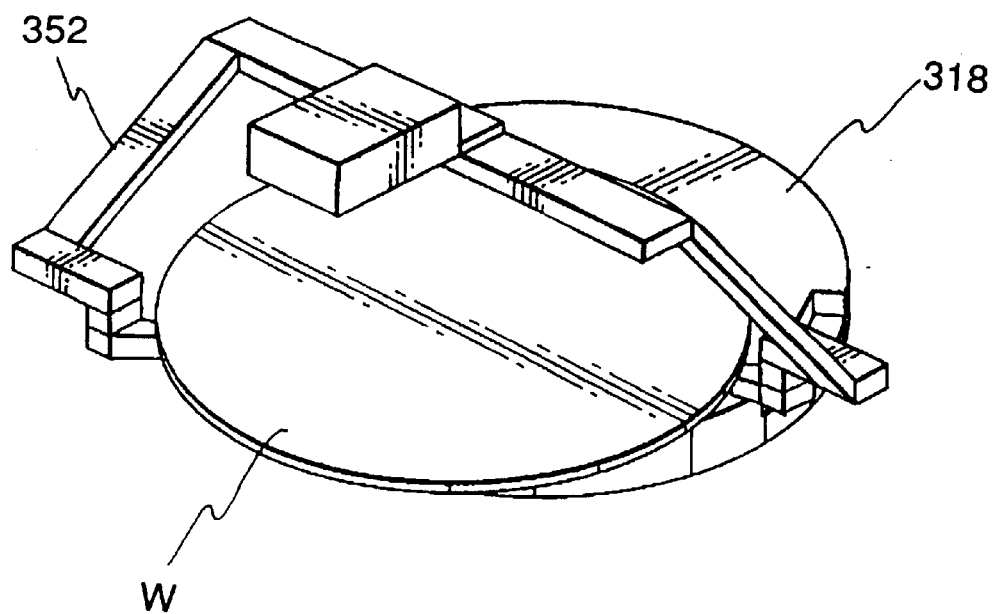
FIG. 44 is a perspective view showing an aspect during unloading of a wafer W by an unload arm.

In this way, the wafer W is transferred to the unload arm 352 from the wafer holder 318. When the unload arm 352 is raised to a height so as not to interfere with the wafer holder 318, and the wafer W is separated from the wafer holder 318, the wafer loader control unit 321, by way of the elevating/sliding mechanism 358 constituting the arm drive mechanism 356, transports in the direction of the arrow L in FIG. 39. FIG. 44 shows an aspect of during unloading of the wafer W by the unload arm 352.

Then, at the point in time where the unload arm 352 holding the wafer W has moved to a place where this will not interfere with the load arm 336, the wafer loader control unit 321 controls the elevating/rotating mechanism 338 so that the load arm 336 holding the wafer W' for which prealignment has been completed, is lowered by a predetermined amount. As a result, the prongs 350a, 350b of the load arm 336 are inserted from above into the cutouts 330a, 330b of the wafer holder 318.

At this time, the main control unit 320 receives notification from the wafer loader control unit 321, and starts attraction of the wafer holder 318 immediately before the prongs 350a, 350b reach the cutouts 330a, 330b of the wafer holder 318. Immediately after this, the wafer loader control unit 321 releases attachment of the wafer W' by the wafer unload arm via the arm drive mechanism 356.

As a result, at the point in time where the wafer W' reaches the upper surface of the wafer holder 318, the wafer W' is attracted and secured by the wafer holder 318. That is to say, in this way, the wafer W is transferred from the load arm 336 to the wafer holder 318. Here at the point in time of completion of this transfer, the upper face of the prongs 350a, 350b of the load arm 336 may be in either a condition of contact with the wafer rear face, or a condition of slight separation therefrom.

Figure 45:
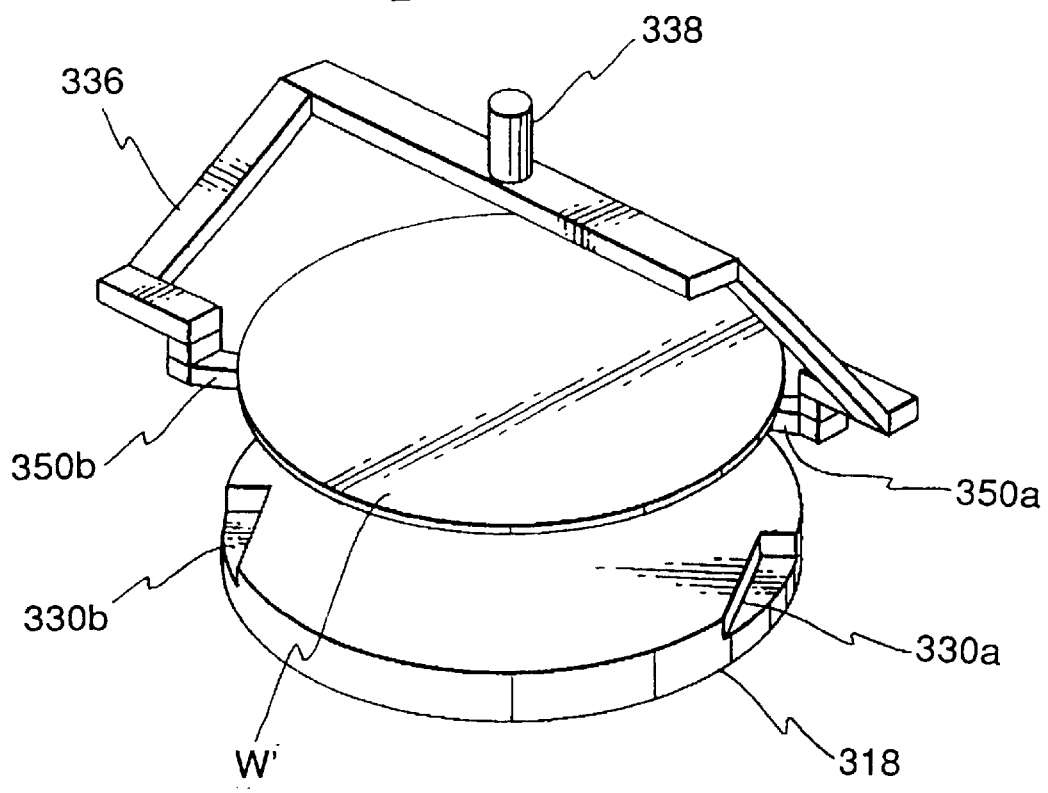
FIG. 45 is a perspective view showing an aspect in the vicinity of a load arm immediately after the unload arm has been withdrawn from above the wafer holder.
Figure 46:
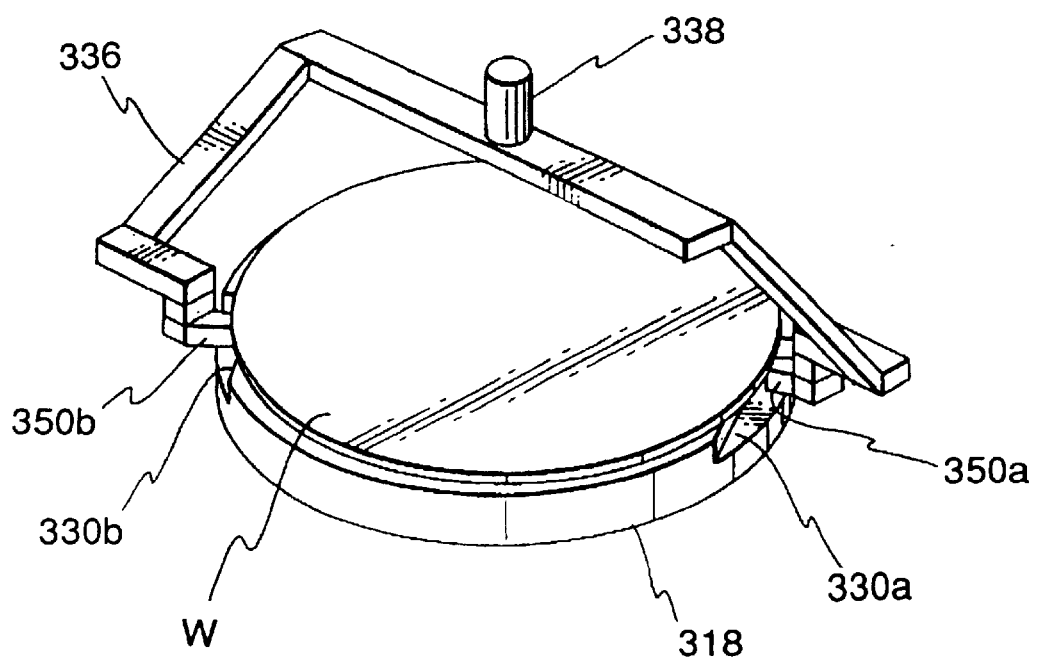
FIG. 46 is a perspective view showing a condition immediately after the load arm has been lowered and the prongs of the load arm have been inserted from above into the cutouts of the wafer holder.

FIG. 45 shows a situation in the vicinity of the load arm 336, immediately after the unload arm 352 has been withdrawn from above the wafer holder 318. FIG. 46 shows a condition immediately after the load arm 336 has been lowered and the prongs 350a, 350b of the load arm 336 are inserted from above into the cutouts 330a, 330b of the wafer holder 318.

After completion of the abovementioned transfer, an "exposure preparation complete command" is sent from the wafer loader control unit 321 to the main control unit 320. The main control unit 320 receives this "exposure preparation complete command", and at the point in time of verifying the abovementioned transfer, instructs the stage control unit 319 to move the wafer stage WST to the alignment start position, that is, to the point "c" shown by the star in FIG. 39.

The stage control unit 319 receives this command, and starts movement of the wafer stage WST towards the point "c" in FIG. 39, along the path "b" shown by the kink shape dotted arrow "b" by means of the wafer drive unit 315, while monitoring the measurement values from the interferometers 324A, 324Y. At this time, the wafer stage WST moves from point B to point P, being the opposite direction on the same path for the case of FIG. 37. At this time, the prongs 350a, 350b of the load arm 336 are withdrawn from the cutouts 330a, 330b of the wafer holder 318.

When the wafer stage WST is at the point B being the loading position, and the abovementioned transfer of the wafer W' is performed, the XY error of the wafer W' obtained previously at the time of prealignment may be corrected by fine adjustment of the XY position of the wafer stage WST. In this case, with respect to the several 10 $\mu$ms for the XY error, since there is a spacing of 1~2 mm between the prongs 350a, 350b and the wafer holder 318, then this fine adjustment can be executed without any trouble.

Figure 40:
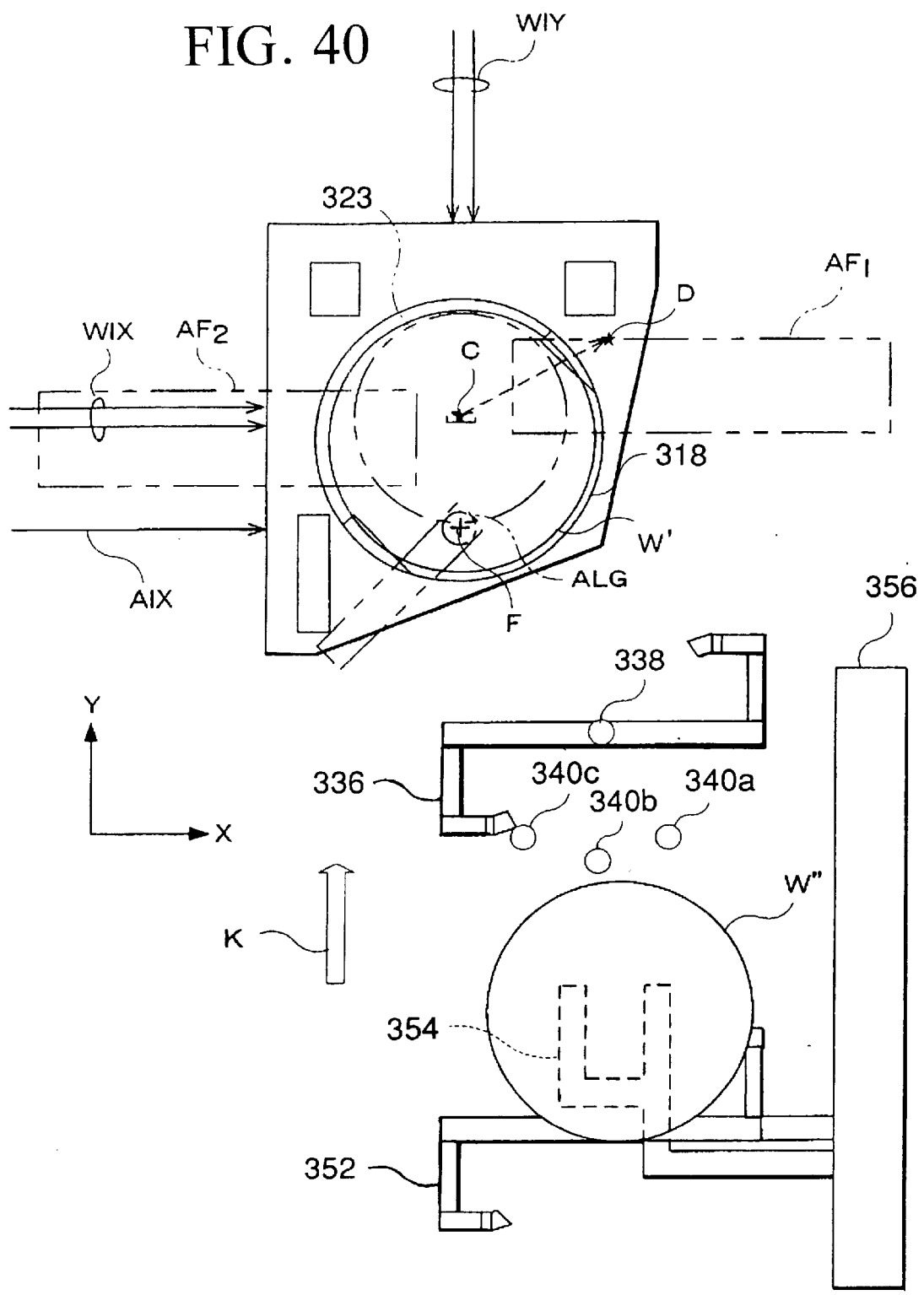
FIG. 40 is a diagram for explaining an operation for after the wafer stage has been moved to an alignment commencement position.

Next, the operation after the wafer stage WST has been moved to the point "c" being the alignment commencement position, is described based on FIG. 40. FIG. 40 shows the condition where the wafer stage WST has been moved to the point "c". Point "c' is the detection commencement position (alignment commencement position) of the position of the mark formed on the wafer W'. At this position, the detection region (detection position) of the multi-point focal position detection system AF spans across the wafer W, and a rough auto focus and auto leveling operation, that is to say a global adjustment of the optical axis direction position and inclination of the overall wafer surface is performed. This rough auto focus and auto leveling operation is carried out by moving the wafer holder 318 in the Z direction and the incline direction by the stage control unit 319 based on wafer position information from the multi-point focal position detection system AF. However, in the case where a rough auto focus detection system is provided in the alignment sensor ALG, this can be used to perform the auto focus and auto leveling. Normally however in the alignment sensor ALG only a fine auto focus detection system is provided. With the rough auto focus measurement, an auto focus and auto leveling detection system for the exposure light, that is to say the multi-point focal position detection system AF is used.

After global adjustment of the optical axis direction position and inclination of the overall wafer surface by the abovementioned rough auto focus and auto leveling operation, mark search and fine alignment is executed.

That is to say, the main control unit 320 sequentially moves the wafer stage WST via the stage control unit 319, and detects an alignment mark (wafer mark) attached to a previously determined specific shot region (sample shot) of the wafer W', using the alignment sensor ALG. Then this detection result (the relative position of each mark and the detection center of the alignment sensor (point F indicated by the + mark in FIG. 40)), and the measurement values of the interferometers 324Y, 324A at the time of detecting each mark are used to obtain the position of the wafer mark of the abovementioned sample shot. Then based on the position of the obtained wafer mark, the total wafer rotation, the orthogonality, the scaling in the X, Y direction (magnification error), and the linear error represented by the offset in the X, Y direction, are computed by statistical computation as disclosed for example in Japanese Unexamined Patent Application, First Publication No. 61-44429. After this, based on the computed result, EGA (Enhanced Global Alignment) for computing the array coordinates of the shot region on the wafer W is performed.

These may be corrected by applying the XY error obtained at the time of the beforementioned prealignment as an offset to the abovementioned wafer mark detection results.

Here since the interferometer 331Y and the interferometer 331A, have a positional relationship with respect to the alignment sensor ALG, such that Abbe error does not occur, then error due to yawing (θ rotation) of the wafer stage WST does not occur. However, since the height of the wafer W' surface, and the length measurement axes WIX1, WIX2, WIY1, WIY2, AIX of the respective interferometers 324X, 324Y, 324 are different, then the stage control unit 319 obtains the pitching amount and yawing amount using the measurement values of the third length measurement axis and the sixth length measurement axis or the like as mentioned before, and based on these corrects the vertical direction Abbe error which is generated when the wafer holder 318 is inclined.

Furthermore, at the point in time when the wafer stage WST reaches the point "c", since the interferometer beam WIX of the interferometer 324X also impinges on the reflection face on the side face of the wafer stage WST, then under instruction from the main control unit 320, the stage control unit 319 performs a reset operation of the interferometer 324X. The reset value at this time is not zero but is given a value the same as the measurement value of the interferometer 324A, and calibration of the interferometer 324A and the interferometer 324X is performed.

On the other hand, while performing the abovementioned alignment, the wafer which has been unloaded by the unload arm 352 is transferred to a robot arm (not shown in the figure) of a wafer loader system. Moreover, in order to transport a new wafer W" which has been loaded from the wafer loader system, the wafer loader control unit 321 under instructions from the main control unit 320, attracts and holds the rear face of the wafer W" by the wafer transport arm 354 via the arm drive mechanism 356, and then moves the wafer transport arm 354, in the direction of arrow K.

After completion of the abovementioned EGA, the stage control unit 319 in accordance with instructions from the main control unit 320, moves the wafer stage WST to the base line measuring position, that is to say to the point "d" indicated by the star mark in FIG. 40.

Figure 41:
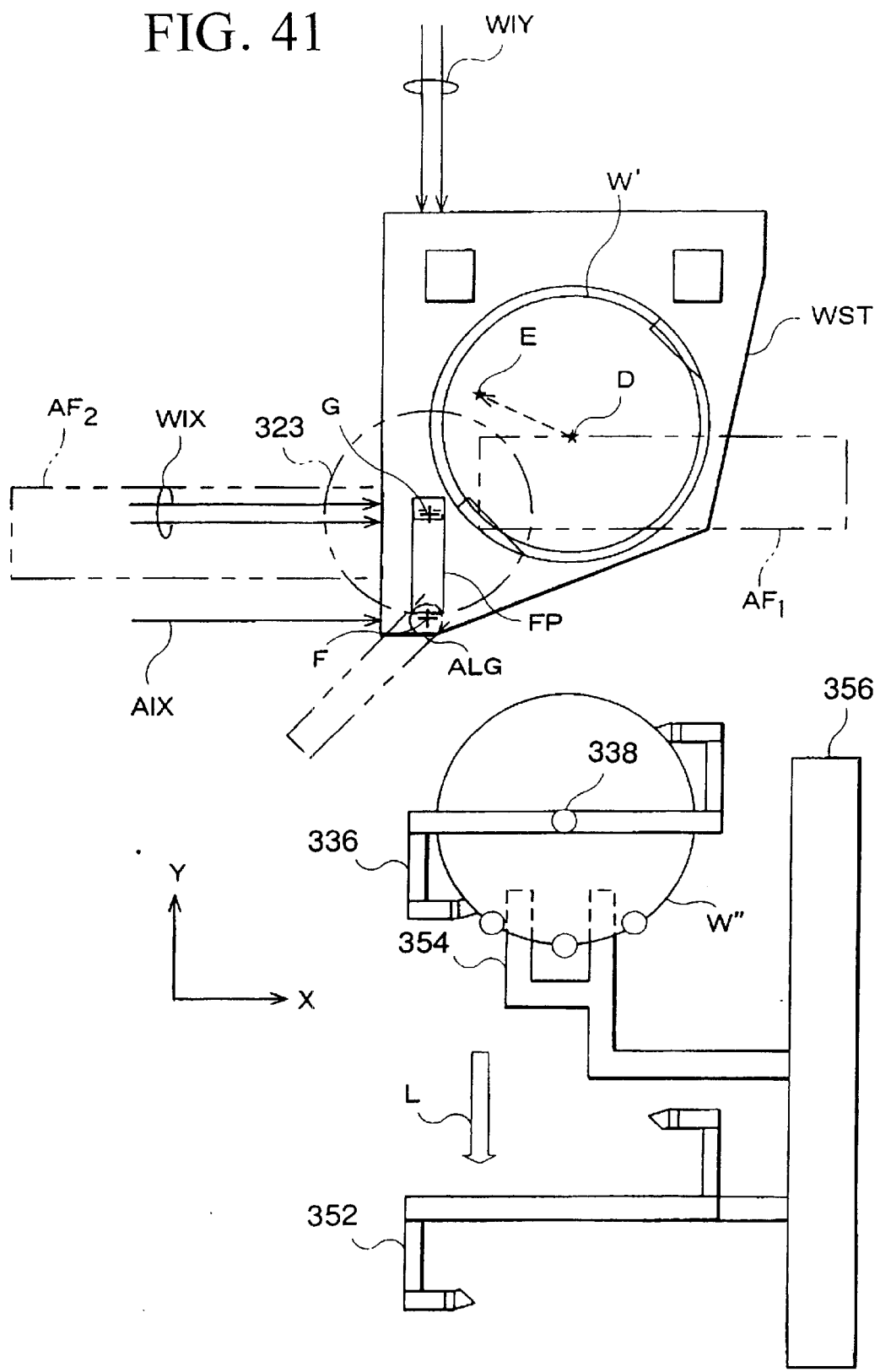
FIG. 41 is a diagram for explaining an operation when the wafer stage has been moved to a base line measuring position.

Next is a description using FIG. 41, of the operation at the time when the wafer stage WST is moved to the point "d" being the base line measuring position. FIG. 41 shows the condition where the wafer stage WST has been moved to the point "d". In FIG. 41, one + mark F shows the detection center of the alignment sensor ALG, while the other + mark g typically shows the position of the detection center of a TTR alignment system (not shown in the figure) (an apparatus for simultaneously measuring using exposure light wave length, the relative displacement relationship between a pair of reticle alignment marks formed on the reticle R, and a corresponding reference mark (referred to as a second reference mark) on the reference plate FP) positioned above the reticle R.

After EGA completion, and before moving to the exposure operation, then in order to switch from the alignment laser interferometer 324A to the exposure laser interferometer 324X, it is necessary to accurately measure the base line amount, being the distance between the projection position of the reticle pattern and the alignment sensor ALG. Therefore, the main control unit 320, as shown in FIG. 41 detects a first reference mark (omitted from the figure) formed on the reference plate FP on the wafer stage WST, using the alignment sensor ALG, and at the same time detects the second reference mark (omitted from the figure) formed on the reference plate FP, using the abovementioned TTR alignment system. That is to say, the center position of the positions of the pair of reticle alignment marks detected by the TTR alignment system is a point representatively showing the projection position (optical axis position of the projection optical system PL) of the reticle pattern. The distance in the X direction and Y direction from this position to the detection center of the alignment sensor ALG, is the base line distance in the X direction and Y direction. In this case, since the reference plate FP is made from a low expansion material, and the positional relation between the first reference mark and the second reference mark is known beforehand, then the true base line distance can be obtained by using: the positional relation (position error) between the reticle alignment mark and the second reference mark detected by the TTR alignment system; the positional relation (position error) between the detection center of the alignment sensor ALG and the first reference mark, detected by the alignment sensor ALG; the design base line distance; and the detection values of the respective interferometers.

Consequently, by moving the wafer stage WST from the abovementioned position obtained by the fine alignment (EGA) by the base line distance only, then each shot region on the wafer W' can be accurately superimposed on the projection position of the reticle pattern, and exposure then performed. However, with this embodiment scanning exposure is performed. Therefore, at the time of the beforementioned actual exposure, movement of the wafer stage WST involves moving from the position obtained by the fine alignment (EGA) by the base line distance only, and then moving to a scanning start position for exposing each shot, which is shifted by a predetermined distance in the scanning direction from the position of the shot center.

Of course, at the time of the abovementioned EGA, only the rotation of the overall wafer, the orthogonality, the scaling (magnification error) in the X, Y direction, and the linear error represented by the offset in the X, Y direction are obtained, but the array coordinates of each shot region are not yet obtained. Using this obtained linear error, the design shot array data can be corrected. In this case also it is of course necessary to execute movement of the wafer stage WST based on the position of the shot and the base line distance detected by the alignment sensor ALG.

At the time of the abovementioned base line measurement, the rotation of the wafer stage WST and the reference plate FP cannot be measured. In this case, the reference plate FP is made from a material with a coefficient of thermal expansion approximately the same as that of the wafer stage WST, and is securely attached to the wafer stage WST either integrally, or for example with screws or by using an adhesive. Therefore, there is little likelihood of the occurrence of rotation error between the reflection surface on the side face of the wafer stage WST, and the reference plate FP. Moreover, since the yawing of the wafer stage WST itself is corrected based on the measurement value of the measurement length axes WY1, WY2 of the interferometer 324Y, then any disadvantage also does not arise.

Here, after the abovementioned base line measurement, the interferometer used in the position control of the wafer stage WST is changed from the alignment laser interferometer 324A to the exposure interferometer 324X, with the base line measurement results and the yawing measurement result in reflected form. This interferometer switching is carried out by the stage control unit 319 in accordance with instructions from the main control unit 320. After this switching, the stage control unit 319 moves the wafer stage WST to the scanning start position for exposure of the first shot, that is to say to point "e" denoted by the star sign in FIG. 41.

On the other hand, the wafer transport arm 354 reaches point B being the loading position, and the wafer loader control unit 321 drives the load arm 336 upward via the elevating/rotating mechanism 338 so that the wafer W" is transferred from the wafer transport arm 354 to the load arm 336. At this time, the attraction of the wafer W" by means of the wafer transport arm 354 is released by the wafer loader control unit 321, and the attraction of the wafer W' is performed by the load arm 336. After completion of this transfer, the wafer loader control unit 321 withdraws the wafer transport arm 354 in the direction of the arrow L by means of the arm drive mechanism 356.

Figure 42:
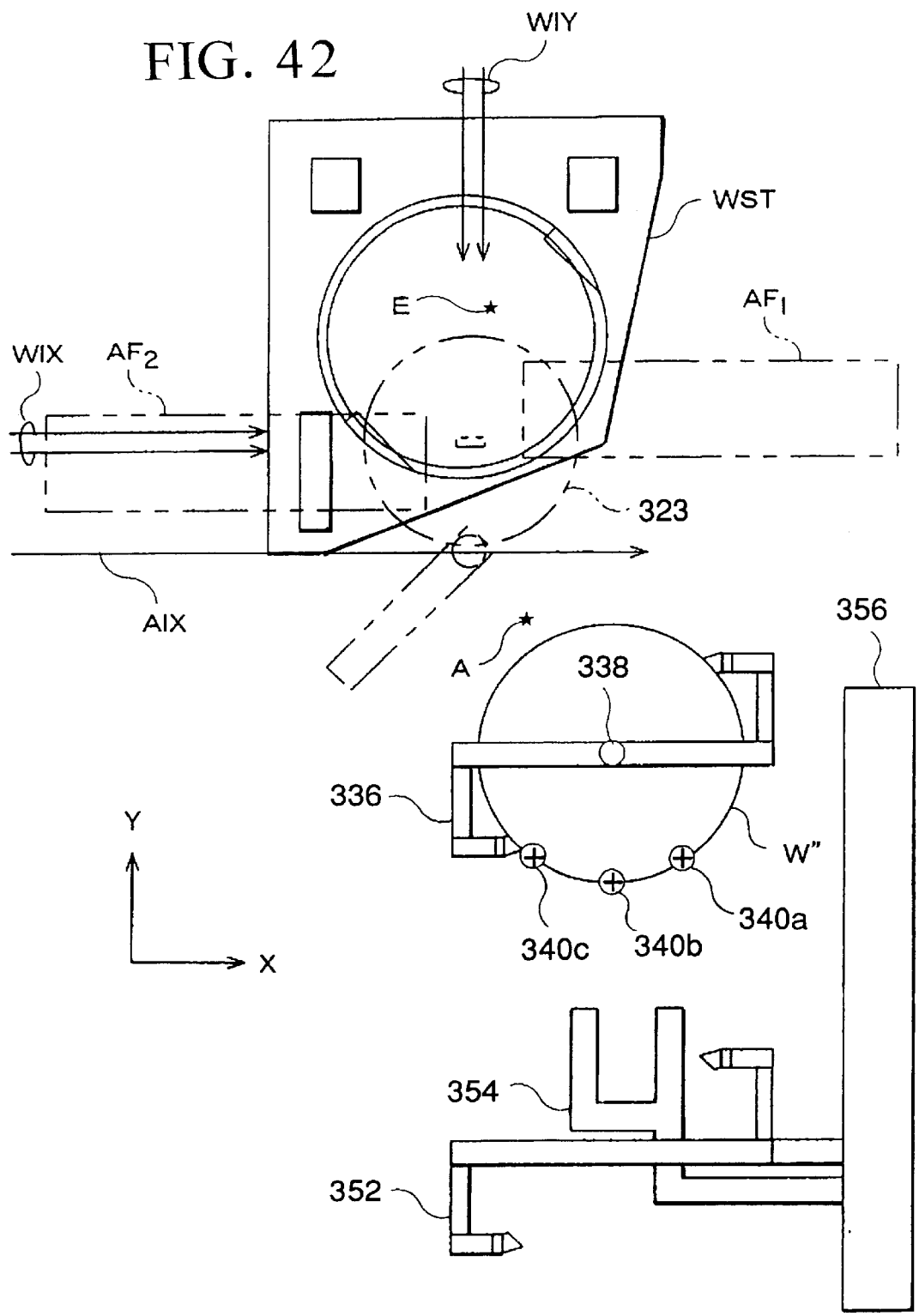
FIG. 42 is a diagram for explaining an operation after the wafer stage has been moved to a scanning commencement position in order to expose a first shot on the wafer.

Next is a description using FIG. 42 of the operation after the wafer stage WST has been moved to the point "e" being the scanning start position for exposing the first shot on the wafer W'. FIG. 42 shows the condition where the wafer stage WST has reached the point "e".

In the condition of FIG. 42, exposure with the previously explained step-and-scan system is commenced, with sequential reticle patterns being transferred to each shot region on the wafer W. By means of this step-and-scan system exposure operation, the wafer stage WST is moved from point "e" to point "a" being the exposure completion position. During the exposure operation, the operation of each section is managed by the main control unit 320 by means of, for example, the stage control unit 319 and the illumination control unit 314.

Then, during this exposure, as previously explained, the three points denoted by + marks I on the outer rim of the wafer W" are detected by the wafer prealignment unit 332 using the three CCD cameras 340a~340c, and external shape measurement of the wafer W" thus carried out. The θ rotation error of the X, Y, θ error of the wafer W' obtained from this measurement is corrected using the elevating/rotating mechanism 338. After completion of this prealignment, the load arm 336 is stood by in this condition. Furthermore, concurrent with this operation, the unload arm 352 moves in the Y direction to point B being the loading position, and stands by.

As will be clear from the explanation to here, with the present embodiment the control apparatus according to the present invention is constituted by the stage control unit 319, the main control unit 320, and the wafer loader control unit 321, and the second control unit is constituted by the main control unit 320 and the wafer loader control unit 321. Moreover, the wafer loader control unit also constitutes the computing unit according to the present invention. Furthermore, with the present embodiment, the substrate transport apparatus is constituted by the wafer stage WST, the wafer holder 318, the wafer drive unit 315, the load arm 336, the unload arm 352, the wafer prealignment unit 332, the arm drive mechanism 356, the stage control unit 319, the main control unit 320, and the wafer loader control unit.

As described in detail above, with the exposure apparatus 300 of this embodiment, during wafer exposure, concurrent with the standing by of the unload arm 352 at the loading position, the wafer external shape measurement and prealignment is executed above the loading position with respect to the wafer on the load arm 336. Therefore the prealignment time can be completely overlapped with the exposure time. Therefore, without increasing processing time for prealignment, compared to the case where exposure and prealignment are sequentially performed as with the case where prealignment is carried out on the wafer stage WST, an improvement in throughput is possible.

Moreover, the sequence for wafer exchange is in outline, the following six steps namely (1)~(6).
(1) The wafer stage WST is moved to the loading position. At this time, the prongs 350, 350a of the standing by unload arm 352 are inserted into the cutouts 330a, 330b of the wafer holder 318 on the wafer stage WST.
(2) Next the vacuum of the wafer holder 318 is switched off by the main control unit 320.
(3) By raising the unload arm 352 up, the wafer is transferred from the wafer stage WST to the unload arm 352.
(4) The unload arm 352 is withdrawn from the loading position.
(5) The load arm 336 is moved down, and the wafer which has completed prealignment is transferred to the wafer holder 318 on the wafer stage WST.
(6) The vacuum between the wafer holder 318 and the wafer is switched on. Consequently, due to the significant reduction in steps compared to the conventional ten steps, the time required for wafer exchange processing can be significantly shortened, and hence an improvement in throughput can be realized. The present inventors conducted experiments, and concluded that the wafer exchange time of around 4.6 seconds taken with the conventional exposure apparatus could be shortened to around 2.6 seconds to 3 seconds.

The reason for obtaining the above results was because compared to the respective conventional wafer loading combining the center-up and the load arm, and wafer unloading combining the center-up and the unload arm, the main part of the wafer loading and unloading is carried out by moving the wafer stage WST (wafer holder 318) side which can be moved at high speed and high accuracy compared to either the load arm or the unload arm.

Furthermore, according to the present embodiment, the wafer external shape measurement and correction (prealignment) of the θ rotation error is executed on the load arm 336, and the XY error obtained simultaneously with the rotation error is corrected at the time of prealignment where the wafer mark or the position of the wafer stage is detected. Furthermore, the transfer of the wafer (accompanying the wafer vacuum process) after prealignment is made once. Therefore transfer error can be kept to a minimum. Consequently high accuracy prealignment can be executed.

Furthermore, since it is not necessary to provide the wafer elevating mechanism such as the center-up on the wafer stage WST, the wafer stage WST itself can be lightened. Therefore, due to this, controllability of the wafer stage can be improved.

Moreover, the operation of inserting and separating the prongs of the unload arm 352 and the load arm 336 with respect to the wafer holder 318 on the wafer stage WST is executed by the drive operation of the wafer stage WST. Therefore high speed other than for the unload arm 352, is not necessary, thus bringing about a reduction in cost.

Here the wafer prealignment apparatus is not limited to that described in the abovementioned embodiments, and may employ apparatus of various forms. For example, as with Japanese Unexamined Patent Application, First Publication No. 9-36202, this may be constructed with the illumination system mounted on the wafer stage WST, with prealignment being carried out using the illumination system mounted on the wafer stage WST and after the wafer stage WST has come to beneath the load arm 336. Alternatively, the wafer may be illuminated from above, with a light emitting element, and a light receiving element arranged beneath the wafer to detect transmission light, or with a light emitting element and a light receiving element arranged above or below the wafer so that the reflection light from the wafer is received. Alternatively, a construction may be adopted where the illumination mechanism is inserted beneath the CCD camera during the wafer exposure operation. Moreover, also with a wafer where instead of the notch, a bar code is printed on the side face of the wafer, by arranging the illumination angle and the CCD camera focus position, N.A. for predetermined conditions, then with this system detection is possible. In this way, for the prealignment detection, various means can be adopted. However since in any event this is concurrently performed during the exposure operation, then there is no need to attempt to accelerate the loader system.

Moreover, the above embodiment has been described for the case where the shape of the wafer stage WST was a special hexagon shape. However the present invention is of course not limited to this. For example, as is normal the wafer stage WST may be a square shape or a rectangular shape, or may be a triangular shape. Furthermore, the moving mirror for the interferometer may be separately provided on the wafer stage WST. Moreover, the abovementioned embodiment has been described for the case where the whole of the wafer holder 318 protrudes from the upper portion of the wafer stage WST. However a construction may be adopted where a part or all of the wafer holder is embedded inside the wafer stage.

Figure 47:
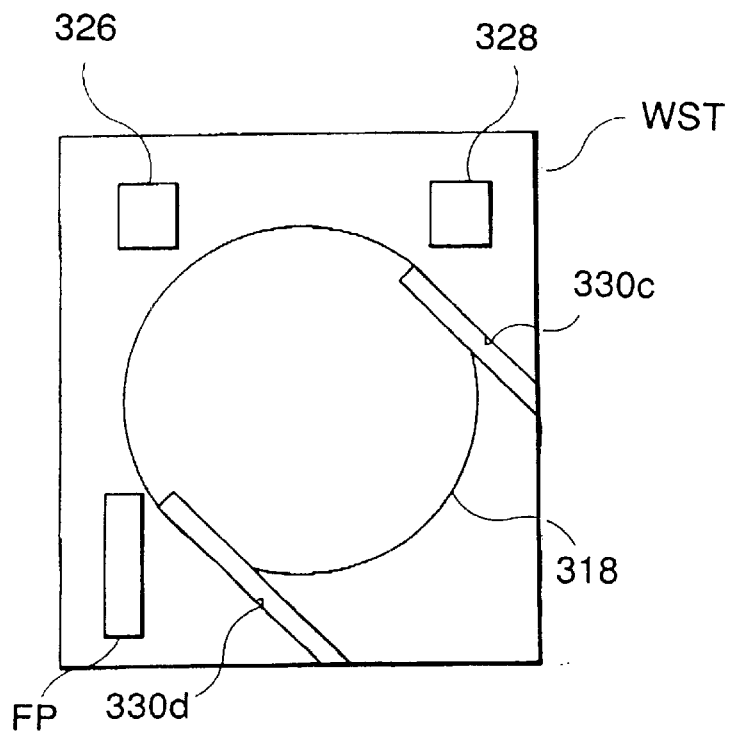
FIG. 47 and FIG. 48 are diagrams showing a modified example of a wafer stage.
Figure 48:
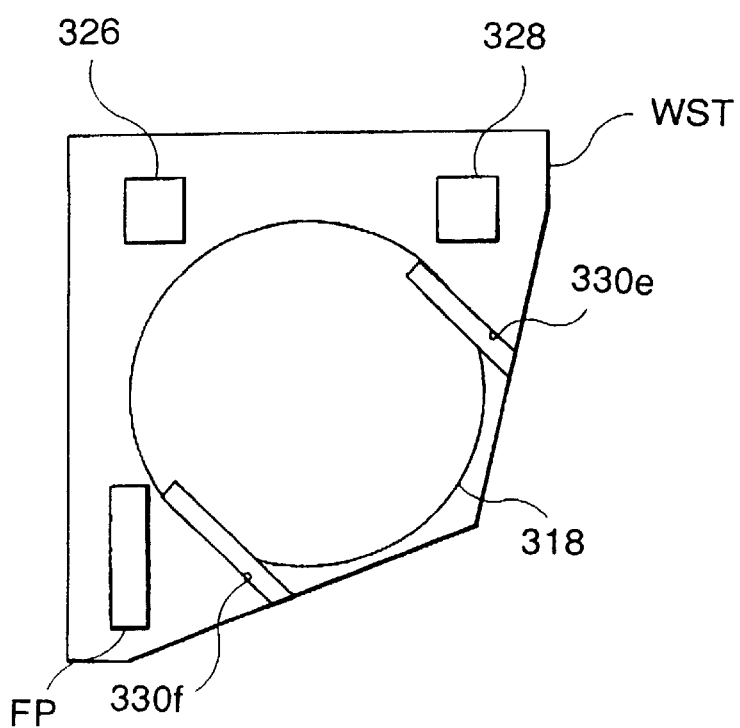

For example, in the case where a rectangular shape wafer stage with at least one part of the wafer holder 318 embedded therein is used, then as shown in FIG. 47, concavities (grooves straddling the wafer stage and the opposite sides of the wafer holder) 330c, 330d may be formed extending in the first direction being the direction of the inclined surfaces of the prongs of the load arm and the unload arm. Furthermore, in the case where a wafer stage of a hexagonal shape similar to the abovementioned embodiment is used with at least a portion of the wafer holder 318 embedded therein, then as shown in FIG. 48, concavities (grooves straddling the wafer stage and the opposite sides of the wafer holder) 330e, 330f may be formed extending in the first direction being the direction of the incline surfaces of the prongs of the load arm and the unload arm.

Here the abovementioned concavities or cutouts are made as short as possible. If these are short, the interference of the prongs of the load arm and the unload arm with the wafer stage due to movement of the wafer stage is minimized.

Since this is desirable for improving processing speed, then with the above embodiment, the wafer holder 318 is made to protrude completely from the upper face of the wafer stage WST and the cutouts are formed only in the wafer holder 318.

With the above embodiment, the insertion operation of the prongs 350, 350a of the unload arm 352 into the cutouts 330a, 300b of the wafer holder 318 which is holding the wafer, is performed by moving the wafer stage WST towards the loading position while the unload arm 352 is stopped at the loading position (substrate transfer position). However, the construction may be such that the unload arm is driven in the two dimensional plane of the X axis and the Y axis by the arm drive mechanism 356. Therefore, when the prongs 350a, 350b of the unload arm 352 are inserted into the cutouts 330a, 330b, the unload arm 352 is simultaneously driven in the first direction being the direction of extension of the cutouts. In this case, the prongs 350a, 350b of the unload arm 352 may be inserted into the cutouts in an even shorter time. Therefore even faster wafer unloading from the wafer holder 318 is possible.

Furthermore, the aforementioned embodiment was described for the case where after completion of moving the wafer stage WST to the loading position (substrate transfer position), the prongs of the load arm 336 are inserted into the cutouts of the wafer holder 318. However the arrangement is not limited to this, and the insertion of the prongs 350a, 350b of the load arm 336 into the cutouts 330a, 330b of the wafer holder 318 may be performed while the wafer stage WST is moving. In this case, the prongs 350a. 350b of the load arm 336 can be inserted into the cutouts 330a, 330b before completion of movement of the wafer stage WST to the loading position. Therefore the wafer can be passed more quickly from the load arm to the substrate holder 318. However, in this case, in order to accurately pass the wafer to the predetermined position on the wafer holder 318, a construction enabling the wafer holder 318 to be moved on the wafer stage WST is required, or the load arm 336 must be moved simultaneously in the opposite direction to the movement direction of the stage. Considering this situation, an arm drive mechanism for driving the load arm in the two dimensional plane of the X axis and Y axis may be provided, and at the time of inserting the prongs 350a, 350b of the load arm 336 into the cutouts 330a, 330b, the load arm may be driven in the first direction simultaneous with drive in the vertical direction.

Furthermore, the aforementioned embodiment was described for the case where the wafer holder and load arm at the time of transfer of the wafer, and the relative movement in the vertical direction of the unload arm are performed by the vertical movement on the arm side. However the arrangement is not limited to this and of course only the wafer side may be moved vertically, or both sides may be moved vertically in opposite directions.

Incidentally, the aforementioned embodiment was described for the case where cutouts (that is the concavities) 330a, 330b of a predetermined depth cutout of portions of the wafer attachment surface are formed in the wafer holder 318. However in this case, when a wafer (hereunder this wafer is referred to as wafer W1 for identification) of poor flatness with the portion temporarily corresponding to the cutouts 330a, 330b bent downwards, is loaded onto the wafer holder, there is the possibility of the occurrence of the following undesirable situation.

Figure 49:
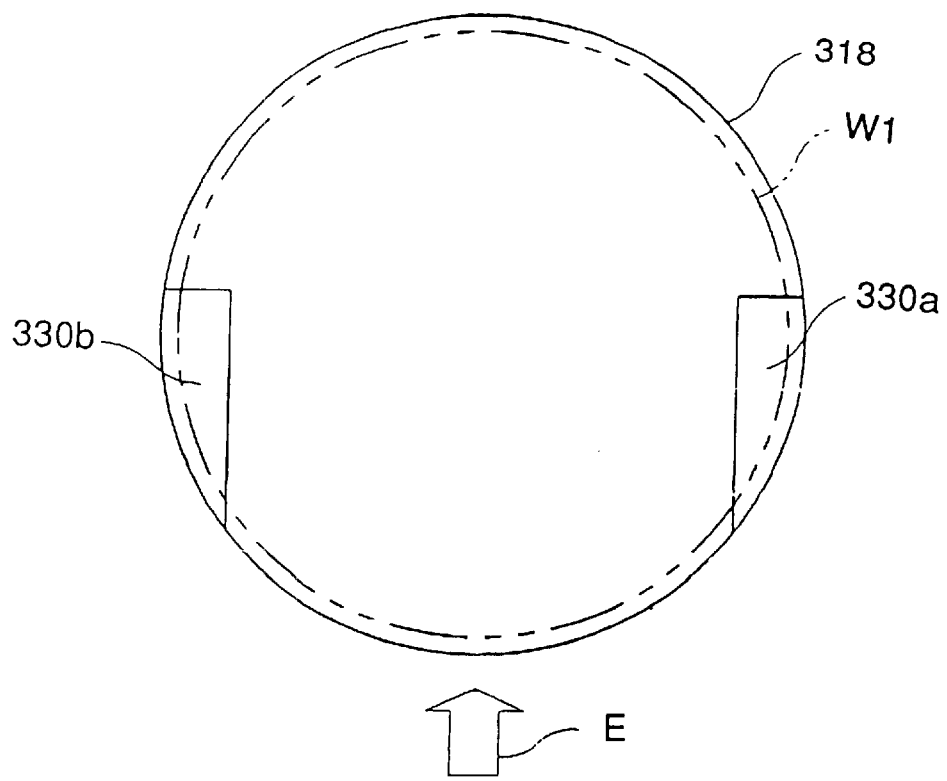
FIG. 49 is a plan view showing a condition where a wafer W1 of poor flatness is attracted and held on a wafer holder of the abovementioned embodiment.
Figure 50:
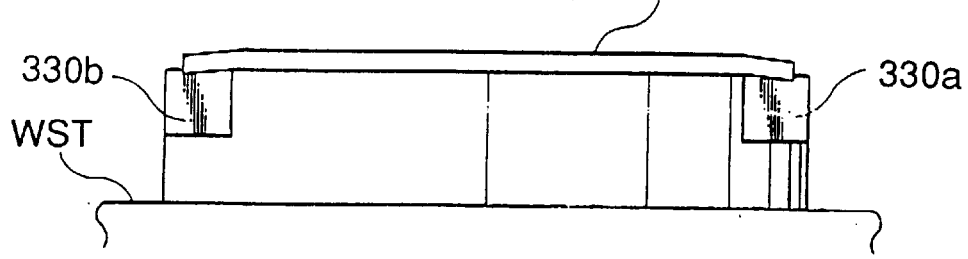
FIG. 50 is a view showing an aspect viewed in the direction of arrow E of FIG. 49.
Figure 51:
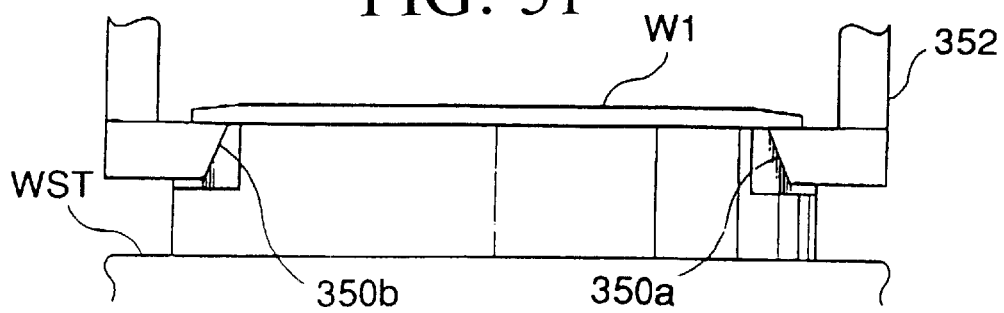
FIG. 51 is a view showing an aspect where prongs 350a, 350b interfere with the wafer W1.

FIG. 49 shows a plan view of the condition where from the requirement of explanation, the wafer W1 is mounted on the wafer holder 318 of this embodiment and attracted and held. FIG. 50 shows the appearance of FIG. 49 when viewed in the direction of arrow E. As will also be understood from FIG. 50, the portion facing the cutouts 330a, 330b of the wafer W1 is bent so as to hang down. In this case, even though one or two or more shot regions are provided in the region of the wafer perimeter including the bent region of the wafer W1, it is difficult to transfer the reticle pattern at high accuracy to all of these respective shot regions without defocusing. Therefore, there is the likelihood of a drop in the number of good quality chips obtained per wafer (device number). Furthermore, in this case there is a problem due to the setting of the dimension of the depth in the vertical direction of the cutouts 330a, 330b and the dimension in the height direction of the prongs 350a, 350b of the unload arm 352, when the prongs 350a, 350b of the unload arm 352 are inserted into the cutouts 330a, 330b from the page face side in FIG. 50 to unload the wafer W1. Here there is the possibility of the situation as shown in FIG. 51 where the prongs 350a, 350b interfere with the wafer W1 so that the unloading of the wafer W1 cannot be carried out smoothly.

In order to avoid this situation, it has been considered to reduce the width dimension in the direction orthogonal to the longitudinal direction of the cutouts 330a, 330b, and thus reduce the area, and corresponding to this to reduce the dimensions of the prongs 350a., 350b of the unload arm 352. However while the contact area of the prongs 350a, 350b with the wafer W1 is reduced, the attraction force (vacuum force) on the wafer W1 due to the prongs 350a, 350b is weakened. Therefore, this brings about the requirement that the acceleration of the unload arm 352 when the wafer W1 is separated from the wafer holder 318 by the unload arm 352 must be reduced. Consequently, since the time required for unloading is increased, it is considered that this is not a practical solution.

Figure 52:
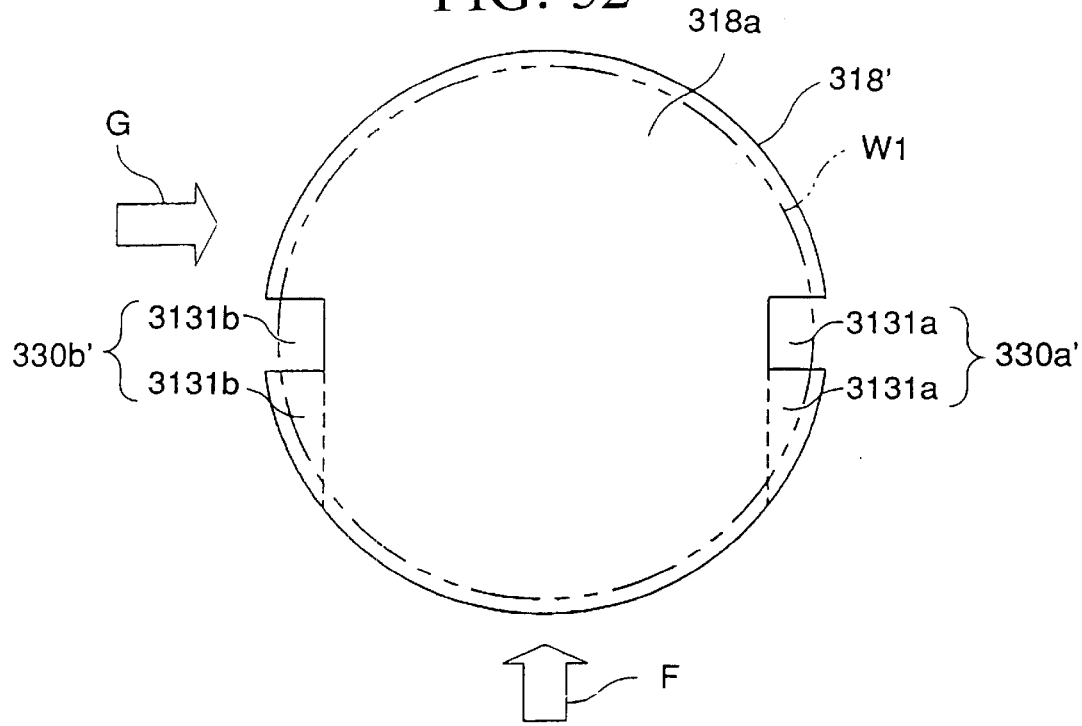
FIG. 52 is a plan view showing a condition where a wafer W1 is attracted and held on a wafer holder 318' according to another embodiment.
Figure 53:
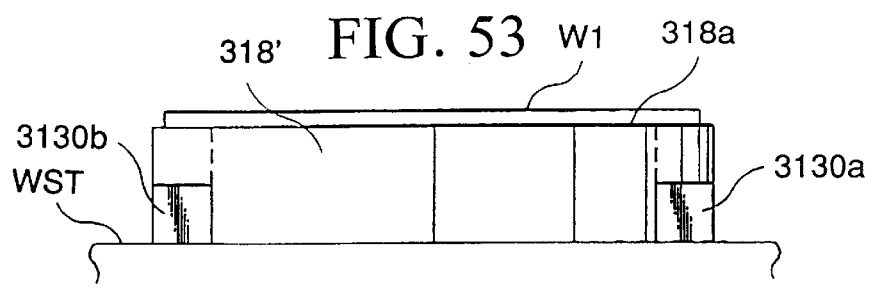
FIG. 53 is a diagram showing an aspect viewed in the direction of arrow F in FIG. 52.
Figure 54:
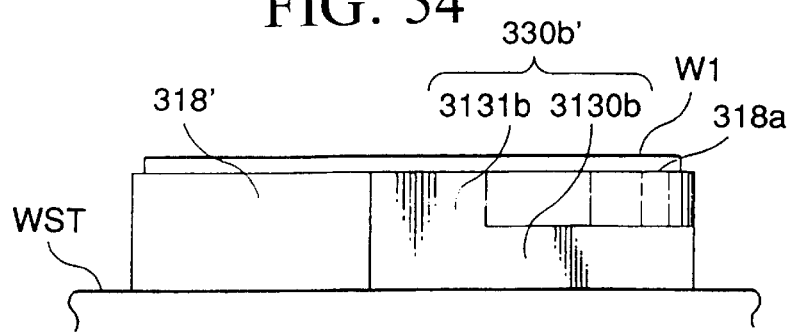
FIG. 54 is a diagram showing an aspect viewed in the direction of arrow F of FIG. 52.

Therefore, in order to prevent a drop in the number of good quality chips obtained per wafer (device number), when the abovementioned wafer W1 is mounted, instead of the wafer holder 318, a wafer holder 318' as shown in FIG. 52 through FIG. 54 may be mounted on the aforementioned wafer stage WST as the substrate holding member.

FIG. 52 shows a plan view of the condition where the wafer W1 is mounted and attracted and held on the wafer holder 318'. FIG. 53 shows the appearance of FIG. 52 viewed from the direction of arrow F, while FIG. 54 shows the appearance of FIG. 52 viewed in the direction of arrow G.

As will be apparent from FIG. 52 through FIG. 54, with the wafer holder 318', the bottom face (wafer stage WST side) on opposite sides thereof is partially cut away with a predetermined depth and predetermined width, so as to have a plane section shape the same as the beforementioned cutouts 330a, 330b, and portions of the wafer contact face 318a are removed to form spaces (open portions) 3131a, 3131b communicating with spaces 3130a, 3130b of the cut away portions. In this case, a cutout 330b' is formed for guiding one prong 350b of the unload arm 352 by means of the space 3130a and the space 3131b, in an L shape path along a predetermined direction (a direction at inclined 45 degrees to the X axis and Y axis) and the Z direction orthogonal to the XY two dimensional plane (refer to FIG. 54). Similarly, a cutout 330a' is formed for guiding the other prong 350a of the unload arm 352 by means of the space 3130a and the space 3131a, in an L shape path along a predetermined direction and the Z direction. Moreover, in this case, a part of the substrate contact face 318a protrudes at the part of the L shape path extending in the predetermined direction (that is, the spaces 3130b, 3130a) on the opposite side thereof to the substrate stage WST.

With the wafer holder 318', since the wafer contact face 318a is formed at the portions other than the spaces 3131a, 3131b, then even with a wafer W1 with poor flatness, attraction and holding over substantially the whole face is possible. As a result, as shown in FIG. 53 and FIG. 54, the wafer W1 is evened over the whole surface and held on the wafer holder 318' with good flatness.

Figure 55:
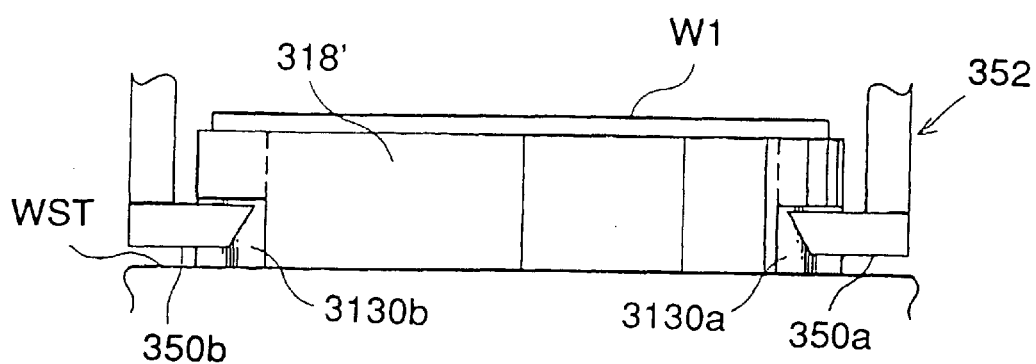
FIG. 55 and FIG. 56 are diagrams for explaining an unload operation for a wafer W1 on a wafer holder 318'.

In the case of unloading the wafer W1 on the wafer holder 318', then as shown in FIG. 55, the prongs 350a, 350b of the unload arm 352 are inserted into the spaces 3130a, 3130b along the direction of arrow F in FIG. 52, and at the point in time where the prongs 350a, 350b respectively reach to practically directly beneath the spaces 3131a, 3131b, the unload arm 352 is driven upwards. During this drive, the wafer W1 is transferred from the wafer holder 318' to the prongs 350a, 350b of the unload arm 352. The unload arm 352 is then driven upwards by a predetermined amount, and as shown in FIG. 56, at the point in time where the bottom face of the prongs 350a, 350b are raised slightly above the upper face of the wafer holder 318', the withdrawal operation of the unload arm 352 from the wafer holder 318a' (the movement to the front in the orthogonal direction to the page in FIG. 56) is commenced.

With the wafer holder 318', as will be understood from FIG. 55, when the prongs 350a, 350b of the unload arm 352 are inserted into the cutouts 330a', 330b' (more specifically, the spaces 3130a, 3130b) of the wafer holder with the wafer W1 in the held condition, the insertion can reliably avoid the occurrence of any unfavorable situation such as the wafer W1 being disturbed. Furthermore, the wafer contact area can be increased to the maximum amount.

Figure 56:
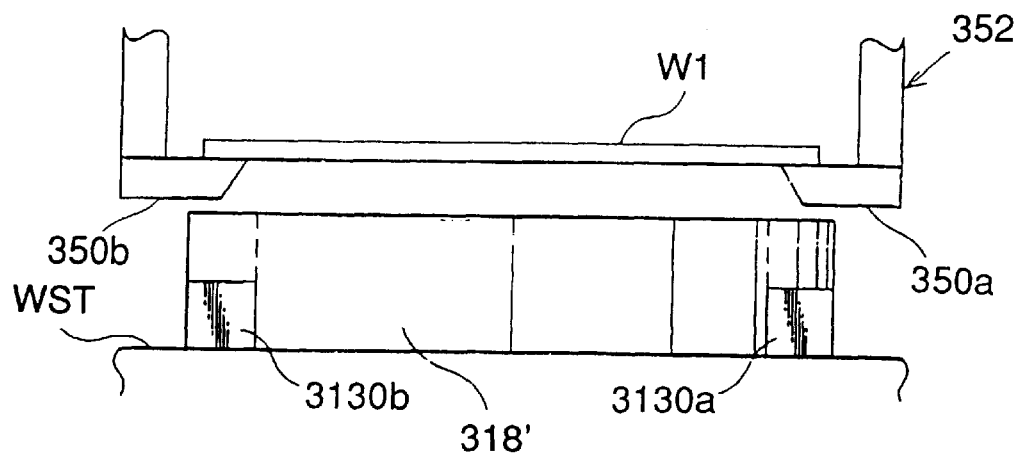

However, in the case where the wafer holder 318' is used, as will be understood from FIG. 56, since the vertical movement distance of the unload arm 352 is larger compared to the case of the beforementioned embodiment, there is the possibility of the unload time increasing slightly.

Figure 57:
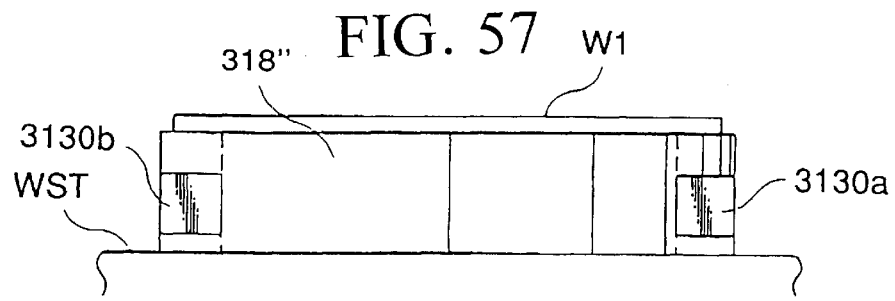
FIG. 57 through FIG. 59 illustrate a condition where a wafer W1 is attracted and held on a wafer holder 318" according to another embodiment.
Figure 58:
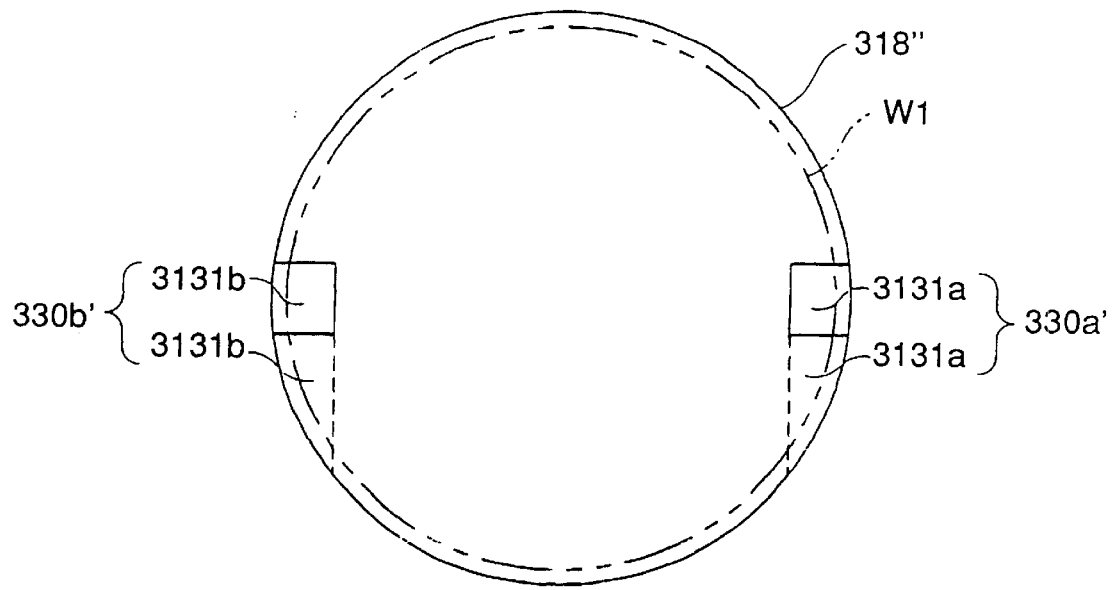
Figure 59:
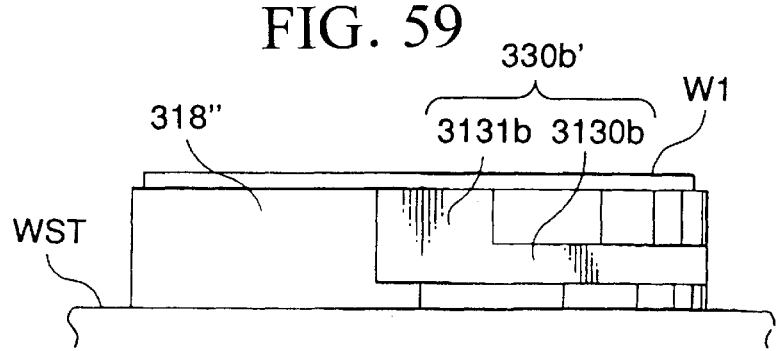

Therefore, considering this point a wafer holder 318" shown in FIG. 57 through FIG. 59 may be used. FIG. 57 shows a front elevation view of a condition where the wafer W1 is mounted and attracted and held on the wafer holder 318". FIG. 58 shows the plan view of FIG. 57, while FIG. 59 shows the left side elevation view of FIG. 57. Here parts identical to or equivalent to those of FIG. 52 through FIG. 54 are denoted with the same reference symbol.

Also in the case where the wafer holder 318" is used, unloading of the wafer W1 is performed in the same way as for the case where the wafer holder 318' is used, and the same results can be obtained. In addition, the vertical movement distance of the unload arm 352 can be made slightly smaller, and hence an improvement in throughput is possible.

Also in the case where either of the above wafer holders are used, in order to meet the required performance, then preferably the cutout area of the wafer contact face is made as small as possible.

Furthermore, the above embodiment was described for the case where the present invention was applied to an exposure apparatus using a dioptric system for the projection optical system PL. However there is no limitation to this, and the present invention may also be similarly applied to an exposure apparatus which uses a catadioptric type exposure optical system. Furthermore, the above embodiment was described in relation to a scanning type exposure apparatus which uses an i-ray light source or an excimer laser. However attention is being paid to future scanning type exposure apparatus, where the present invention may also be suitably applied to EUV exposure apparatus which use a soft X-ray light source. However in this case, it is necessary to use a reflecting type reticle and an all reflecting projection exposure apparatus. Moreover, the present invention is not limited to the scanning exposure apparatus such as with the above embodiment, and the present invention can also similarly be applied to an exposure apparatus of a stationery exposure apparatus such as a stepper, or an EB direct drawing apparatus which does not use a reticle. With the EUV exposure apparatus however, since it is necessary to have a vacuum for the exposure apparatus atmosphere, then a vacuum attraction for the attraction holding method for the reticle and the like cannot be adopted, and an electrostatic attraction or a 3-point support method where the flatness is stringently set, or some other method must be adopted.

Furthermore, the above mentioned embodiment has been described for the case where an imaging type alignment sensor which performs mark detection in a stationary condition, is used for the off-axis alignment sensor. However there is no limitation to this, and of course a beam scan type alignment optical system, or a stage scan type alignment optical system may be adopted.

The above mentioned embodiment has been described for the case where the substrate transport method and substrate transport apparatus according to the present invention have been applied to an exposure apparatus. However there is no limitation to this, and the present invention may also be suitably applied to various apparatus used in other steps in semiconductor manufacture provided these are apparatus where it is necessary to hold a substrate on a substrate holding member on a stage, and the stage moves, such as for example detection apparatus (for example an SEM scanning type exposure microscope), laser repair apparatus and the like. In the same way, an improvement in throughput can be realized.

Here with the substrate transport apparatus of the present invention, the various structural elements constituting the substrate transport apparatus are assembled by linking electrically or mechanically, so that the substrate can be unloaded from or loaded to the substrate holding member in a short time.

Moreover, with the exposure apparatus of the present invention, the various structural elements constituting the exposure apparatus incorporating the abovementioned substrate transport apparatus are assembled by linking mechanically or optically, in order to shorten the base exchange time and thus achieve an improvement in throughput.

(Device Manufacturing Method)

Next is a description of an embodiment of a device manufacturing method where the abovementioned exposure apparatus and exposure method are employed in a lithography process.

Figure 60:
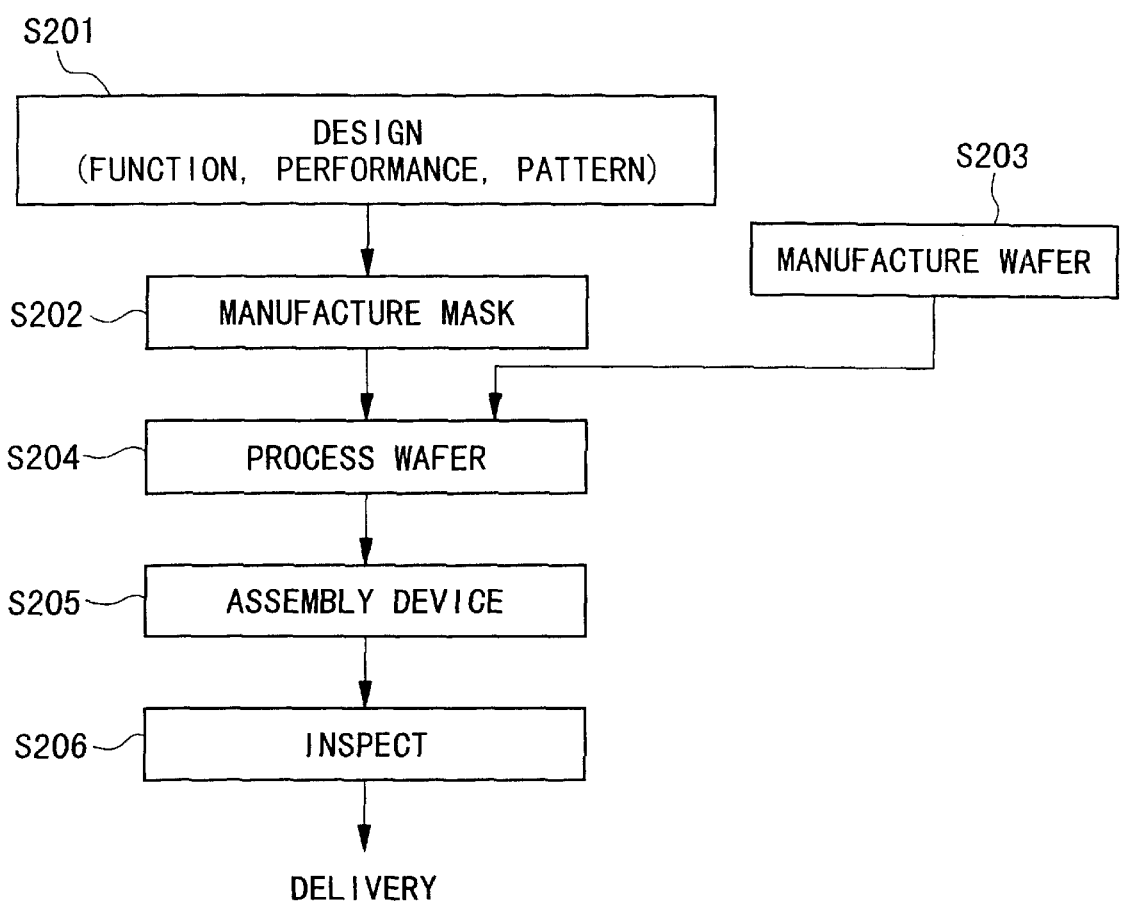
FIG. 60 is a flow chart for explaining an embodiment of a device manufacturing method according to the present invention.

FIG. 60 shows a flow chart for a manufacturing example for a device (a semiconductor chip such as an IC or an LSI, a liquid crystal panel, a CCD, a thin film magnetic head, a micro machine and the like). As shown in FIG. 60, at first in step S201 (design step), function and performance design of a device (for example circuit design for a semiconductor device etc.) is performed, and pattern design is performed in order to realize the functions. Then, in step S202 (mask manufacturing step), a mask on which the designed circuit pattern is formed is manufactured. On the other hand, in step S203 (wafer manufacturing step), a wafer is manufactured using a material such as silicon.

Next in step S204 (wafer processing step), the mask and wafer prepared in step S201 through step S203 are used to form an actual circuit or the like on the wafer as described hereafter, by means of a lithography technique. Then, in step S205 (device assembly step), the device is assembled using the wafer prepared in step S204. This step S205 includes as required, steps such as a dicing step, a bonding step, and a packaging step (chip encapsulation).

Finally, in step S206 (inspection step), inspection such as operation verification testing, endurance testing of the device manufactured in step S205 is performed. After completion of these steps, the device is complete, and is then shipped.

Figure 61:
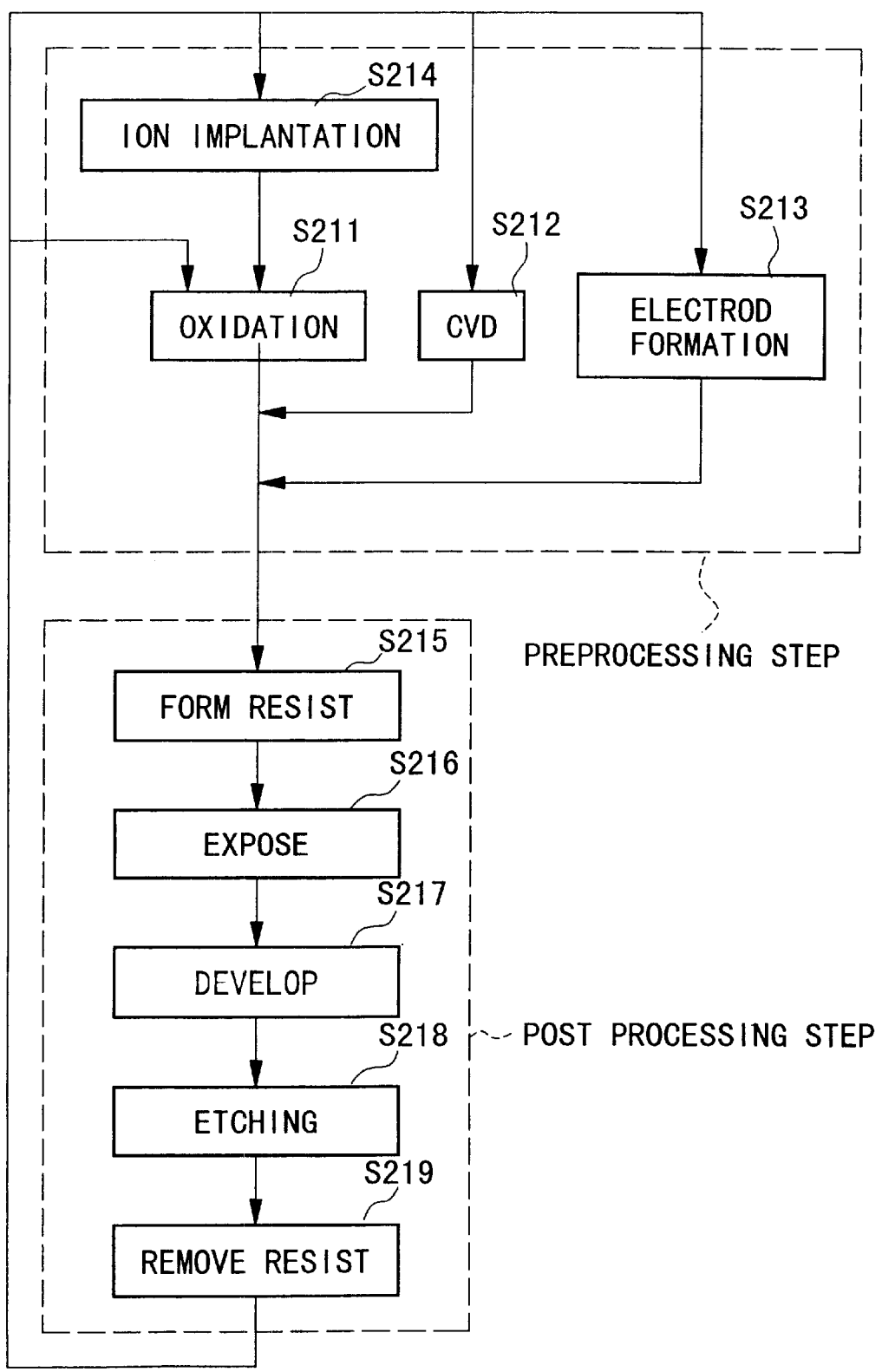
FIG. 61 is a flow chart for explaining processing in step S204 of FIG. 60.
Figure 62:
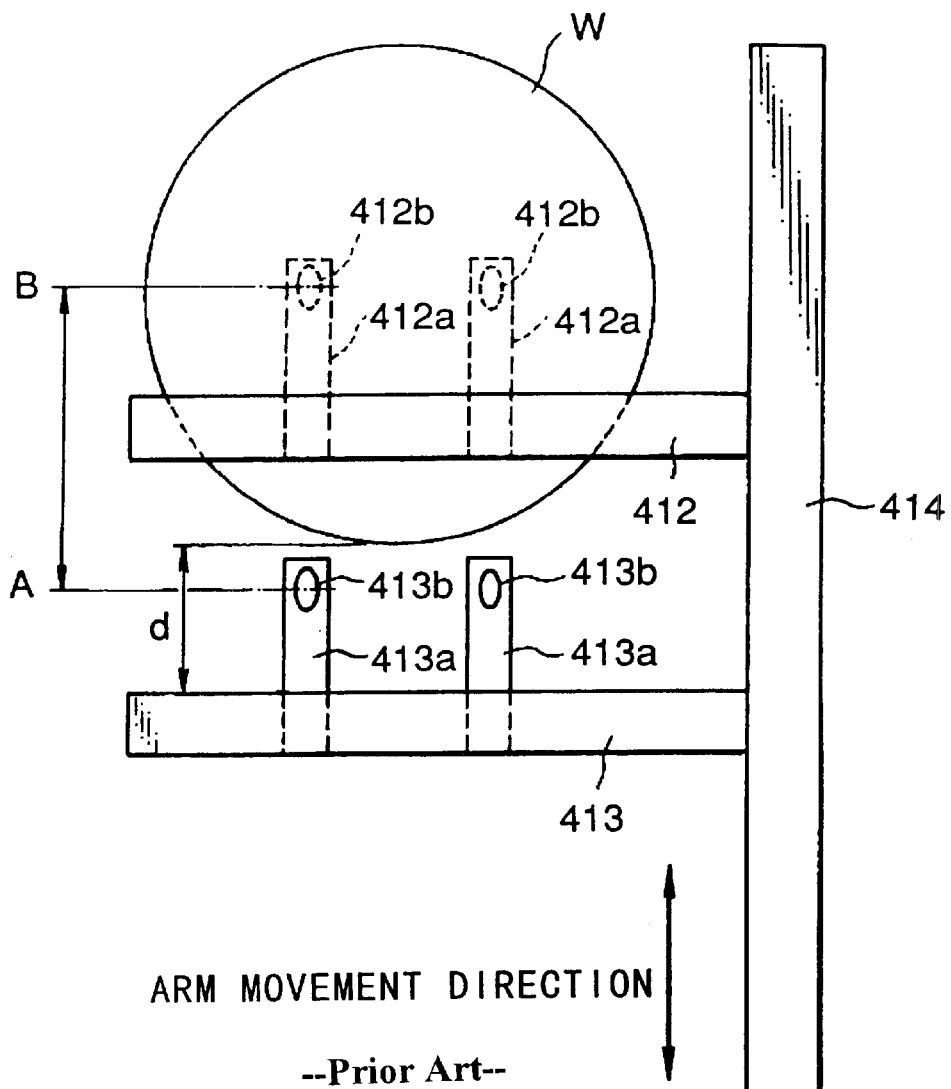
FIG. 62 and FIG. 63 are diagrams for explaining an example of a conventional substrate transport apparatus.
Figure 63:
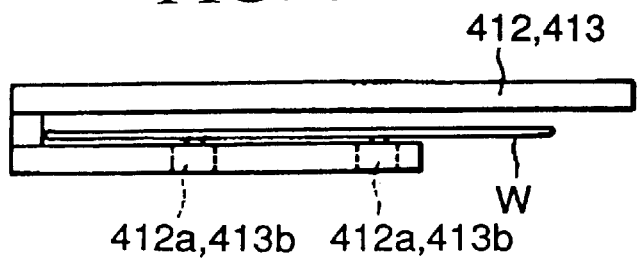
Figure 64:
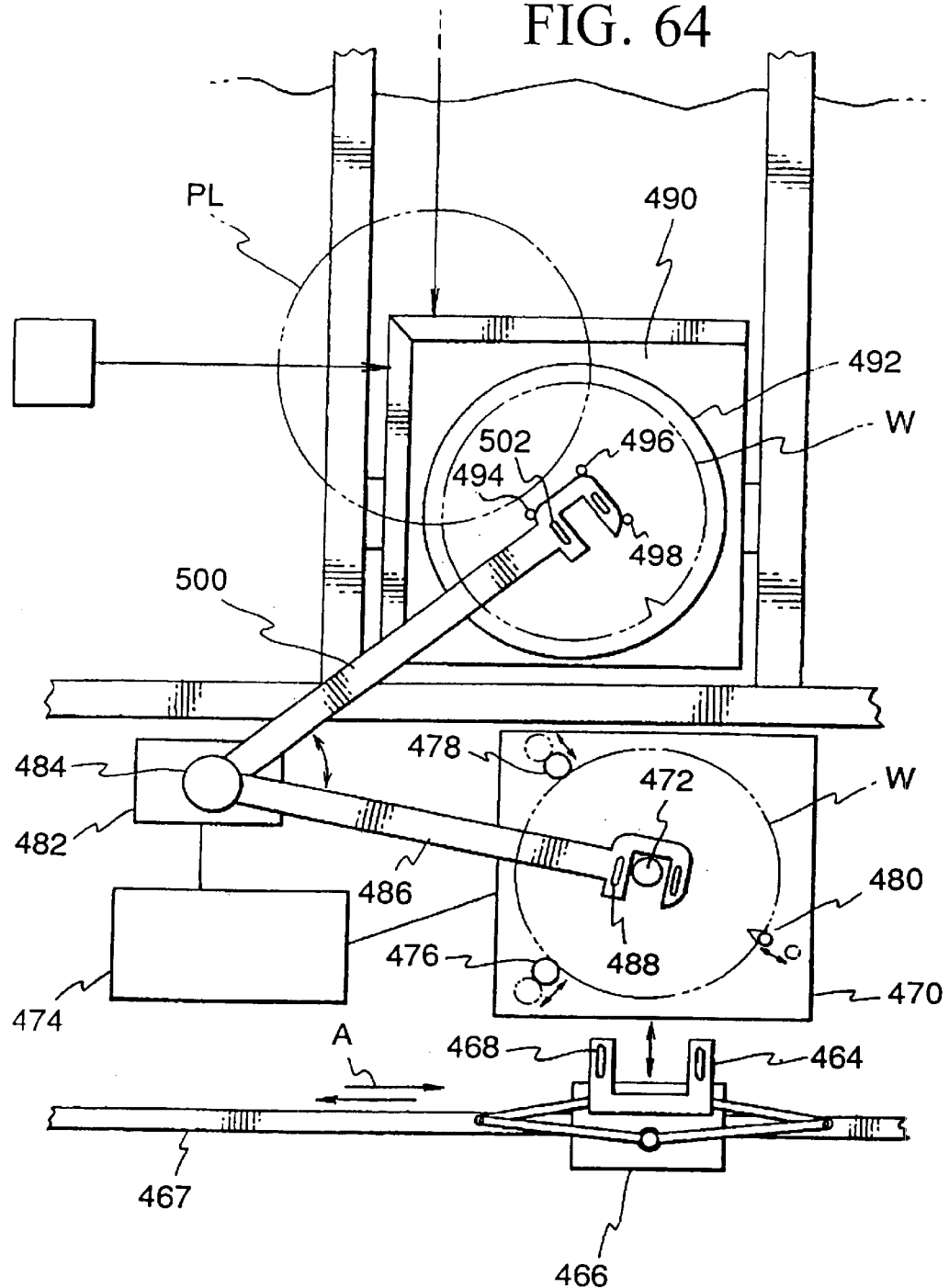
FIG. 64 is an explanatory diagram showing another conventional apparatus.

FIG. 61 shows a detailed flow example of the above mentioned step 204 for the case of a semiconductor device. In FIG. 61, in step S211 (oxidizing step), the surface of the wafer is oxidized. In step S212 (CVD device) an insulating film is formed on the wafer surface. In step S213 (electrode forming step) electrodes are formed on the wafer by vapor deposition. In step S214 (ion implanting step) ions are implanted in the wafer. Each of the abovementioned step S211 through step S214 constitute preprocessing steps for respective stages in wafer processing, and these are selected and executed according to the required processing for the respective stage.

In each stage of the wafer process, when the abovementioned preprocessing steps have been completed, post processing steps are executed as hereunder. With these post processing steps, at first in step S215 (resist forming step) a photosensitive material is applied to the wafer. After this, in step S216 (exposure step), the circuit pattern on the mask is transferred to the wafer by means of the previously described exposure apparatus and exposure method. Then, in step S217 (developing step), the exposed wafer is developed. After this in step S218 (etching step), the exposed material of the parts other than the parts where the resist remains is removed by etching. Then, in step S219 (resist removal step) the resist which is no longer necessary after completion of the etching is removed.

By repeatedly performing the preprocessing steps and post processing steps, circuit patterns are layered on the wafer.

If the above described device manufacturing method of the present invention is used, since in the exposure step (step S216) the abovementioned exposure apparatus 300 and the exposure method therefor are used, throughput is increased enabling an improvement in device productivity.

Here the present invention is not limited to the above described various embodiments, and the constructions of each embodiment may be respectively combined as required. For example, the arm shown in FIG. 11 and FIG. 30 may constitute the arm members 145 and 146 shown in FIG. 8. Moreover, the arm members 145 and 146 shown in FIG. 8 may constitute the arm shown in FIG. 11 and FIG. 30.

The present application is based on Japanese Patent Application No. 9-347360 (1997), Japanese Patent Application No. 10-18919 (1998), and Japanese Patent Application No. 10-33594 (1998), the contents of which are here incorporated by reference.

INDUSTRIAL APPLICABILITY

The present invention is related to substrate transport such as where a wafer serving as a substrate is loaded onto a wafer stage of an exposure apparatus, or where a wafer is unloaded from a wafer stage. By supporting a peripheral portion of the substrate at at least two places on the peripheral portion with the transport arm, and transporting the substrate to the stage, transfer of the substrate is possible by only horizontally moving the transport arm a little from the standby position. Consequently, the operation of transferring the substrate is rapid and hence productivity can be improved.

What is claimed is:

1. A substrate transfer method for transferring a substrate to and from a substrate stage of an exposure apparatus that transfers a pattern of a mask onto a substrate which is positioned or being moved by said substrate stage, comprising the steps of:

providing a load arm that holds said substrate and raising and lowering said substrate;

detecting a position of said substrate being held by said load arm at a substrate transfer position, based on an external shape of said substrate or based on a predetermined alignment mark serving as a reference, wherein a detection location is changeable depending on said substrate which is being held;

transporting said substrate stage to the substrate transfer position so as to receive said substrate from the load arm; and transferring said substrate from said load arm to said substrate stage at the substrate transfer position.

2. A substrate transfer method according to claim 1, wherein, at the time of detecting the position of said substrate being held by said load arm, the positions of at least three places which include a cut portions portion formed on the peripheral portion of said substrate are detected, a rotation angle of said substrate is computed based on the detected positions, and said load arm is rotated based on computed results in order to correct the rotational angle of said substrate.

3. A substrate transfer method for unloading a substrate from a substrate holding member which is moveable in a two dimensional plane, and loading another substrate onto said substrate holding member, the method comprising:

standing by at a substrate transfer position an unload arm and a load arm which is holding another substrate;

moving said substrate holding member which is holding said substrate to said substrate transfer position, and transferring said substrate from said substrate holding member to said unload arm;

withdrawing said unload arm which is receiving said substrate from said substrate holding member; and after withdrawing said unload arm, transferring said another substrate from said load arm to said substrate holding member.

4. A substrate transfer method according to claim 3 further comprising, detecting a position of another substrate held by said load arm in a direction of the two dimensional plane, while the load arm stands by at a substrate transfer position.

* * * * *